United States Patent
Ding et al.

(10) Patent No.: US 10,047,430 B2
(45) Date of Patent: Aug. 14, 2018

(54) SELF-IONIZED AND INDUCTIVELY-COUPLED PLASMA FOR SPUTTERING AND RESPUTTERING

(71) Applicant: Applied Materials, Inc., Santa Clara, CA (US)

(72) Inventors: Peijun Ding, Saratoga, CA (US); Rong Tao, San Jose, CA (US); Zheng Xu, Foster City, CA (US); Daniel C. Lubben, San Jose, CA (US); Suraj Rengarajan, San Jose, CA (US); Michael A. Miller, Mountain View, CA (US); Arvind Sundarrajan, Santa Clara, CA (US); Xianmin Tang, San Jose, CA (US); John C. Forster, San Francisco, CA (US); Jianming Fu, Palo Alto, CA (US); Roderick C. Mosely, Pleasanton, CA (US); Fusen Chen, Sunnyvale, CA (US); Praburam Gopalraja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1022 days.

(21) Appl. No.: 14/205,260

(22) Filed: Mar. 11, 2014

(65) Prior Publication Data
US 2014/0305802 A1 Oct. 16, 2014

Related U.S. Application Data

(60) Division of application No. 10/495,506, filed as application No. PCT/US02/36940 on Nov. 14, 2002, (Continued)

(51) Int. Cl.
*C23C 14/34* (2006.01)
*H01J 37/34* (2006.01)
(Continued)

(52) U.S. Cl.
CPC .......... *C23C 14/046* (2013.01); *C23C 14/345* (2013.01); *C23C 14/3457* (2013.01);
(Continued)

(58) Field of Classification Search
CPC ......... C23C 14/04; C23C 14/34; C23C 14/35; C23C 14/56; H01J 37/32; H01J 37/34;
(Continued)

(56) References Cited

U.S. PATENT DOCUMENTS

| | | |
|---|---|---|
| 4,412,905 A | 11/1983 | Khan |
| 4,498,969 A | 2/1985 | Ramachandran |

(Continued)

FOREIGN PATENT DOCUMENTS

| | | |
|---|---|---|
| CN | 87106947 | 5/1988 |
| CN | 1301880 | 7/2001 |

(Continued)

OTHER PUBLICATIONS

Asamaki et al., "Filling of sub-micrometer Through-holes by self-sputter deposition", Japanese Journal of Applied Physics vol. 33 (Aug. 1994) pp. 4566-4569.*

(Continued)

*Primary Examiner* — Rodney G McDonald
(74) *Attorney, Agent, or Firm* — Konrad Raynes Davda & Victor LLP

(57) ABSTRACT

A magnetron sputter reactor for sputtering deposition materials such as tantalum, tantalum nitride and copper, for example, and its method of use, in which self-ionized plasma (SIP) sputtering and inductively coupled plasma (ICP) sputtering are promoted, either together or alternately, in the same or different chambers. Also, bottom coverage may be thinned or eliminated by ICP resputtering in one chamber and SIP in another. SIP is promoted by a small magnetron having poles of unequal magnetic strength and a (Continued)

high power applied to the target during sputtering. ICP is provided by one or more RF coils which inductively couple RF energy into a plasma. The combined SIP-ICP layers can act as a liner or barrier or seed or nucleation layer for hole. In addition, an RF coil may be sputtered to provide protective material during ICP resputtering. In another chamber an array of auxiliary magnets positioned along sidewalls of a magnetron sputter reactor on a side towards the wafer from the target. The magnetron preferably is a small, strong one having a stronger outer pole of a first magnetic polarity surrounding a weaker outer pole of a second magnetic polarity and rotates about the central axis of the chamber. The auxiliary magnets preferably have the first magnetic polarity to draw the unbalanced magnetic field component toward the wafer. The auxiliary magnets may be either permanent magnets or electromagnets.

22 Claims, 17 Drawing Sheets

Related U.S. Application Data now Pat. No. 8,696,875, which is a continuation-in-part of application No. 09/685,978, filed on Oct. 10, 2000, now Pat. No. 6,582,569, which is a division of application No. 09/414,614, filed on Oct. 8, 1999, now Pat. No. 6,398,929, said application No. 10/495,506 is a continuation-in-part of application No. 10/202,778, filed on Jul. 25, 2002, now abandoned, and a continuation-in-part of application No. 09/993,543, filed on Nov. 14, 2001, now Pat. No. 6,610,184.

(60) Provisional application No. 60/316,137, filed on Aug. 30, 2001, provisional application No. 60/342,608, filed on Dec. 21, 2001.

(51) Int. Cl.
 *C23C 14/04* (2006.01)
 *C23C 14/35* (2006.01)
 *C23C 14/56* (2006.01)
 *H01J 37/32* (2006.01)
 *H01L 21/285* (2006.01)
 *H01L 21/768* (2006.01)

(52) U.S. Cl.
 CPC ............ *C23C 14/35* (2013.01); *C23C 14/358* (2013.01); *C23C 14/564* (2013.01); *C23C 14/568* (2013.01); *H01J 37/321* (2013.01); *H01J 37/3402* (2013.01); *H01J 37/3408* (2013.01); *H01J 37/3441* (2013.01); *H01L 21/2855* (2013.01); *H01L 21/76805* (2013.01); *H01L 21/76814* (2013.01); *H01L 21/76843* (2013.01); *H01L 21/76844* (2013.01); *H01L 21/76846* (2013.01); *H01L 21/76862* (2013.01); *H01L 21/76865* (2013.01); *H01L 21/76868* (2013.01); *H01L 21/76871* (2013.01); *H01L 21/76873* (2013.01); *H01L 21/76876* (2013.01); *H01L 21/76877* (2013.01); *H01J 2237/3327* (2013.01); *H01L 2221/1089* (2013.01)

(58) Field of Classification Search
 CPC .. H01L 21/285; H01L 21/4763; H01L 21/768
 USPC ....................................... 204/192.17, 298.06
 See application file for complete search history.

(56) References Cited

U.S. PATENT DOCUMENTS

| | | |
|---|---|---|
| 4,581,118 A | 4/1986 | Class et al. |
| 4,673,482 A | 6/1987 | Setoyama et al. |
| 4,756,810 A | 7/1988 | Lamont, Jr. et al. |
| 4,761,219 A | 8/1988 | Sasaki et al. |
| 4,825,808 A | 5/1989 | Takahashi et al. |
| 4,853,102 A | 8/1989 | Tateishi et al. |
| 4,865,709 A | 9/1989 | Nakagawa et al. |
| 4,865,712 A | 9/1989 | Mintz |
| 4,871,433 A | 10/1989 | Wagner et al. |
| 4,925,542 A | 5/1990 | Kidd |
| 5,006,218 A | 4/1991 | Yoshida et al. |
| 5,026,470 A | 6/1991 | Bonyhard et al. |
| 5,108,570 A | 4/1992 | Wang .................. 204/192.3 |
| 5,122,251 A | 6/1992 | Campbell et al. |
| 5,133,825 A | 7/1992 | Hakamata et al. |
| 5,178,739 A | 1/1993 | Barnes et al. |
| 5,186,718 A | 2/1993 | Tepman et al. |
| 5,244,556 A | 9/1993 | Inoue |
| 5,246,532 A | 9/1993 | Ishida |
| 5,308,417 A | 5/1994 | Groechel et al. |
| 5,431,799 A | 6/1995 | Mosely et al. |
| 5,439,574 A | 8/1995 | Kobayashi et al. |
| 5,455,197 A | 10/1995 | Ghanbari et al. ............. 438/685 |
| 5,456,796 A | 10/1995 | Gupta et al. |
| 5,482,611 A | 1/1996 | Helmer et al. |
| 5,496,455 A | 3/1996 | Dill et al. ................. 204/192.12 |
| 5,527,438 A | 6/1996 | Tepman |
| 5,589,039 A | 12/1996 | Hsu |
| 5,593,551 A | 1/1997 | Lai ................. 204/192.12 |
| 5,658,442 A | 8/1997 | Van Gogh et al. |
| 5,690,795 A | 11/1997 | Rosenstein et al. |
| 5,733,405 A | 3/1998 | Taki et al. |
| 5,736,021 A | 4/1998 | Ding et al. |
| 5,770,519 A | 6/1998 | Klein et al. |
| 5,795,451 A | 8/1998 | Tan et al. |
| 5,830,330 A | 11/1998 | Lantsman |
| 5,846,332 A | 12/1998 | Zhao et al. |
| 5,879,523 A | 3/1999 | Wang et al. |
| 5,897,752 A | 4/1999 | Hong et al. .............. 204/192.12 |
| 5,902,461 A | 5/1999 | Xu et al. |
| 5,907,220 A | 5/1999 | Tepman et al. |
| 5,930,669 A | 7/1999 | Uzoh |
| 5,933,753 A | 8/1999 | Simon et al. |
| 5,985,762 A | 11/1999 | Geffken et al. |
| 6,014,943 A | 1/2000 | Arami et al. |
| 6,017,144 A | 1/2000 | Guo et al. |
| 6,037,258 A | 3/2000 | Liu et al. |
| 6,042,700 A | 3/2000 | Gopalraja et al. |
| 6,054,770 A | 4/2000 | Toyoda et al. ............... 257/762 |
| 6,077,403 A | 6/2000 | Kobayashi et al. |
| 6,080,285 A | 6/2000 | Liu et al. |
| 6,080,286 A | 6/2000 | Okuda et al. |
| 6,099,706 A | 8/2000 | Hirabayashi et al. |
| 6,100,587 A | 8/2000 | Merchant et al. |
| 6,106,625 A | 8/2000 | Koai et al. |
| 6,106,682 A | 8/2000 | Moslehi et al. |
| 6,110,821 A | 8/2000 | Kohara et al. |
| 6,113,731 A | 9/2000 | Shan et al. |
| 6,121,134 A | 9/2000 | Burton et al. ............... 438/652 |
| 6,136,166 A | 10/2000 | Shen et al. |
| 6,136,707 A * | 10/2000 | Cohen ............... H01L 21/76843 438/627 |
| 6,146,517 A | 11/2000 | Hoinkis |
| 6,149,766 A | 11/2000 | Tibbling et al. |
| 6,159,351 A | 12/2000 | J'Afer et al. |
| 6,163,006 A | 12/2000 | Doughty et al. |
| 6,174,811 B1 | 1/2001 | Ding et al. |
| 6,179,973 B1 | 1/2001 | Lai et al. |
| 6,183,614 B1 | 2/2001 | Fu ..................... 204/298.2 |
| 6,187,670 B1 | 2/2001 | Brown et al. |
| 6,193,854 B1 | 2/2001 | Lai et al. |
| 6,193,855 B1 | 2/2001 | Gopalraja et al. |
| 6,217,721 B1 | 4/2001 | Xu et al. |
| 6,221,765 B1 | 4/2001 | Ueno |
| 6,224,724 B1 | 5/2001 | Licata et al. |

(56) References Cited

U.S. PATENT DOCUMENTS

| | | |
|---|---|---|
| 6,235,164 B1 | 5/2001 | Gerrish et al. |
| 6,251,242 B1 | 6/2001 | Fu et al. |
| 6,251,759 B1 | 6/2001 | Guo et al. |
| 6,255,192 B1 | 7/2001 | Dornisch |
| 6,258,707 B1 | 7/2001 | Uzoh |
| 6,261,946 B1 | 7/2001 | Iacoponi et al. |
| 6,265,313 B1 | 7/2001 | Huang et al. |
| 6,274,008 B1 | 8/2001 | Gopalraja et al. |
| 6,277,249 B1 | 8/2001 | Gopalraja et al. |
| 6,277,722 B1 | 8/2001 | Lee et al. |
| 6,280,585 B1 | 8/2001 | Obinata et al. |
| 6,284,657 B1 | 9/2001 | Chooi et al. |
| 6,287,977 B1 | 9/2001 | Hashim et al. |
| 6,290,825 B1 | 9/2001 | Fu |
| 6,294,458 B1 | 9/2001 | Zhang et al. |
| 6,297,154 B1 | 10/2001 | Gross et al. |
| 6,306,265 B1 | 10/2001 | Fu et al. |
| 6,306,732 B1 | 10/2001 | Brown |
| 6,323,124 B1 | 11/2001 | Leiphart ............... 438/640 |
| 6,328,871 B1 | 12/2001 | Ding et al. |
| 6,342,133 B2 | 1/2002 | D'Couto et al. |
| 6,350,353 B2 | 2/2002 | Gopalraja et al. |
| 6,352,629 B1 | 3/2002 | Wang |
| 6,358,376 B1 | 3/2002 | Wang et al. |
| 6,361,667 B1 | 3/2002 | Kobayashi et al. |
| 6,368,469 B1 | 4/2002 | Nulman et al. |
| 6,368,954 B1 | 4/2002 | Lopatin et al. |
| 6,375,810 B2 | 4/2002 | Hong |
| 6,391,785 B1 | 5/2002 | Satta et al. |
| 6,398,929 B1 | 6/2002 | Chiang et al. |
| 6,413,383 B1 | 7/2002 | Chiang et al. |
| 6,423,192 B1 | 7/2002 | Wada et al. |
| 6,436,251 B2 | 8/2002 | Gopalraja et al. |
| 6,436,267 B1 | 8/2002 | Carl et al. |
| 6,444,104 B2 | 9/2002 | Gopalraja et al. |
| 6,451,179 B1 | 9/2002 | Xu et al. |
| 6,475,356 B1 | 11/2002 | Ngan et al. |
| 6,498,091 B1 | 12/2002 | Chen et al. |
| 6,506,287 B1 | 1/2003 | Ding |
| 6,514,390 B1 | 2/2003 | Xu et al. |
| 6,538,327 B1 | 3/2003 | Lopatin et al. |
| 6,554,979 B2 | 4/2003 | Stimson |
| 6,572,744 B1 | 6/2003 | Paranjpe et al. |
| 6,579,421 B1 | 6/2003 | Fu |
| 6,582,569 B1 | 6/2003 | Chiang et al. |
| 6,607,977 B1 | 8/2003 | Rozbicki et al. |
| 6,610,184 B2 | 8/2003 | Ding et al. |
| 6,642,146 B1 | 11/2003 | Rozbicki et al. |
| 6,692,617 B1 | 2/2004 | Fu et al. |
| 6,755,945 B2 | 6/2004 | Yasar et al. |
| 6,762,125 B1 | 7/2004 | Polinsky et al. |
| 6,764,940 B1 | 7/2004 | Rozbicki et al. |
| 6,784,096 B2 | 8/2004 | Chen et al. |
| 6,833,161 B2 | 12/2004 | Wang et al. |
| 6,875,321 B2 | 4/2005 | Ding et al. |
| 6,893,541 B2 | 5/2005 | Chiang et al. |
| 6,916,398 B2 | 7/2005 | Chen et al. |
| 7,026,238 B2 | 4/2006 | Xi et al. |
| 7,041,201 B2 | 5/2006 | Gung et al. |
| 7,141,186 B2 | 11/2006 | Abe et al. |
| 7,186,648 B1 | 3/2007 | Rozbicki et al. |
| 7,504,006 B2 | 3/2009 | Gopalraja et al. |
| 7,569,125 B2 | 8/2009 | Gung et al. |
| 8,696,875 B2 | 4/2014 | Ding et al. |
| 2001/0003607 A1 | 6/2001 | Gopalraja et al. |
| 2002/0005348 A1 | 1/2002 | Xu et al. |
| 2002/0110999 A1 | 8/2002 | Lu et al. |
| 2003/0089601 A1 | 5/2003 | Ding et al. |
| 2003/0116427 A1 | 6/2003 | Ding et al. |
| 2003/0121608 A1 | 7/2003 | Chen et al. |
| 2003/0217914 A1 | 11/2003 | Miller et al. |
| 2003/0224217 A1 | 12/2003 | Byun et al. |
| 2004/0020770 A1 | 2/2004 | Wang et al. |
| 2004/0094402 A1 | 5/2004 | Gopalraja et al. |
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0266682 A1 | 12/2005 | Chen et al. |
| 2005/0272254 A1 | 12/2005 | Ding et al. |
| 2007/0099438 A1 | 5/2007 | Ye et al. |
| 2008/0110747 A1 | 5/2008 | Ding et al. |
| 2008/0142359 A1 | 6/2008 | Gopalraja et al. |
| 2009/0233438 A1 | 9/2009 | Ding et al. |

FOREIGN PATENT DOCUMENTS

| | | |
|---|---|---|
| DE | 2 707 144 A | 8/1977 |
| DE | 261812 | 6/1987 |
| EP | 0 653 776 | 5/1995 |
| EP | 0 799 903 A2 | 10/1997 |
| EP | 0867525 * | 9/1998 |
| EP | 0878843 | 11/1998 |
| EP | 1 091 016 | 4/2001 |
| EP | 1094495 | 4/2001 |
| EP | 1119017 | 7/2001 |
| EP | 1 174 902 | 1/2002 |
| JP | 57207173 | 12/1982 |
| JP | 61158032 | 7/1986 |
| JP | 61221363 | 10/1986 |
| JP | 61272373 | 12/1986 |
| JP | 63018071 | 1/1988 |
| JP | 63213667 | 9/1988 |
| JP | 63262462 | 10/1988 |
| JP | 1-309963 | 12/1989 |
| JP | 4297575 | 10/1992 |
| JP | 06-041739 | 2/1994 |
| JP | 06-158299 | 6/1994 |
| JP | 07-173625 | 7/1995 |
| JP | 8-264447 | 10/1996 |
| JP | 09-025573 | 1/1997 |
| JP | 10140346 | 5/1998 |
| JP | 10-152774 | 6/1998 |
| JP | 10-204614 | 8/1998 |
| JP | 10-284603 | 10/1998 |
| JP | 11-001770 | 1/1999 |
| JP | 11-074225 | 3/1999 |
| JP | 11-186261 | 7/1999 |
| JP | 2000-144412 | 5/2000 |
| JP | 2000-323571 | 11/2000 |
| JP | 2000-332106 | 11/2000 |
| JP | 2001-200358 | 7/2001 |
| JP | 2001-226767 | 8/2001 |
| JP | 2001240964 | 9/2001 |
| JP | 2001-303247 | 10/2001 |
| JP | 2010283360 | 12/2010 |
| KR | 19950010196 | 9/1995 |
| KR | 1998070835 | 10/1998 |
| KR | 200155046 | 8/1999 |
| TW | 483944 | 4/2002 |
| WO | 9917330 | 4/1999 |
| WO | 9927579 | 6/1999 |
| WO | 00/05745 | 2/2000 |
| WO | 0007236 | 2/2000 |
| WO | 02/11176 | 2/2002 |
| WO | 02/37528 | 5/2002 |
| WO | 03-042424 | 5/2003 |
| WO | 03043052 | 5/2003 |
| WO | 2005004189 | 1/2005 |

OTHER PUBLICATIONS

Final Office Action 1 for JP Application No. 2013-082450, dated Mar. 23, 2015, 5 pp. (w/ English Translation).

U.S. Pat. No. 6,350,353, dated Feb. 26, 2002, is an English Language equivalent of JP Publication No. 2001-303247.

Abstract and Machine Translation of JP Publication No. 06-041739, dated Feb. 15, 1994, 20 pp.

Office Action 2 for JP Application No. 2010-153219, dated Mar. 3, 2014, (With English Translation), 4 pp.

Response to Office Action 2 for JP Application No. 2010-153219, dated Sep. 3, 2014, 2 pp.

Office Action 1 for JP Application No. 2013-082450, dated Aug. 27, 2014, (with English Translation), 7 pp.

(56) References Cited

OTHER PUBLICATIONS

Final Office Action 4 for U.S. Appl. No. 11/933,086, dated Dec. 9, 2013, 37 pp.
Response to Final Office Action 4 for U.S. Appl. No. 11/933,086, dated Mar. 10, 2014, 11 pp.
Advisory Action for U.S. Appl. No. 11/933,086, dated Mar. 24, 2014, 3 pp.
Second Response to Final Office Action 4 for U.S. Appl. No. 11/933,086, dated Apr. 9, 2014, 10 pp.
Notice of Allowance for U.S. Appl. No. 11/933,086, dated Oct. 8, 2014, 10 pp.
Restriction Requirement for U.S. Appl. No. 10/495,506, dated Mar. 28, 2008, 6 pp.
Response to Restriction Requirement for U.S. Appl. No. 10/495,506, dated May 28, 2008, 13 pp.
Office Action 1 for U.S. Appl. No. 10/495,506, dated Jun. 16, 2008, 24 pp.
Response to Office Action 1 for U.S. Appl. No. 10/495,506, dated Jun. 16, 2008, 18 pp.
Final Office Action 1 for U.S. Appl. No. 10/495,506, dated Jan. 29, 2009, 25 pp.
Response to Final Office Action 1 for U.S. Appl. No. 10/495,506, dated Apr. 29, 2009, 17 pp.
Office Action 3 for U.S. Appl. No. 10/495,506, dated Jul. 2, 2009, Jul. 2, 2009, 29 pp.
Response to Office Action 3 for U.S. Appl. No. 10/495,506, dated Nov. 2, 2009, 19 pp.
Final Office Action 2 for U.S. Appl. No. 10/495,506, dated Mar. 10, 2010, 8 pp.
Response to Final Office Action 2 for U.S. Appl. No. 10/495,506, dated Jul. 12, 2010, 12 pp.
Notice of Allowance 1 for U.S. Appl. No. 10/495,506, dated May 27, 2011, 28 pp.
Notice of Allowance 2 for U.S. Appl. No. 10/495,506, dated Sep. 20, 2011, 17 pp.
Notice of Allowance 3 for U.S. Appl. No. 10/495,506, dated Jan. 10, 2012, 12 pp.
Notice of Allowance 4 for U.S. Appl. No. 10/495,506, dated Jun. 25, 2013, 13 pp.
Notice of Allowance 5 for U.S. Appl. No. 10/495,506, dated Dec. 11, 2013, 42 pp.
Notice of Allowance 8 for U.S. Appl. No. 11/933,157, dated Sep. 20, 2013, 18 pp.
Final Office Action 1 for JP Application No. 2010-153219, dated Feb. 23, 2015, 5 pp. (w/ English Translation).
Notice of Allowance 2 for U.S. Appl. No. 11/933,086, dated Jan. 23, 2015, 14 pp.
Response to Office Action 1 for JP Application No. 2013-082450, dated Dec. 17, 2014, 6 pp.
Office Action 2 for U.S. Appl. No. 09/685,978, dated Jul. 16, 2002, 9 pp.
Response to Final Office Action for U.S. Appl. No. 09/685,978, dated Jan. 17, 2003, 14 pp.
Response to Office Action 1 for U.S. Appl. No. 09/685,978, dated Apr. 12, 2002, 11 pp.
Response to Office Action 2 for U.S. Appl. No. 09/685,978, dated Sep. 5, 2002, 14 pp.
Office Action for EP Application No. 0278477.1-2208, dated Mar. 4, 2008, 8 pp.
Response to Office Action for EP Application No. 02784777.1-2208, dated Jul. 11, 2008, 10 pp.
Response to Office Action 2 for CN Application No. 201010163430.7, dated Dec. 29, 2011, 13 pp. (w/ Engl. Transl. of Pending Claims).
Appeal Brief for JP Application No. 2003-544237, dated Dec. 6, 2011, 4 pp.
Office Action 3 for JP Application No. 2003-544237, dated Jan. 10, 2013, 4 pp.
Response to Office Action 1 for JP Application No. 2003-544237, dated Jul. 5, 2010, 15 pp.
Response to Office Action 3 for JP Application No. 2003-544237, dated Apr. 10, 2013, 3 pp.
Office Action 1 for JP Application No. 2010-153219, dated Jan. 31, 2013, 7 pp.
Response to Office Action 1 for JP Application No. 2010-153219, dated Jul. 31, 2013, 15 pp. (w/ Engl. Transl. of Claim Amendments).
Notice of Allowance 1 and Allowed Claims for KR Application No. 10-2010-7009485, dated May 29, 2012, 9 pp. [with Translation].
Response to Final Office Action 2 including an Appeal Brief and Amendment for KR Application No. 10-2010-7009485, filed Apr. 19, 2012, 10 pp.
Notice of Allowance 1 and Allowed Claims for KR Application No. 10-2010-7009487, dated May 29, 2012, 7 pp. [with Translation].
Response to Final Office Action 2 including an Appeal Brief and Amendment for KR Application No. 10-2010-7009487, filed Apr. 19, 2012, 10 pp.
Notice of Allowance for KR Application No. 10-2012-7010137, dated Jun. 19, 2013, 4 pp.
Office Action 1 for KR Application No. 10-2012-7010137, dated Aug. 8, 2012, 3 pp.
Response to Office Action 1 for KR Application No. 10-2012-7010137, dated Feb. 7, 2013, 16 pp.
Advisory Action for U.S. Appl. No. 11/184,404, dated Oct. 14, 2008, 3 pp.
Final Office Action for U.S. Appl. No. 11/184,404, dated Jul. 24, 2008, 11 pp.
Office Action for U.S. Appl. No. 11/184,404, dated Oct. 9, 2007, 25 pp.
Response to Final Office Action for U.S. Appl. No. 11/184,404, dated Sep. 24, 2008, 15 pp.
Response to Office Action for U.S. Appl. No. 11/184,404, dated Apr. 9, 2008, 18 pp.
Notice of Allowance for U.S. Appl. No. 11/184,431, dated Apr. 16, 2009, 6 pp.
Office Action for U.S. Appl. No. 11/184,431, dated Sep. 7, 2007, 17 pp.
Office Action 2 for U.S. Appl. No. 11/184,431, dated Jun. 30, 2008, 16 pp.
Response to Office Action for U.S. Appl. No. 11/184,431, dated Feb. 20, 2008, 18 pp.
Response to Office Action 2 for U.S. Appl. No. 11/184,431, dated Dec. 29, 2008, 3 pp.
Office Action for U.S. Appl. No. 11/185,214, dated Oct. 31, 2006, 8 pp.
Office Action for U.S. Appl. No. 11/185,248, dated May 12, 2006, 13 pp.
Final Office Action 2 for U.S. Appl. No. 11/933,086, dated Sep. 24, 2012, 27 pp.
Final Office Action 3 for U.S. Appl. No. 11/933,086, dated Apr. 12, 2013, 17 pp.
Office Action 3 for U.S. Appl. No. 11/933,086, dated Apr. 20, 2012, 15 pp.
Response to Final Office Action 2 for U.S. Appl. No. 11/933,086, dated Nov. 26, 2012, 8 pp.
Response to Final Office Action 2 for U.S. Appl. No. 11/933,086, dated Dec. 24, 2012, 12 pp.
Response to Final Office Action 3 for U.S. Appl. No. 11/933,086, dated Jun. 12, 2013, 8 pp.
Response to Final Office Action 3 or U.S. Appl. No. 11/933,086, dated Jul. 12, 2013, 10 pp.
Response to Final Office Action 3 for U.S. Appl. No. 11/933,086, dated Aug. 12, 2013, 12 pp.
Response to Office Action 3 for U.S. Appl. No. 11/933,086, dated Jul. 20, 2012, 7 pp.
Notice of Allowance 3 for U.S. Appl. No. 11/933,157, dated Apr. 13, 2012, 12 pp.
Notice of Allowance 4 for U.S. Appl. No. 11/933,157, dated Jul. 24, 2012, 12 pp.
Notice of Allowance 5 for U.S. Appl. No. 11/933,157, dated Nov. 6, 2012, 12 pp.
Notice of Allowance 6 for U.S. Appl. No. 11/933,157, dated Feb. 21, 2013, 12 pp.

(56) References Cited

OTHER PUBLICATIONS

Notice of Allowance 7 for U.S. Appl. No. 11/933,157, dated Jun. 6, 2013, 46 pp.
U.S. Pat. No. 5,244,556, dated Sep. 14, 1993, is an English language equivalent of KR1995-0010196, dated Sep. 11, 1995.
U.S. Pat. No. 6,451,179, dated Sep. 17, 2002, is an English language equivalent of KR1998-070835, dated Oct. 26, 1998.
Anonymous, "Endpoint Detection Method for Ion Etching of Material Having a Titanium Nitride Underlayer," Research Disclosure, Feb. 1991, No. 322, 1 pg.
Asamaki, T. et al., "Copper Self-Sputtering by Planar Magnetron", Japanese Journal of Applied Physics, vol. 33, Part 1, No. 5A, May 1994, 4 pp.
EPO NPL Document No. XP-002223600, May 11, 2000, 1 pp.
Getty, W.D., et al., "Size-Scalable, 2.45-Ghz Electron Cyclotron Resonance Plasma Source Using Permanent Magnets and Waveguide Coupling," J. Vac Sci. Technol.B 12(1), Jan./Feb. 1994, 8 pp.
Gorbatkin, S.M., et al. "Cu Metallization Using a Permanent Magnet Electron Cyclotron Resonance Microwave Plasma/Sputtering Hybrid System," J. Vac. Sci. Technol. B, vol. 14, No. 3, May/Jun. 1996, 7 pp.
Hamaguchi, S., et al. "Simulations of Trench-Filling Profiles Under Ionized Magnetron Sputter Metal Deposition," J. Vac. Sci, Technol. B, vol. 13, No. 2, Mar./Apr. 1995, 9 pp.
Holber, W.M., et al. "Copper Deposition by Electron Cyclotron Resonance Plasma," J. Vac. Sci. Technol. A 11(6), Nov./Dec. 1993, 8 pp.
Homma, Y., et al. "Planar Deposition of Aluminum by RF/DC Sputtering with RF Bias," J. Electrochem. Soc., vol. 132, No. 6, Jun. 1985, 7 pp.
Ivanov, I., et al. "Electron Energy Distribution Function in a DC Magnetron Sputtering Discharge," Vacuum, vol. 43, No. 8, 1992, 6 pp.
Kidd, P. "A Magnetically Confined and Electron Cyclotron Resonance Heated Plasma Machine for Coating and Ion surface modification use," J. Vac. Sci. Technol. A, vol. 9, No. 3, May/Jun. 1991, 8 pp.
Kitamoto, Y., et al. "Compact Sputtering Apparatus for Depositing Co—Cr Alloy Thin Films in Magnetic Disks," Proc. of the 4th ISSP (Kanazawa, 1997), 5 pp.
Klawuhn, E., et al. "Ionized Physical-Vapor Deposition Using a Hollow-Cathode Magnetron Source for Advanced Metallization," J. Vac. Sci. Technol. A 18(4), Jul./Aug. 2000, 4 pp.
Kochel, L.J. "Pressure Control of RF Bias for Sputtering," Rev. Sci. Instrum., vol. 47, No. 12, Dec. 1976, 2 pp.
Koenig, H., et al. "RF Sputtering System With Variable Substrate Bias," IBM Techn. Discl. Bulletin, vol. 13, No. 2 (Jul. 1970), 2 pp.
Kotani, H., et al. "Sputter-Etching Planarization for Multilevel Metallization," J. Electrochem. Soc.: Solid-State Science and Technology, vol. 130, No. 3., Mar. 1983, 4 pp.
Matsuo, S. "Reactive Ion-Beam Etching and Plasma Deposition Techniques Using Electron Cyclotron Resonance Plasmas," Academic Press, Inc., 1983, 22 pp.
Matsuoka, M., et al. "Dense Plasma Production and Film Deposition by New High-Rate Sputtering Using an Electric Mirror," J. Vac. Sci. Technol. A, vol. 7, No. 4, Jul./Aug. 1989, 6 pp.
MTI, "Applications Note: Planarizing Enhancement Mode 'Sputtering . . . Plus' for Planarized Aluminum in Sypherline" Internal and/or marketing document, by Technical Staff, MTI Thin Film Equipment Division, vol. 1, No. 1, Apr. 1986, 4 pp.
MTI, "SypherLine by MTi," advertisement, Semiconductor International, Nov. 1985, 4 pp.
Musil, J., et al., "Unbalanced Magnetrons and New Sputtering Systems with Enhanced Plasma Ionization," J. Vac. Sci. Technol. A, vol. 9 No. 3, May/Jun. 1991, 7 pp.
Nender, C., et al. "High Bias Sputtering for Large-Area Selective Deposition," Thin Solid Films 228, May 15, 1993, Nos. 1-2, 4 pp.
Novellus Systems, Inc., "Damascus: 12 Steps of Damascus," Webpages printed 1998, 14 pp.

Park, I.S., et al. "A Novel Al-Reflow Process Using Surface Modification by the ECR Plasma Treatment and Its Application to the 256Mbit DRAM," IEEE 1994, 4 pp.
Posadowski, W.M., "Sustained Self Sputtering of Different Materials Using DC Magnetron", Vacuum, vol. 46, No. 8-10, 4 pp.
Posadowski, W.M., "Sustained Self-Sputtering Using a Direct Current Magnetron Source", Journal of Vacuum Science and Technology A, vol. 11, No. 6, Nov./Dec. 1993, 5 pp.
Radzimski, Z.J. et al., "Directional Copper Deposition Using DC Magnetron Self-Sputtering", Journal of Vacuum Science and Technology B 16(3), May/Jun. 1998, 5 pp.
Rossnagel, S.M., et al. "Collimated Magnetron Sputter Deposition with Grazing Angle Ion Bombardment," J. Vac. Sci. Technol. A 13(1), Jan./Feb. 1995, 3 pp.
Samukawa, S., "Wave Propagation and Plasma Uniformity in an Electron Cyclotron Resonance Plasma," J. Vac. Sci. Technol. A 11(5), Sep./Oct. 1993, 5 pp.
Skelly, D. W., et al. "Significant Improvement in Step Coverage Using Bias Sputtered Aluminum," J. Vac. Sci. Technol. A 4(3), May/Jun. 1986, 4 pp.
Suzuki, K., et al. "Microwave Plasma Etching," Pergamon Press Ltd., vol. 34, No. 10, 1984, 5 pp.
Suzuki, K., et al. "Microwave Plasma Etching," Japanese Journal of Applied Physics, vol. 16, No. 11, Nov. 1977, 6 pp.
Terminal Disclaimer for U.S. Appl. No. 10/495,506 now U.S. Pat. No. 7,504,006, dated Jul. 12, 2010, 1 pg.
Terminal Disclaimer for U.S. Appl. No. 10/632,882 over U.S. Appl. No. 10/495,506, dated Feb. 28, 2007, 1 pg.
Terminal Disclaimer for U.S. Appl. No. 11/933,086 over U.S. Appl. No. 10/495,506, dated Feb. 22, 2011, 1 pg.
Terminal Disclaimer for U.S. Appl. No. 11/933,086 now U.S. Pat. No. 7,504,006, dated Feb. 22, 2011, 1 pg.
Wada, J., et al. "Cu Dual Damascene Process for 0.13µm Technology Generation Using Self Ion Sputtering (SIS) with Ion Reflector," IEEE 2000, 3 pp.
Yamashita, M. "Fundamental Characteristics of Built-in High-frequency Coil-type Sputtering Apparatus," J. Vac. Sci. Technol. A, vol. 7, No. 2, Mar./Apr. 1989, 8 pp.
Yamazato, M., et al. "Preparation of TiN Thin Films by Facing Targets Magnetron Sputtering," Proc. of the 4th ISSP (Kanazawa, 1997), 5 pp.
Yasui, T., et al. "Electron Cyclotron Resonance Plasma Generation Using a Planar Ring-cusp Magnetic Field and a Reentrant Coaxial Cavity," J. Vac. Sci. Technol. A 13(4), Jul./Aug. 1995, 5 pp.
Abstract and Machine Translation for JP Publication No. 06-158299, dated Jun. 7, 1994, 17 pp.
Abstract and Machine Translation for JP Publication No. 08-264447, dated Oct. 11, 1996, 14 pp.
Abstract and Machine Translation for JP Publication No. 09-025573, dated Jan. 28, 1997, 14 pp.
Abstract and Machine Translation for JP Publication No. 11-001770, dated Jan. 6, 1999, 32 pp.
Abstract and Machine Translation for JP Publication No. 2000323571, dated Nov. 24, 2000, 17 pp.
Abstract and Machine Translation for JP Publication No. 2001-200358, dated Jul. 24, 2001, 51 pp.
Final Office Action for U.S. Appl. No. 09/685,978, dated Nov. 21, 2002, 14 pp.
Notice of Allowance for U.S. Appl. No. 09/685,978, dated Jan. 29, 2003, 9 pp.
Office Action 1 for U.S. Appl. No. 09/685,978, dated Jan. 14, 2002, 13 pp.
Notice of Final Rejection 2 for KR Application No. 10-2010-7009485, dated Dec. 20, 2011, 2 pp.
Notice of Final Rejection 2 for KR Application No. 10-2010-7009487, dated Dec. 20, 2011, 3 pp.
Notice of Allowance 1 for CN Application No. 201010163430.7, dated Feb. 1, 2012, 7 pp.
Office Action 5 for U.S. Appl. No. 11/933,157, dated Nov. 30, 2011, 11 pp.
Response to Office Action 5 for U.S. Appl. No. 11/933,157, dated Mar. 30, 2012, 7 pp.

(56) References Cited

OTHER PUBLICATIONS

Office Action 2 for CN Application No. 201010163430.7, dated Aug. 31, 2011, 9 pp.
Response to Office Action 1 for CN Application No. 201010163430.7, dated Jul. 29, 2011, 59 pp.
Response to Office Action 1 for CN Application No. 02827101.7, dated Mar. 20, 2007, 74 pp. (with Translation of Pending Claims).
Response to Office Action 2 for CN Application No. 02827101.7, dated Nov. 26, 2007, 74 pp. (with Translation of Pending Claims).
Response to Office Action 3 for CN Application No. 02827101.7, dated Oct. 14, 2009, 36 pp. (with Translation of Pending Claims).
Final Office Action 1 for JP Application No. 2003-244237, dated Jun. 30, 2011, 6 pp.
Final Office Action 1 for KR Application No. 1020107009485, dated Feb. 15, 2011, 6 pp. [with Translation].
Final Office Action 1 for KR Application No. 1020107009487, dated Feb. 15, 2011, 6 pp. [with Translation].
Final Office Action 1 for U.S. Appl. No. 10/632,882, dated Aug. 18, 2005, 9 pp.
Final Office Action 1 for U.S. Appl. No. 11/184,615, dated Jan. 31, 2008, 12 pp.
Final Office Action 1 for U.S. Appl. No. 11/933,086, dated Nov. 19, 2010, 13 pp.
Fryer, PM, "Method for Controlling the Crystalline Phase of Tantalum", IBM Technical Disclosure Bulletin, IP.com No. IPCOM000036465D, Oct. 1, 1989, 3 pp.
Machine Translation for JP Publication No. 57-207173, dated Dec. 18, 1982, 6 pp.
Notice of Allowance 1 and Allowed Claims for KR Application No. 10-2004-7007317, dated Aug. 26, 2010, 9 pp. [with Translation].
Notice of Allowance 1 for U.S. Appl. No. 10/632,882, dated Mar. 1, 2006, 7 pp.
Notice of Allowance 1 for U.S. Appl. No. 11/933,157, dated Mar. 1, 2011, 8 pp.
Notice of Allowance 2 for U.S. Appl. No. 10/632,882, dated Apr. 25, 2007, 12 pp.
Notice of Allowance 2 for U.S. Appl. No. 11/933,157, dated Jun. 17, 2011, 29 pp.
Notice of Allowance 3 for U.S. Appl. No. 10/632,882, dated Jul. 31, 2007, 9 pp.
Notice of Allowance 4 for U.S. Appl. No. 10/632,882, dated Nov. 28, 2007, 9 pp.
Notice of Allowance 5 for U.S. Appl. No. 10/632,882, dated Mar. 25, 2008, 7 pp.
Notice of Allowance 6 for U.S. Appl. No. 10/632,882, dated Jul. 15, 2008, 7 pp.
Notice of Allowance 7 for U.S. Appl. No. 10/632,882, dated Oct. 27, 2008, 13 pp.
Office Action 1 for CN Application No. 201010163430.7, dated Mar. 17, 2011, 17 pp. [with Translation].
Office Action 1 for U.S. Appl. No. 10/632,882, dated Apr. 8, 2005, 13 pp.
Office Action 1 for U.S. Appl. No. 11/184,615, dated May 15, 2007, 15 pp.
Office Action 1 for U.S. Appl. No. 11/933,086, dated May 4, 2010, 11 pp.
Office Action 1 for U.S. Appl. No. 11/933,157, dated Dec. 17, 2009, 10 pp.
Office Action 1 for U.S. Appl. No. 12/182,988, dated Jul. 2, 2010, 12 pp.
Office Action 2 for U.S. Appl. No. 11/933,157, dated Jul. 13, 2010, 11 pp.
Office Action 3 for U.S. Appl. No. 101632,882, dated Aug. 30, 2006, 20 pp.
Preliminary Amendment for U.S. Appl. No. 11/184,615, dated Jul. 19, 2005, 9 pp.
Preliminary Amendment for U.S. Appl. No. 11/933,157, dated Mar. 5, 2008, 25 pp.
Preliminary Amendment for U.S. Appl. No. 12/182,988, dated Jul. 30, 2008, 9 pp.
Response to Restriction Requirement for U.S. Appl. No. 11/933,157, 6 pp.
Restriction Requirement for U.S. Appl. No. 11/933,157, 5 pp.
Response to Final Office Action for KR Application No. 10-2010-7009485, dated Jun. 15, 2011, 8 pp. [with Translation].
Response to Final Office Action for KR Application No. 10-2010-7009487, dated Jun. 15, 2011, 9 pp. [with Translation].
Response to Final Office Action 1 for U.S. Appl. No. 10/632,882, dated Dec. 19, 2005, 14 pp.
Response to Final Office Action 1 for U.S. Appl. No. 10/632,882, dated Feb. 15, 2006, 11 pp.
Response to Final Office Action 1 for U.S. Appl. No. 11/933,086, dated Jan. 19, 2011, 8 pp.
Response to Final Office Action 1 for U.S. Appl. No. 11/933,086, dated Feb. 22, 2011, 8 pp.
Response to Office Action 1 for KR Application No. 10-2004-7007317, dated Apr. 29, 2010, 24 pp. [with Translation].
Response to Office Action 1 for KR Application No. 10-2010-7009485, dated Oct. 28, 2010, 21 pp. [with Translation].
Response to Office Action 1 for KR Application No. 10-2010-7009487, dated Oct. 28, 2010, 18 pp. [with Translation].
Response to Office Action 1 for U.S. Appl. No. 10/632,882, dated Jul. 8, 2005, 19 pp.
Response to Office Action 1 for U.S. Appl. No. 11/184,615, dated Nov. 15, 2007, 10 pp.
Response to Office Action 1 for U.S. Appl. No. 11/933,086, dated Sep. 7, 2010, 7 pp.
Response to Office Action 1 for U.S. Appl. No. 11/933,157, dated Apr. 19, 2010, 10 pp.
Response to Office Action 2 for U.S. Appl. No. 11/933,157, dated Dec. 13, 2010, 11 pp.
Response to Office Action 3 for U.S. Appl. No. 10/632,882, dated Feb. 28, 2007, 11 pp.
Abstract for DD Publication No. 261812, published Jun. 30, 1987, 1 pp. [Translation].
Abstract for JP Publication No. 61158032, published Jul. 17, 1986, 1 pp. [Translation].
Abstract for JP Publication No. 61221363, published Oct. 1, 1986, 1 pp. [Translation].
Abstract for JP Publication No. 61272373, published Dec. 2, 1986, 1 pp. [Translation].
Abstract for JP Publication No. 63018071, published Jan. 25, 1988, 1 pp. [Translation].
Abstract for JP Publication No. 63213667, published Sep. 6, 1988, 1 pp. [Translation].
Abstract for JP Publication No. 63262462, published Oct. 28, 1988, 1 pp. [Translation].
Apblett, C., M.F. Gonzales, J.C. Barbour, L. Gonzales-Petersen, M. Kovacs, and B. Kuhr, "Silicon Nitride Growth in a High-Density Plasma System", Solid State Technology, Nov. 1995, 5 pp.
Bader, H.P. and M.A. Lardon, "Planarization by Radio-Frequency Bias Sputtering of Aluminum as Studied Experimentally and by Computer Simulation", Journal of Vacuum Science & Technology A, 3 (6), Nov./Dec. 1985, 5 pp.
Cheng, P.F., S.M. Rossnagel, and D.N. Ruzic, "Directional Deposition of Cu into Semiconductor Trench Structures Using Ionized Magnetron Sputtering", Journal of Vacuum Science & Technology B, 13 (2), Mar./Apr. 1995, 6 pp.
International Search Report for Application No. PCT/US02/39510, dated Aug. 22, 2003, 11 pp.
Office Action 1 for KR Application No. 10-2010-7009485, dated Jul. 28, 2010, 7 pp. [with Translation].
Office Action 1 for KR Application No. 10-2010-7009487, dated Jul. 28, 2010, 7 pp. [with Translation].
Ashtiani et al., "A New Hollow-Cathode Magnetron Source for 0.10um Copper Applications", 0-7803-6327-2, 2000, pp. 37-39.
Machine Translation for Japanese Publication No. 10-204614, published Aug. 4, 1998, 12 pp.
Machine Translation for Japanese Publication No. 07-173625, published Jul. 11, 1995, 13 pp.
Machine Translation for Japanese Publication No. 10-284603, published Oct. 23, 1998, 24 pp.

(56) References Cited

OTHER PUBLICATIONS

Machine Translation for Japanese Publication No. 11-074225, published Mar. 16, 1999, 31 pp.
Machine Translation for Japanese Publication No. 11-186261, published Jul. 9, 1999, 42 pp.
Machine Translation for Japanese Publication No. 2000-144412, published May 26, 2000, 23 pp.
Machine Translation for Japanese Publication No. 2000-332106, published Nov. 30, 2000, 43 pp.
Machine Translation for Japanese Publication No. 2001-226767, published Aug. 21, 2001, 47 pp.
Notification of Registration, dated Jan. 29, 2010, for Application No. CN02827101.7, 14 pp.
Office Action 1, dated Jan. 5, 2010, for Application No. JP2003-544237, 11 pp. [with Translation].
Office Action 1, dated Oct. 29, 2009, for Application No. KR10-2004-7007317, 2 pp.
Williams Advanced Materials, "MRAM Technology Reviews", [online] 2005, [retrieved on Aug. 19, 2005], retrieved from the Internet at <URL: http://www.williams-adv.com/tools/mram-technology-review.php>, 2 pp.
CN Publication, Jul. 4, 2001, for CN1301880, 1 pp. [Abstract].
International Search Report, dated Feb. 14, 2003, for International Application No. PCT/US02/36940, 7 pp.
Office Action 1, dated Oct. 20, 2006, for Application No. CN02827101.7, 3 pp.
Office Action 1, dated Oct. 20, 2006, for Application No. CN02827101.7, 3 pp. [Translation].
Office Action 1, dated Jan. 12, 2007, for Application No. CN02828203.5, 4 pp.
Office Action 1, dated Jan. 12, 2007, for Application No. CN02828203.5, 3 pp. [Translation].
Office Action 2, dated Jul. 27, 2007, for Application No. CN02827101.7, 4 pp.
Office Action 2, dated Jul. 27, 2007, for Application No. CN02827101.7, 4 pp. [Translation].
Office Action 3, dated Jun. 19, 2009, for Application No. CN02827101.7, 5 pp.
Office Action 3, dated Jun. 19, 2009, for Application No. CN02827101.7, 5 pp. [Translation].
MAchine Translation of 10-152774 dated Jun. 9, 1998.
Appeal Brief for JP Application No. 2010-153219, dated Aug. 4, 2015, 9 pp.
Appeal Brief for JP Application No. 2013-082450, dated Aug. 26, 2015, 6 pp.
Notice of Allowance for JP Application No. 2010-153219, dated Jan. 4, 2106, 7 pp. (w/ English Translation of Allowed Claims).
Office Action 3 for JP Application No. 2013-082450, dated Oct. 26, 2015, 3 pp. (w/ English Translation).
Response to Office Action 3 for JP Application No. 2013-082450, dated Apr. 20, 2016, 11 pp. (w/ English Translation of Claim Amendments).
Notice of Allowance for JP Application No. 2013-082450, dated May 23, 2016, 8 pp. (wl English Translation of Allowed Claims).
Office Action 1 for JP Application No. 2015-125418, dated Aug. 22, 2016, 8 pp. (w/ English Translation).
Response to Office Action 1 for JP Application No. 2015-125418, dated Feb. 22, 2017, 10 pp. (w/ English Translation).
Office Action 2 for JP Application No. 2015-125418, dated Aug. 2, 2017, 8 pp. (w/ English Translation).
Response to Office Action 2 for JP Application No. 2015-125418, dated Dec. 27, 2017, 10 pp. (w/ English Translation).
Abstract and Machine Translation for JP Publication No. 2010-283360, Dec. 16, 2010, 143 pp.

\* cited by examiner

SELF-IONIZED AND INDUCTIVELY-COUPLED PLASMA FOR SPUTTERING AND RESPUTTERING

RELATED APPLICATIONS

This application is a continuation in part application of pending application Ser. No. 09/685,978 filed Oct. 10, 2000, a divisional application of application Ser. No. 09/414,614 filed Oct. 8, 1999 (issued as U.S. Pat. No. 6,398,929); and is a continuation in part of pending application Ser. No. 10/202,778, filed Jul. 25, 2002 (which claims priority to provisional applications 60/316,137 filed Aug. 30, 2001, and 60/342,608 filed Dec. 21, 2001); and is a continuation in part application of pending application Ser. No. 09/993,543, filed Nov. 14, 2001, which are incorporated by reference in their entireties.

FIELD OF THE INVENTION

The invention relates generally to sputtering and resputtering. In particular, the invention relates to the sputter deposition of material and resputtering of deposited material in the formation of semiconductor integrated circuits.

BACKGROUND ART

Semiconductor integrated circuits typically include multiple levels of metallization to provide electrical connections between large numbers of active semiconductor devices. Advanced integrated circuits, particularly those for microprocessors, may include five or more metallization levels. In the past, aluminum has been the favored metallization, but copper has been developed as a metallization for advanced integrated circuits.

A typical metallization level is illustrated in the cross-sectional view of FIG. 1. A lower-level layer 110 includes a conductive feature 112. If the lower-level layer 110 is a lower-level dielectric layer, such as silica or other insulating material, the conductive feature 112 may be a lower-level copper metallization, and the vertical portion of the upper-level metallization is referred to as a via since it interconnects two levels of metallization. If the lower-level layer 110 is a silicon layer, the conductive feature 112 may a doped silicon region, and the vertical portion of the upper-level metallization formed in a hole is referred to as a contact because it electrically contacts silicon. An upper-level dielectric layer 114 is deposited over the lower-level dielectric layer 110 and the lower-level metallization 112. There are yet other shapes for the holes including lines and trenches. Also, in dual damascene and similar interconnect structures, as described below, the holes have a complex shape. In some applications, the hole may not extend through the dielectric layer. The following discussion will refer to only via holes, but in most circumstances the discussion applies equally well to other types of holes with only a few modifications well known in the art.

Conventionally, the dielectric is silicon oxide formed by plasma-enhanced chemical vapor deposition (PECVD) using tetraethytorthosilicate (TEOS) as the precursor. However, low-k materials of other compositions and deposition techniques are being considered. Some of the low-k dielectrics being developed can be characterized as silicates, such as fluorinated silicate glasses. Hereafter, only silicate (oxide) dielectrics will be directly described, but it is contemplated that other dielectric compositions may be used.

A via hole is etched into the upper-level dielectric layer 114 typically using. In the case of silicate dielectrics, a fluorine-based plasma etching process. In advanced integrated circuits, the via holes may have widths as low as 0.18 µm or even less. The thickness of the dielectric layer 114 is usually at least 0.7 µm, and sometimes twice this, so that the aspect ratio of the hole may be 4:1 or greater. Aspect ratios of 6:1 and greater are being proposed. Furthermore, in most circumstances, the via hole should have a vertical profile.

A liner layer 116 may be deposited onto the bottom and sides of the hole and above the dielectric layer 114. The liner 116 can perform several functions. It can act as an adhesion layer between the dielectric and the metal since metal films tend to peel from oxides. It can also act as a barrier against inter-diffusion between the oxide-based dielectric and the metal. It may also act as a seed and nucleation layer to promote the uniform adhesion and growth and possibly low-temperature reflow for the deposition of metal filling the hole and to nucleate the even growth of a separate seed layer. One or more liner layers may be deposited, in which one layer may function primarily as a barrier layer and others may function primarily as adhesion, seed or nucleation layers.

An interconnect layer 118 of a conductive metal such as copper, for example, is then deposited over the liner layer 116 to fill the hole and to cover the top of the dielectric layer 114. Conventional aluminum metallizations are patterned into horizontal interconnects by selective etching of the planar portion of the metal layer 118. However, a technique for copper metallization, called dual damascene, forms the hole in the dielectric layer 114 into two connected portions, the first being narrow vias through the bottom portion of the dielectric and the second being wider trenches in the surface portion which interconnect the vies. After the metal deposition, chemical mechanical polishing (CMP) is performed which removes the relatively soft copper exposed above the dielectric oxide but which stops on the harder oxide. As a result, multiple copper-filled trenches of the upper level, similar to the conductive feature 112 of the next lower level, are isolated from each other. The copper filled trenches act as horizontal interconnects between the copper-filled vias. The combination of dual damascene and CMP eliminates the need to etch copper. Several layer structures and etching sequences have been developed for dual damascene, and other metallization structures have similar fabrication requirements.

Lining and filling via holes and similar high aspect-ratio structures, such as occur in dual damascene, have presented a continuing challenge as their aspect ratios continue to increase. Aspect ratios of 4:1 are common and the value will further increase. An aspect ratio as used herein is defined as the ratio of the depth of the hole to narrowest width of the hole, usually near its top surface. Via widths of 0.18 µm are also common and the value will further decrease. For advanced copper interconnects formed in oxide dielectrics, the formation of the barrier layer tends to be distinctly separate from the nucleation and seed layer. The diffusion barrier may be formed from a bilayer of Ta/TaN, W/WN, or Ti/TiN, or of other structures. Barrier thicknesses of 10 to 50 nm are typical. For copper interconnects, it has been found useful to deposit one or more copper layers to fulfill the nucleation and seed functions.

The deposition of the liner layer or the metallization by conventional physical vapor deposition (PVD), also called sputtering, is relatively fast. A DC magnetron sputtering reactor has a target which is composed of the metal to be sputter deposited and which is powered by a DC electrical source. The magnetron is scanned about the back of the target and projects its magnetic field into the portion of the reactor adjacent the target to increase the plasma density there to thereby increase the sputtering rate. However, conventional DC sputtering (which will be referred to as PVD in contrast to other types of sputtering to be introduced) predominantly sputters neutral atoms. The typical ion densities in PVD are often less than $10^9$ cm$^{-3}$, PVD also tends to sputter atoms into a wide angular distribution, typically having a cosine dependence about the target normal. Such a wide distribution can be disadvantageous for filling a deep and narrow via hole 122 such as that illustrated in FIG. 2, in which a barrier layer 124 has already been deposited. The large number of off-angle sputter particles can cause a layer 126 to preferentially deposit around the upper corners of the hole 122 and form overhangs 128. Large overhangs can further restrict entry into the hole 122 and cause inadequate coverage of the sidewalls 130 and bottom 132 of the hole 122. Also, the overhangs 128 can bridge the hole 122 before it is filled and create a void 134 in the metallization within the hole 122. Once a void 134 has formed, it is often difficult to reflow it out by heating the metallization to near its melting point. Even a small void can introduce reliability problems. If a second metallization deposition step is planned, such as by electroplating, the bridged overhang make subsequent deposition more difficult.

One approach to ameliorate the overhang problem is long-throw sputtering in which the sputtering target is spaced relatively far from the wafer or other substrate being sputter coated. For example, the target-to-wafer spacing can be at least 50% of wafer diameter, preferably more than 90%, and more preferably more than 140%. As a result, the off-angle portion of the sputtering distribution is preferentially directed to the chamber walls, but the central-angle portion remains directed substantially to the wafer. The truncated angular distribution can cause a higher fraction of the sputter particles to be directed deeply into the hole 122 and reduce the extent of the overhangs 128. A similar effect can be accomplished by positioning a collimator between the target and wafer. Because the collimator has a large number of holes of high aspect ratio, the off-angle sputter particles tend to strike the sidewalls of the collimator, and the central-angle particles tend to pass through. Both long-throw targets and collimators typically reduce the flux of sputter particles reaching the wafer and thus tend to reduce the sputter deposition rate. The reduction can become more pronounced as throws are lengthened or as collimation is tightened to accommodate via holes of increasing aspect ratios.

Also, the length that long throw sputtering may be increased may be limited. At the few milliTorr of argon pressure often used in PVD sputtering, there is a greater possibility of the argon scattering the sputtered particles as the target to wafer spacing increases. Hence, the geometric selection of the forward particles may be decreased. A yet further problem with both long throw and collimation is that the reduced metal flux can result in a longer deposition period which can not only reduce throughput, but also tends to increase the maximum temperature the wafer experiences during sputtering. Still further, long throw sputtering can reduce over hangs and provide good coverage in the middle and upper portions of the sidewalls, but the lower sidewall and bottom coverage can be less than satisfactory.

Another technique for deep hole lining and filling is sputtering using a high-density plasma (HDP) in a sputtering process called ionized metal plating (IMP). A typical high-density plasma is one having an average plasma density across the plasma, exclusive of the plasma sheaths, of at least $10^{11}$ cm$^{-3}$, and preferably at least $10^{12}$ cm$^{-3}$. In IMP deposition, a separate plasma source region is formed in a region away from the wafer, for example, by inductively coupling RF power into a plasma from an electrical coil wrapped around a plasma source region between the target and the wafer. The plasma generated in this fashion is referred to as an inductively coupled plasma (ICP). An HDP chamber having this configuration is commercially available from Applied Materials of Santa Clara, Calif. as the HDP PVD Reactor. Other HDP sputter reactors are available. The higher power ionizes not only the argon working gas, but also significantly increases the ionization fraction of the sputtered atoms, that is, produces metal ions. The wafer either self-charges to a negative potential or is RF biased to control its DC potential. The metal ions are accelerated across the plasma sheath as they approach the negatively biased wafer. As a result, their angular distribution becomes strongly peaked in the forward direction so that they are drawn deeply into the via hole. Overhangs become much less of a problem in IMP sputtering, and bottom coverage and bottom sidewall coverage are relatively high.

IMP sputtering using a remote plasma source is usually performed at a higher pressure such as 30 milliTorr or higher. The higher pressures and a high-density plasma can produce a very large number of argon ions, which are also accelerated across the plasma sheath to the surface being sputter deposited. The argon ion energy is often dissipated as heat directly into the film being formed. Copper can dewet from tantalum nitride and other barrier materials at elevated temperatures experienced in IMP, even at temperatures as low at 50 to 75 C. Further, the argon tends to become embedded in the developing film. IMP can deposit a copper film as illustrated at 136 in the cross-sectional view of FIG. 3, having a surface morphology that is rough or discontinuous. If so, such a film may not promote hole filling, particularly when the liner is being used as the electrode for electroplating.

Another technique for depositing metals is sustained self-sputtering (SSS), as is described by Fu et al. in U.S. patent application Ser. No. 08/854,008, filed May 8, 1997 and by Fu in U.S. Pat. No. 6,183,614 B1, Ser. No. 09/373,097, filed Aug. 12, 1999, incorporated by reference in their entireties. For example, at a sufficiently high plasma density adjacent a copper target, a sufficiently high density of copper ions develops that the copper ions will resputter the copper target with yield over unity. The supply of argon working gas can then be eliminated or at least reduced to a very low pressure while the copper plasma persists. Aluminum is believed to be not readily susceptible to SSS. Some other materials, such as Pd, Pt, Ag, and Au can also undergo SSS.

Depositing copper or other metals by sustained self-sputtering of copper has a number of advantages. The sputtering rate in SSS tends to be high. There is a high fraction of copper ions which can be accelerated across the plasma sheath and toward a biased wafer, thus increasing the directionality of the sputter flux. Chamber pressures may be made very low, often limited by leakage of backside cooling gas, thereby reducing wafer heating from the argon ions and decreasing scattering of the metal particles by the argon.

Techniques and reactor structures have been developed to promote sustained self-sputtering. It has been observed that some sputter materials not subject to SSS because of sub-unity resputter yields nonetheless benefit from these same techniques and structures, presumably because of partial self-sputtering, which results in a partial self-ionized plasma (SIP). Furthermore, it is often advantageous to sputter copper with a low but finite argon pressure even though SSS without any argon working gas is achievable. Hence, SIP sputtering is the preferred terminology for the more generic sputtering process involving a reduced or zero pressure of working gas so that SSS is a type of SIP. SIP sputtering has also been described by Fu et al. in U.S. Pat. No. 6,290,825 and by Chiang at al. in U.S. patent application Ser. No. 09/414,614, filed Oct. 8, 1999, both incorporated herein by reference in their entireties.

SIP sputtering uses a variety of modifications to a fairly conventional capacitively coupled magnetron sputter reactor to generate a high-density plasma (HDP) adjacent to the target and to extend the plasma and guide the metal ions toward the wafer. Relatively high amounts of DC power are applied to the target, for example, 20 to 40 kW for a chamber designed for 200 mm wafers. Furthermore, the magnetron has a relatively small area so that the target power is concentrated in the smaller area of the magnetron, thus increasing the power density supplied to the HDP region adjacent the magnetron. The small-area magnetron is disposed to a side of a center of the target and is rotated about the center to provide more uniform sputtering and deposition.

In one type of SIP sputtering, the magnetron has unbalanced poles, usually a strong outer pole of one magnetic polarity surrounding a weaker inner pole of the other polarity. The magnetic field lines emanating from the stronger pole may be decomposed into not only a conventional horizontal magnetic field adjacent the target face but also a vertical magnetic field extending toward the wafer. The vertical field lines extend the plasma closer toward the wafer and also guide the metal ions toward the wafer. Furthermore, the vertical magnetic lines close to the chamber walls act to block the diffusion of electrons from the plasma to the grounded shields. The reduced electron loss is particularly effective at increasing the plasma density and extending the plasma across the processing space.

SIP sputtering may be accomplished without the use of RF inductive coils. The small HDP region is sufficient to ionize a substantial fraction of metal ions, estimated to be between 10 and 25%, which effectively sputter coats into deep holes. Particularly at the high ionization fraction, the ionized sputtered metal atoms are attracted back to the targets and sputter yet further metal atoms. As a result, the argon working pressure may be reduced without the plasma collapsing. Therefore, argon heating of the wafer is less of a problem, and there is reduced likelihood of the metal ions colliding with argon atoms, which would both reduce the ion density and randomize the metal ion sputtering pattern.

A further advantage of the unbalanced magnetron used in SIP sputtering is that the magnetic field from the stronger, outer annular pole projects far into the plasma processing area towards the wafer. This projecting field has the advantage of supporting a strong plasma over a larger extent of the plasma processing area and to guide ionized sputter particles towards the wafer. Wei Wang in U.S. patent application Ser. No. 09/612,861 filed Jul. 10, 2000 discloses the use of a coaxial electromagnetic coil wrapped around the major portion of the plasma process region to create a magnetic field component extending from the target to the wafer. The magnetic coil is particularly effective in combining SIP sputtering in a long-throw sputter reactor, that is, one having a larger spacing between the target and the wafer because the auxiliary magnetic field supports the plasma and further guides the ionized sputter particles. Lai discloses in U.S. Pat. No. 5,593,551 a smaller coil in near the target.

However, SIP sputtering could still be improved. One of its fundamental problems is the limited number of variables available in optimizing the magnetic field configuration. The magnetron should be small in order to maximize the target power density, but the target needs to be uniformly sputtered. The magnetic field should have a strong horizontal component adjacent the target to maximize the electron trapping there. Some component of the magnetic field should project from the target towards the wafer to guide the ionized sputter particles. The coaxial magnetic coil of Wang addresses only some of these problems. The horizontally arranged permanent magnets disclosed by Lai in U.S. Pat. No. 5,593,551 poorly address this effect.

Metal may also be deposited by chemical vapor deposition (CVD) using metallo-organic precursors, such as Cu-HFAC-VTMS, commercially available from Schumacher in a proprietary blend with additional additives under the trade name CupraSelect. A thermal CVD process may be used with this precursor, as is very well known in the art, but plasma enhanced CVD (PECVD) is also possible. The CVD process is capable of depositing a nearly conformal film even in the high aspect-ratio holes. For example, a film may be deposited by CVD as a thin seed layer, and then PVD or other techniques may be used for final hole filling. However, CVD copper seed layers have often been observed to be rough. The roughness can detract from its use as a seed layer and more particularly as a reflow layer promoting the low temperature reflow of after deposited copper deep into hole. Also, the roughness indicates that a relatively thick CVD copper layer of the order of 50 nm may be needed to reliably coat a continuous seed layer. For the narrower via holes now being considered, a CVD copper seed layer of a certain thickness may nearly fill the hole. However, complete fills performed by CVD can suffer from center seams, which may impact device reliability.

Another, combination technique uses IMP sputtering to deposit a thin copper nucleation layer, sometimes referred to as a flash deposition, and a thicker CVD copper seed layer is deposited on the IMP layer. However, as was illustrated in FIG. 3, the IMP layer 136 can be rough, and the CVD layer tends to conformally follow the roughened substrate. Hence, the CVD layer over an IMP layer will also tend to be rough.

Electrochemical plating (ECP) is yet another copper deposition technique that is being developed. In this method, the wafer is immersed in a copper electrolytic bath. The wafer is electrically biased with respect to the bath, and copper electrochemically deposits on the wafer in a generally conformal process. Electroless plating techniques are also available. Electroplating and its related processes are advantageous because they can be performed with simple equipment at atmospheric pressure, the deposition rates are high, and the liquid processing is consistent with the subsequent chemical mechanical polishing.

Electroplating, however, imposes its own requirements. A seed and adhesion layer is usually provided on top of the barrier layer, such as of Ta/TaN, to nucleate the electroplated copper and adhere it to the barrier material. Furthermore, the generally insulating structure surrounding the via hole 122 requires that an electroplating electrode be formed between the dielectric layer 114 and the via hole 122. Tantalum and other barrier materials are typically relatively poor electrical conductors, and the usual nitride sublayer of the barrier layer 124 which faces the via hole 122 (containing the copper electrolyte) is even less conductive for the long transverse current paths needed in electroplating. Hence, a good conductive seed and adhesion layer are often deposited to facilitate the electroplating effectively filling the bottom of the via hole.

A copper seed layer deposited over the barrier layer 124 is typically used as the electroplating electrode. However, a continuous, smooth, and uniform film is preferred. Otherwise, the electroplating current will be directed only to the areas covered with copper or be preferentially directed to areas covered with thicker copper. Depositing the copper seed layer presents its own difficulties. An IMP deposited seed layer provides good bottom coverage in high aspect-ratio holes, but its sidewall coverage can be small such that that the resulting thin films can be rough or discontinuous. A thin CVD deposited seed can also be too rough. A thicker CVD seed layer, or CVD copper over IMP copper, may require an excessively thick seed layer to achieve the required continuity. Also, the electroplating electrode primarily operates on the entire hole sidewalls so that high sidewall coverage is desired. Long throw provides adequate sidewall coverage, but the bottom coverage may not be sufficient.

SUMMARIES OF ILLUSTRATIVE EMBODIMENTS

One embodiment of the present invention is directed to sputter depositing a liner material such as tantalum or tantalum nitride, by combining long-throw sputtering, self-ionized plasma (SIP) sputtering, inductively-coupled plasma (ICP) resputtering, and coil sputtering in one chamber. Long-throw sputtering is characterized by a relatively high ratio of the target-to-substrate distance and the substrate diameter. Long-throw SIP sputtering promotes deep hole coating of both the ionized and neutral deposition material components. ICP resputtering can reduce the thickness of layer bottom coverage of deep holes to reduce contact resistance. During ICP resputtering, ICP coil sputtering can deposit a protective layer, particularly on areas such as adjacent the hole openings where thinning by resputtering may not be desired.

Another embodiment of the present invention is directed to sputter depositing an interconnect material such as copper, by combining long-throw sputtering, self-ionized plasma (SIP) sputtering and SIP resputtering in one chamber. Again, long-throw SIP sputtering promotes deep hole coating of both the ionized and neutral copper components, SIP resputtering can redistribute the deposition to promote good bottom corner coverage of deep holes.

SIP tends to be promoted by low pressures of less than 5 milliTorr, preferably less than 2 milliTorr, and more preferably less than 1 milliTorr. SIP, particularly at these low pressures, tends to be promoted by magnetrons having relatively small areas to thereby increase the target power density, and by magnetrons having asymmetric magnets causing the magnetic field to penetrate farther toward the substrate. Such a process may be used to deposit a seed layer, promoting the nucleation or seeding of an after deposited layer, particularly useful for forming narrow and deep vitas or contacts through a dielectric layer. A further layer may be deposited by electrochemical plating (ECP). In another embodiment, a further layer is be deposited by chemical vapor deposition (CVD).

One embodiment includes an auxiliary magnet array in a magnetron sputter reactor disposed around the chamber close to the wafer and having a first vertical magnetic polarity. The magnets may either be permanent magnets or an array of electromagnets having coil axes along the central axis of the chamber.

In one embodiment, a rotatable magnetron having a strong outer pole of the first magnetic polarity surrounds a weaker pole of the opposite polarity. The auxiliary magnets are preferably located in the half of the processing space near the wafer to pull the unbalanced portion of the magnetic field from the outer pole towards the wafer.

Resputtering in an SIP chamber may be promoted in multiple steps in which, in one embodiment, biasing of the wafer is increased during deposition. Alternatively, power to the target may be decreased during deposition to redistribute deposition to the bottom corners of vies and other holes.

There are additional aspects to the present invention as discussed below. It should therefore be understood that the preceding is merely a brief summary of some embodiments and aspects of the present invention. Additional embodiments and aspects of the present invention are referenced below. It should further be understood that numerous changes to the disclosed embodiments can be made without departing from the spirit or scope of the invention. The preceding summary therefore is not meant to limit the scope of the invention. Rather, the scope of the invention is to be determined only by the appended claims and their equivalents.

DESCRIPTIONS OF ILLUSTRATIVE EMBODIMENTS

Figure 1:
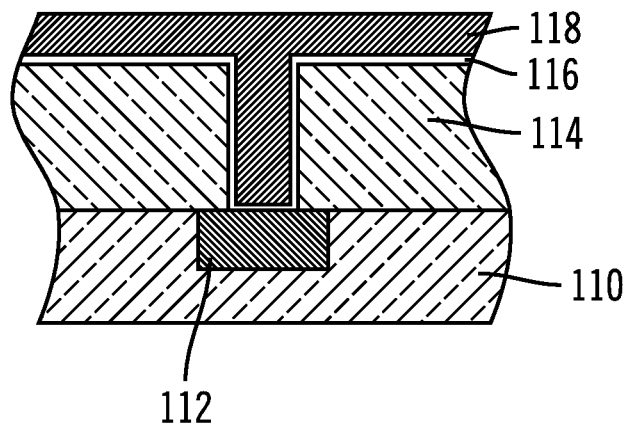
FIG. 1 is a cross-sectional view of a via filled with a metallization, which also covers the top of the dielectric, as practiced in the prior art.
Figure 2:
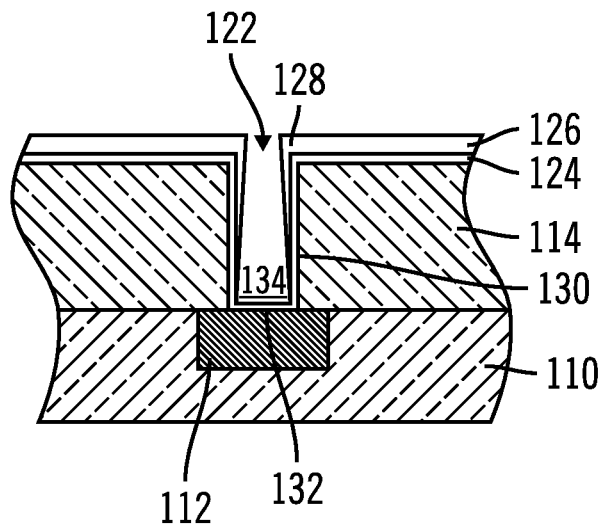
FIG. 2 is a cross-sectional view of a via during its filling with metallization, which overhangs and closes off the via hole.
Figure 3:
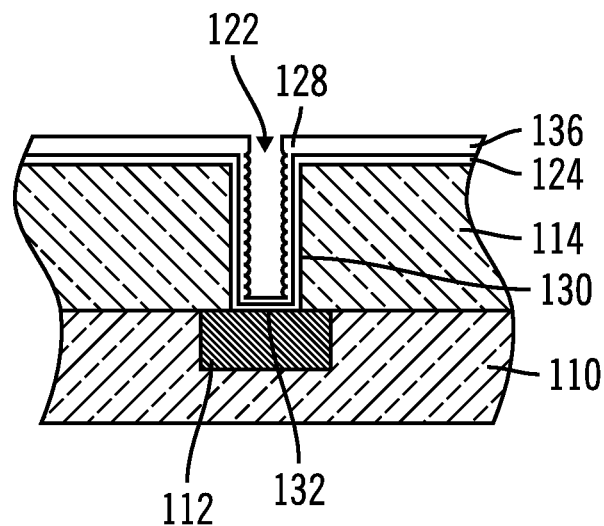
FIG. 3 is a cross-sectional view of a via having a rough seed layer deposited by ionized metal plating.

The distribution between sidewall and bottom coverage in a DC magnetron sputtering reactor can be tailored to produce a metal layer such as a liner layer having a desired profile in a hole or via in a dielectric layer. A SIP film sputter deposited into a high-aspect ratio via can have favorable upper sidewall coverage and tends not to develop overhangs. Where desired, bottom coverage may be thinned or eliminated by ICP resputtering of the bottom of the via. In accordance with one aspect of the present invention, the advantages of both types of sputtering can be obtained in a reactor which combines selected aspects of both SIP and ICP plasma generation techniques, which may be in separate steps. An example of such a reactor is illustrated generally at 150 in FIG. 4. In addition, upper portions of a liner layer sidewall may be protected from resputtering by sputtering an ICP coil 151 located within the chamber to deposit coil material onto the substrate.

The reactor 150 may also be used to sputter deposit a metal layer such as a barrier or liner layer using both SIP and ICP generated plasmas, preferably in combination, but alternatively, alternately. The distribution between ionized and neutral atomic flux in a DC magnetron sputtering reactor can be tailored to produce a coating in a hole or via in a dielectric layer. As previously mentioned, a SIP film sputter deposited into a high-aspect ratio hole can have favorable upper sidewall coverage and tends not to develop overhangs. On the other hand, an ICP generated plasma can increase metal ionization such that a film sputter deposited into such a hole may have good bottom and bottom corner coverage. In accordance with yet another aspect of the present invention, the advantages of both types of sputtering can be obtained in a reactor, such as the reactor 150, which combines selected aspects of both deposition techniques. In addition, coil material may be sputtered to contribute to the deposition layer as well, if desired.

The reactor 150 and various processes for forming liner, barrier and other layers is described in detail in pending U.S. application Ser. No. 10/202,778, filed Jul. 25, 2002 and is incorporated by reference in its entirety. As described therein, the reactor 150 of the illustrated embodiment is a DC magnetron type reactor based on a modification of the Endura PVD Reactor available from Applied Materials, Inc. of Santa Clara, Calif. This reactor includes a vacuum chamber 152, usually of metal and electrically grounded, sealed through a target isolator 154 to a PVD target 156 having at least a surface portion composed of the material to be sputter deposited on a wafer 158. Although the target sputtering surface is depicted as being planar in the drawings, it is appreciated that the target sputtering surface or surfaces may have a variety of shapes including vaulted and cylindrical. The wafer may be different sizes including 150, 200, 300 and 450 mm. The illustrated reactor 150 is capable of self-ionized sputtering (SIP) in a long-throw mode. This SIP mode may be used in one embodiment in which coverage is directed primarily directed to the sidewalls of the hole. The SIP mode may be used to achieve good bottom coverage also.

The reactor 150 also has an RF coil 151 which inductively couples RF energy into the interior of the reactor. The RF energy provided by the coil 151 ionizes a precursor gas such as argon to maintain a plasma to resputter a deposition layer using ionized argon to thin bottom coverage, or to ionize sputtered deposition material to improve bottom coverage. In one embodiment, rather than maintain the plasma at a relatively high pressure, such as 20-60 mTorr typical for high density IMP processes, the pressure is preferably maintained at a substantially lower pressure, such as 1 mTorr for deposition of tantalum nitride or 2.5 mTorr for deposition of tantalum, for example. However, a pressure in the range of 0.1 to 40 mTorr may be appropriate, depending upon the application. As a consequence, it is believed that the ionization rate within the reactor 150 will be substantially lower than that of the typical high density IMP process. This plasma may be used to resputter a deposited layer or to ionize sputtered deposition material or, or both. Still further, the coil 151 itself may be sputtered to provide a protective coating on the wafer during resputtering of the material deposited onto the wafer for those areas in which thinning of the deposited material is not desired, or to otherwise provide additional deposition material.

In one embodiment, it is believed that good upper sidewall coverage and bottom corner coverage can be achieved in a multi-step process in which in one step, little or no RF power is applied to the coils. Thus, in one step, ionization of the sputtered target deposition material would occur primarily as a result of the self-ionization. Consequently, it is believed that good upper sidewall coverage may be achieved. In a second step and preferably in the same chamber, RF power may be applied to the coil 151 while low or no power is applied to the target. In this embodiment, little or no material would be sputtered from the target 150 while ionization of a precursor gas would occur primarily as a result of the RF energy inductively coupled by the coil 151. The ICP plasma may be directed to thin or eliminate bottom coverage by etching or resputtering to reduce barrier layer resistance at the bottom of the hole. In addition, the coil 151 may be sputtered to deposit protective material where thinning is not desired. In one embodiment, the pressure may be kept relatively low such that the plasma density is relatively low to reduce ionization of the sputtered deposition material from the coil. As a result, sputtered coil material can remain largely neutral so as to deposit primarily onto upper sidewalls to protect those portions from thinning.

Since the illustrated reactor 150 is capable of self-ionized sputtering, deposition material may be ionized not only as a result of the plasma maintained by the RF coil 151, but also by the sputtering of the target 156 itself. When it is desired to deposit a layer with good bottom coverage, it is believed that the combined SIP and ICP ionization processes provide sufficient ionized material for good bottom and bottom corner coverage. However, it is also believed that the lower ionization rate of the low pressure plasma provided by the RF coil 151 allows sufficient neutral sputtered material to remain un-ionized so as to be deposited on the upper sidewalls. Thus, it is believed that the combined sources of ionized deposition material can provide both good upper sidewall coverage as well as good bottom and bottom corner coverage as explained in greater detail below.

In an alternative embodiment, it is believed that good upper sidewall coverage, bottom coverage and bottom corner coverage can be achieved in a multi-step process in which in one step, little or no RF power is applied to the coils. Thus, in one step, ionization of the deposition material would occur primarily as a result of the self-ionization. Consequently, it is believed that good upper sidewall coverage may be achieved. In a second step and preferably in the same chamber, RF power may be applied to the coil 151. In addition, in one embodiment, the pressure may be raised substantially such that a high density plasma may be maintained. As a result, it is believed that good bottom and bottom corner coverage may be achieved in the second step.

A wafer clamp 160 holds the wafer 158 on a pedestal electrode 162. Resistive heaters, refrigerant channels, and thermal transfer gas cavity in the pedestal 182 can be provided to allow the temperature of the pedestal to be controlled to temperatures of less than −40 degrees C. to thereby allow the wafer temperature to be similarly controlled.

To achieve deeper hole coating with a partially neutral flux, the distance between the target 156 and the wafer 158 can be increased to operate in the long-throw mode. When used, the target-to-substrate spacing is typically greater than half the substrate diameter. In the illustrated embodiment it is preferably greater than 90% wafer diameter (e.g. 190 mm spacings for a 200 mm wafer and 290 mm for a 300 mm wafer), but spacings greater than 80% including greater than 100% and greater than 140% of the substrate diameter are believed appropriate also. For many applications, it is believed that a target to wafer spacing of 50 to 1000 mm will be appropriate. Long throw in conventional sputtering reduces the sputtering deposition rate, but ionized sputter particles do not suffer such a large decrease.

A darkspace shield 164 and a chamber shield 166 separated by a second dielectric shield isolator 168 are held within the chamber 152 to protect the chamber wall 152 from the sputtered material. In the illustrated embodiment, both the darkspace shield 164 and the chamber shield 166 are grounded. However, in some embodiments, shields may be floating or biased to a nonground level. The chamber shield 166 also acts as the anode grounding plane in opposition to the cathode target 156, thereby capacitively supporting a plasma. If the darkspace shield is permitted to float electrically, some electrons can deposit on the darkspace shield 164 so that a negative charge builds up there. It is believed that the negative potential could not only repel further electrons from being deposited, but also confine the electrons in the main plasma area, thus reducing the electron loss, sustaining low-pressure sputtering, and increasing the plasma density, if desired.

The coil 151 is carried on the shield 164 by a plurality of coil standoffs 180 which electrically insulate the coil 151 from the supporting shield 164. In addition, the standoffs 180 have labyrinthine passageways which permit repeated deposition of conductive materials from the target 110 onto the coil standoffs 180 while preventing the formation of a complete conducting path of deposited material from the coil 151 to the shield 164 which could short the coil 151 to the shield 164 (which is typically at ground).

To enable use of the coil as a circuit path, RF power is passed through the vacuum chamber walls and through the shield 164 to ends of the coil 151. Vacuum feedthroughs (not shown) extend through the vacuum chamber wall to provide RF current from a generator preferably located outside the vacuum pressure chamber. RF power is applied through the shield 164 to the coil 151 by feedthrough standoffs 182 (FIG. 5), which like the coil standoffs 180, have labyrinthine passageways to prevent formation of a path of deposited material from the coil 151 to the shield 164 which could short the coil 151 to the shield 164.

The plasma darkspace shield 164 is generally cylindrically-shaped. The plasma chamber shield 166 is generally bowl-shaped and includes a generally cylindrically shaped, vertically oriented wall 190 to which the standoffs 180 and 182 are attached to insulatively support the coil 151.

Figure 5:
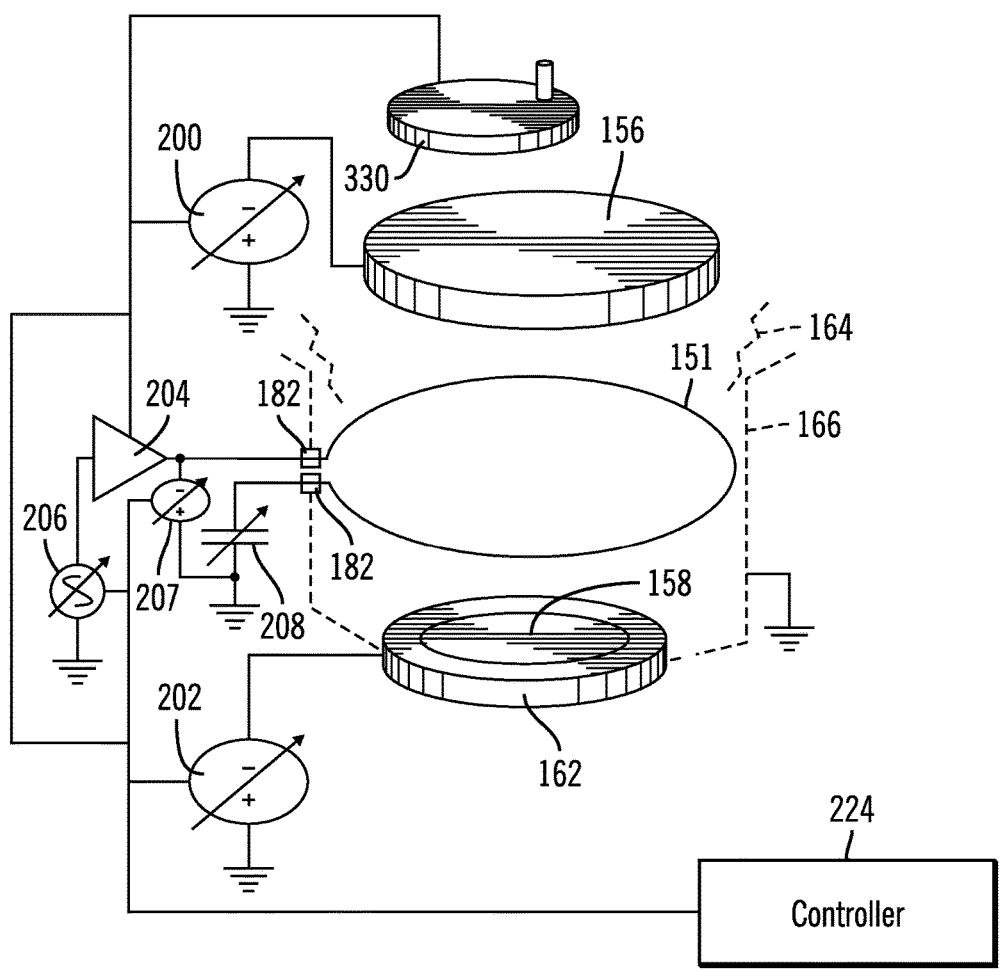
FIG. 5 is a schematic representation of electrical interconnections of various components of the sputtering chamber of FIG. 4.

FIG. 5 is a schematic representation of the electrical connections of the plasma generating apparatus of the illustrated embodiment. To attract the ions generated by the plasma, the target 156 is preferably negatively biased by a variable DC power source 200 at a DC power of 1-40 kW, for example. The source 200 negatively biases the target 156 to about −400 to −600 VDC with respect to the chamber shield 166 to ignite and maintain the plasma. A target power of between 1 and 5 kW is typically used to ignite the plasma while a power of greater than 10 kW is preferred for the SIP sputtering described here. For example, a target power of 24 kW may be used to deposit tantalum nitride by SIP sputtering and a target power of 20 kW may be used to deposit tantalum by SIP sputtering. During ICP resputtering the target power may be reduced to 100-200 watts, for example to maintain plasma uniformity. Alternatively, the target power may be maintained at a high level if target sputtering during ICP resputtering is desired, or may be turned off entirely, if desired.

The pedestal 162 and hence the wafer 158 may be left electrically floating, but a negative DC self-bias may nonetheless develop on it. Alternatively, the pedestal 162 may be negatively biased by a source 202 at −30 v DC to negatively bias the substrate 158 to attract the ionized deposition material to the substrate. Other embodiments may apply an RF bias to the pedestal 162 to further control the negative DC bias that develops on it. For example, the bias power supply 202 may be an RF power supply operating at 13.56 MHz. It may be supplied with RF power in a range of 10 watts to 5 kW, for example, a more preferred range being 150 to 300 W for a 200 mm wafer in SIP deposition.

One end of the coil 151 is insulatively coupled through the shield 166 by a feedthrough standoff 182 to an RF source such as the output of an amplifier and matching network 204. The input of the matching network 204 is coupled to an RF generator 206, which provides RF power at approximately 1 or 1.5 kW watts for ICP plasma generation for this embodiment. For example, a power of 1.5 kW for tantalum nitride deposition and a power of 1 kW for tantalum deposition is preferred. A preferred range is 50 watts to 10 kW. During SIP deposition, the RF power to the coil may be turned off if desired. Alternatively. RF power may be supplied during SIP deposition if desired.

The other end of the coil 151 is also insulatively coupled through the shield 166 by a similar feedthrough standoff 182 to ground, preferably through a blocking capacitor 208 which may be a variable capacitor, to support a DC bias on the coil 151. The DC bias on the coil 151 and hence the coil sputtering rate may be controlled through a DC power source 209 coupled to the coil 151, as described in U.S. Pat. No. 6,375,810. Suitable DC power ranges for ICP plasma generation and coil sputtering include 50 watts to 10 kWatts. A preferred value is 500 watts during coil sputtering. DC power to the coil 151 may be turned off during SIP deposition, if desired.

The above-mentioned power levels may vary of course, depending upon the particular application. A computer-based controller 224 may be programmed to control the power levels, voltages, currents and frequencies of the various sources in accordance with the particular application.

The RF coil 151 may be positioned relatively low in the chamber so that material sputtered from the coil has a low angle of incidence when striking the wafer. As a consequence, coil material may be deposited preferentially on the upper corners of the holes so as to protect those portions of the hole when the hole bottoms are being resputtered by the ICP plasma. In the illustrated embodiment, it is preferred that the coil be positioned closer to the wafer than to the target when the primary function of the coil is to generate a plasma to resputter the wafer and to provide the protective coating during resputtering. For many applications, it is believed that a coil to wafer spacing of 0 to 500 mm will be appropriate. It is appreciated however that the actual position will vary, depending upon the particular application. In those applications in which the primary function of the coil is to generate a plasma to ionize deposition material, the coil may be positioned closer to the target. Also, as set forth in greater detail in U.S. Pat. No. 6,368,469, entitled Sputtering Coil for Generating a Plasma, filed Jul. 10, 1996 and assigned to the assignee of the present application, an RF coil may also be positioned to improve the uniformity of the deposited layer with sputtered coil material. In addition, the coil may have a plurality of turns formed in a helix or spiral or may have as few turns as a single turn to reduce complexity and costs and facilitate cleaning.

A variety of coil support standoffs and feedthrough standoffs may be used to insulatively support the coils. Since sputtering, particularly at the high power levels associated with SSS. SIP and ICP, involves high voltages, dielectric isolators typically separate the differently biased parts. As a result, it is desired to protect such isolators from metal deposition.

The internal structure of the standoffs is preferably labyrinthine as described in greater detail in copending application Ser. No. 09/515,880, filed Feb. 29, 2000, entitled "COIL AND COIL SUPPORT FOR GENERATING A PLASMA" and assigned to the assignee of the present application. The coil 151 and those portions of the standoffs directly exposed to the plasma are preferably made of the same material which is being deposited. Hence, if the material being deposited is made of tantalum, the outer portions of the standoffs are preferably made of tantalum as well. To facilitate adherence of the deposited material, exposed surfaces of the metal may be treated by bead blasting which will reduce shedding of particles from the deposited material. Besides tantalum, the coil and target may be made from a variety of deposition materials including copper, aluminum, and tungsten. The labyrinth should be dimensioned to inhibit formation of a complete conducting path from the coil to the shield. Such a conducting path could form as conductive deposition material is deposited onto the coil and standoffs. It should be recognized that other dimensions, shapes and numbers of passageways of the labyrinth are possible, depending upon the particular application. Factors affecting the design of the labyrinth include the type of material being deposited and the number of depositions desired before the standoffs need to be cleaned or replaced. A suitable feedthrough standoff may be constructed in a similar manner except that RF power would be applied to a bolt or other conductive member extending through the standoff.

Figure 4:
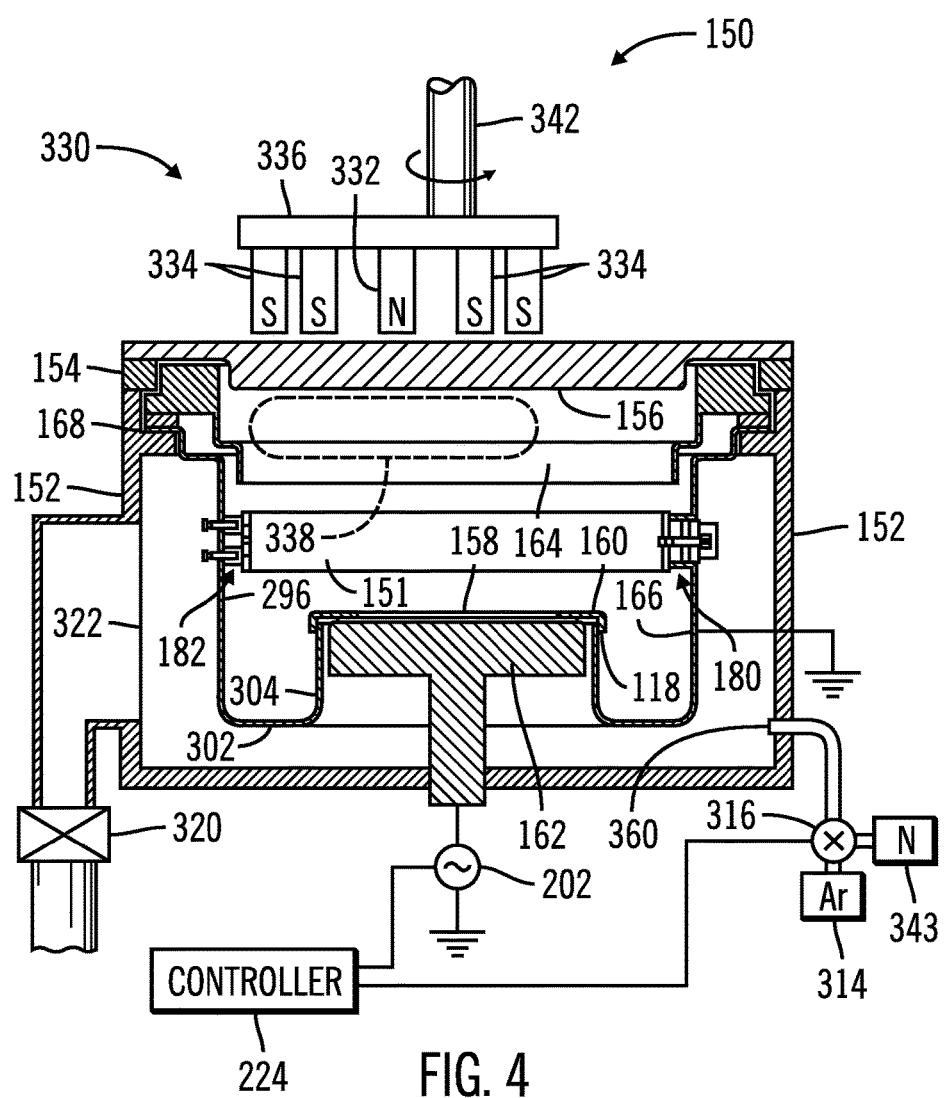
FIG. 4 is a schematic representation of a sputtering chamber usable with an embodiment of the invention.

The coil 151 may have overlapping but spaced ends. In this arrangement, the feedthrough standoffs 182 for each end may be stacked in a direction parallel to the plasma chamber central axis between the vacuum chamber target 156 and the substrate holder 162, as shown in FIG. 4. As a consequence, the RF path from one end of the coil to the other end of the coil can similarly overlap and thus avoid a gap over the wafer. It is believed that such an overlapping arrangement can improve uniformity of plasma generation, ionization and deposition as described in copending application Ser. No. 09/039,695, filed Mar. 16, 1998 and assigned to the assignee of the present application.

The support standoffs 180 may be distributed around the remainder of the coil to provide suitable support. In the illustrated embodiments the coils each have three hub members 504 distributed at 90 degree separations on the outer face of each coil. It should be appreciated that the number and spacing of the standoffs may be varied depending upon the particular application.

The coil 151 of the illustrated embodiments is each made of 2 by ¼ inch heavy duty bead blasted tantalum or copper ribbon formed into a single turn coil. However, other highly conductive materials and shapes may be utilized. For example, the thickness of the coil may be reduced to ¹⁄₁₆ inch and the width Increased to 2 inches. Also, hollow tubing may be utilized, particularly if water cooling is desired.

The appropriate RF generators and matching circuits are components well known to those skilled in the art. For example, an RF generator such as the ENI Genesis series which has the capability to frequency hunt for the best frequency match with the matching circuit and antenna is suitable. The frequency of the generator for generating the RF power to the coil is preferably 2 MHz but it is anticipated that the range can vary at other A.C. frequencies such as, for example, 1 MHz to 200 MHz and non-RF frequencies. These components may be controlled by the programmable controller 224 as well.

Returning to FIG. 4, the lower cylindrical portion 296 of the chamber shield 166 continues downwardly to well in back of the top of the pedestal 182 supporting the wafer 158. The chamber shield 166 then continues radially Inwardly in a bowl portion 302 and vertically upwardly in an innermost cylindrical portion 151 to approximately the elevation of the wafer 158 but spaced radially outside of the pedestal 162.

The shields 164, 166 are typically composed of stainless steel, and their inner sides may be bead blasted or otherwise roughened to promote adhesion of the material sputter deposited on them. At some point during prolonged sputtering, however, the deposited material builds up to a thickness that it is more likely to flake off, producing deleterious particles. Before this point is reached, the shields should be cleaned or more likely replaced with fresh shields. However, the more expensive isolators 154, 168 do not need to be replaced in most maintenance cycles. Furthermore, the maintenance cycle is determined by flaking of the shields, not by electrical shorting of the isolators.

A gas source 314 supplies a sputtering working gas, typically the chemically inactive noble gas argon, to the chamber 152 through a mass flow controller 316. The working gas can be admitted to the top of the chamber or, as illustrated, at its bottom, either with one or more inlet pipes penetrating apertures through the bottom of the shield chamber shield 166 or through a gap 318 between the chamber shield 166, the wafer clamp 160, and the pedestal 162. A vacuum pump system 320 connected to the chamber 152 through a wide pumping port 322 maintains the chamber at a low pressure. Although the base pressure can be held to about $10^{-7}$ Torr or even lower, the pressure of the working gas is typically maintained at between about 1 and 1000 milliTorr in conventional sputtering and to below about 5 milliTorr in SIP sputtering. The computer-based controller 224 controls the reactor including the DC target power supply 200, the bias power supply 202, and the mass flow controller 316.

To provide efficient sputtering, a magnetron 330 is positioned in back of the target 156. It has opposed magnets 332, 334 connected and supported by a magnetic yoke 336. The magnets create a magnetic field adjacent the magnetron 330 within the chamber 152. The magnetic field traps electrons and, for charge neutrality, the ion density also increases to form a high-density plasma region 338. The magnetron 330 is usually rotated about the center 340 of the target 156 by a motor-driven shaft 342 to achieve full coverage in sputtering of the target 156. To achieve a high-density plasma 338 of sufficient ionization density to allow sustained self-sputtering, the power density delivered to the area adjacent the magnetron 330 can be made high. This can be achieved, as described by Fu and Chiang in the above cited patents, by increasing the power level delivered from the DC power supply 200 and by reducing the area of magnetron 330, for example, in the shape of a triangle or a racetrack. A 60 degree triangular magnetron, which is rotated with its tip approximately coincident with the target center 340, covers only about ⅙ of the target at any time. Coverage of ¼ is the preferred maximum in a commercial reactor capable of SIP sputtering.

To decrease the electron loss, the inner magnetic pole represented by the inner magnet 332 and magnetic pole face should have no significant apertures and be surrounded by a continuous outer magnetic pole represented by the outer magnets 334 and pole face. Furthermore, to guide the ionized sputter particles to the wafer 158, the outer pole should produce a much higher magnetic flux than the inner pole. The extending magnetic field lines trap electrons and thus extend the plasma closer to the wafer 158. The ratio of magnetic fluxes should be at least 150% and preferably greater than 200%. Two embodiments of Fu's triangular magnetron have 25 outer magnets and 6 or 10 inner magnets of the same strength but opposite polarity. Although depicted in combination with a planar target surface, it is appreciated that a variety of unbalanced magnetrons may be used with a variety of target shapes to generate self ionized plasmas. The magnets may have shapes other than triangular including circular and other shapes.

When the argon is admitted into the chamber, the DC voltage difference between the target 156 and the chamber shield 166 ignites the argon into a plasma, and the positively charged argon ions are attracted to the negatively charged target 156. The ions strike the target 156 at a substantial energy and cause target atoms or atomic dusters to be sputtered from the target 156. Some of the target particles strike the wafer 158 and are thereby deposited on it, thereby forming a film of the target material. In reactive sputtering of a metallic nitride, nitrogen is additionally admitted into the chamber from a source 343, and it reacts with the sputtered metallic atoms to form a metallic nitride on the wafer 158.

Figure 6:
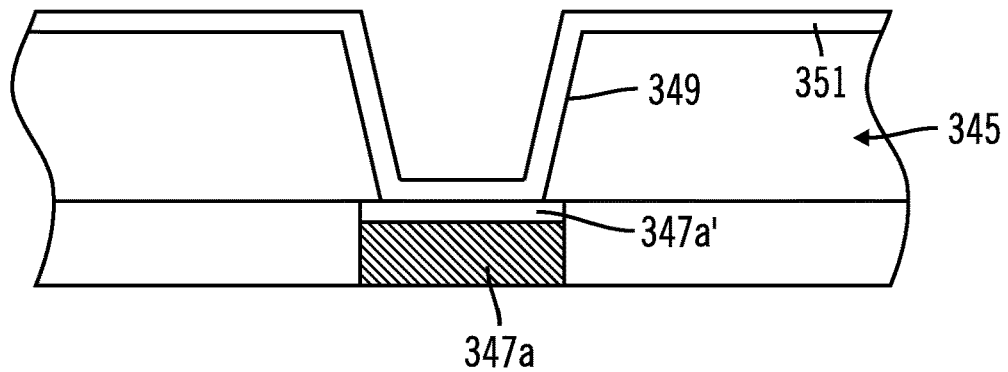
FIGS. 6-9B are cross-sectional views of a via liner and metallization and formation process for a via liner and metallization according to one embodiment of the invention.
Figure 9A:
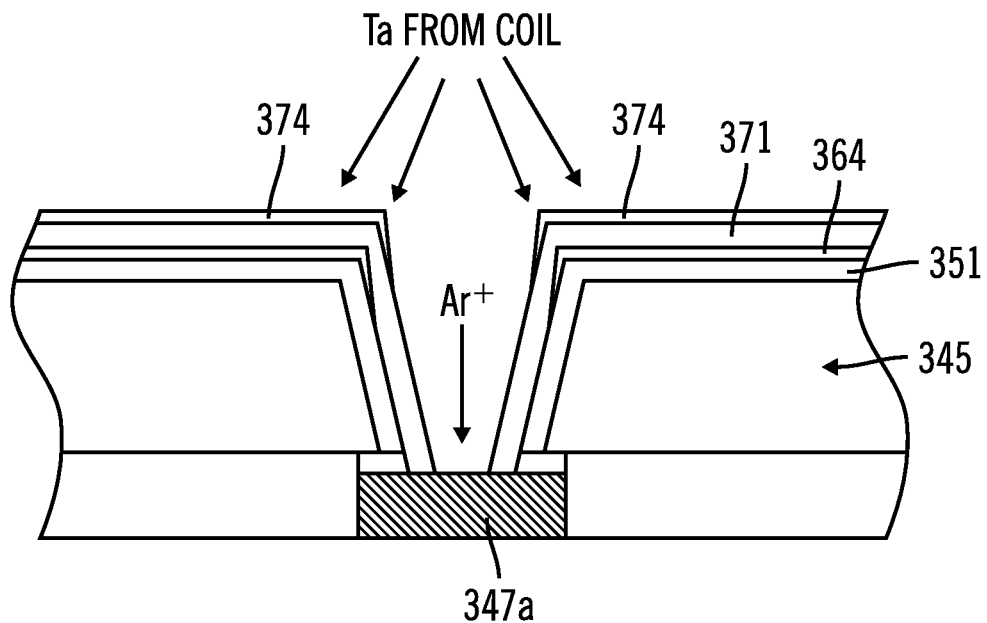
Figure 9B:
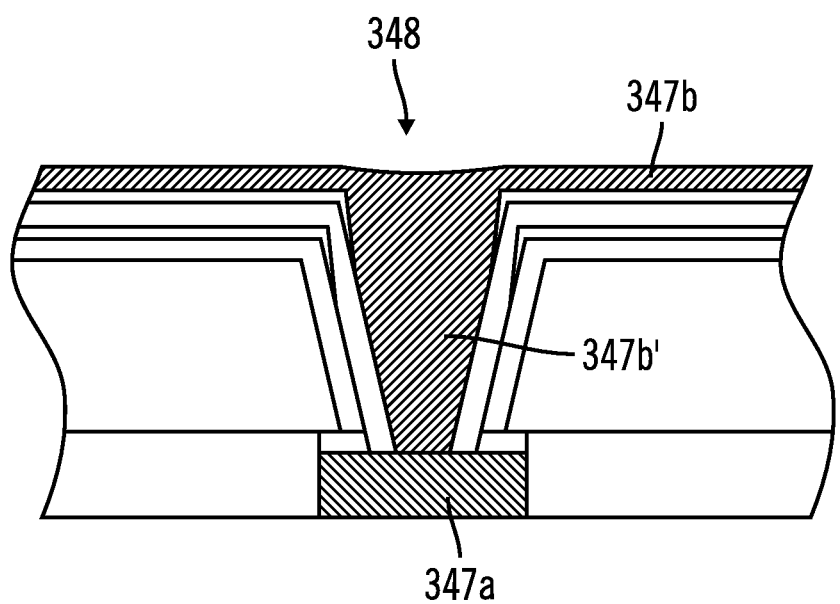

FIGS. 6-9b show sequential cross-sectional views of the formation of liner layers in accordance with a one aspect of the present invention. With reference to FIG. 6, an interlayer dielectric 345 (e.g. silicon dioxide) is deposited over a first metal layer (e.g., a first copper layer 347a) of an interconnect 348 (FIG. 9b). A via 349 then is etched in the interlayer dielectric 345 to expose the first copper layer 347a. The first metal layer may be deposited using CVD, PVD, electroplating or other such well-known metal deposition techniques, and it is connected, via contacts, through a dielectric layer, to devices formed in the underlying semiconductor wafer. If the first copper layer 347a is exposed to oxygen, such as when the wafer is moved from an etching chamber in which the oxide overlaying the first copper layer is etched to create apertures for creation of vias between the first copper layer and a second to be deposited metal layer, it can readily form an insulating/high resistance copper oxide layer 347a' thereon. Accordingly, to reduce the resistance of the copper interconnect 348, any copper oxide layer 347a' and any processing residue within the via 349 may be removed.

A barrier layer 351 may be deposited (e.g., within the sputtering chamber 152 of FIG. 4) over the interlayer dielectric 345 and over the exposed first copper layer 347a prior to removing the copper oxide layer 347a'. The barrier layer 351, preferably comprising tantalum, tantalum nitride, titanium nitride, tungsten or tungsten nitride prevents subsequently deposited copper layers from incorporating in and degrading the interlayer dielectric 345 (as previously described).

If, for example, the sputtering chamber 152 is configured for deposition of tantalum nitride layers, a tantalum target 156 is employed. Typically, both argon and nitrogen gas are flowed into the sputtering chamber 152 through the gas inlet 360 (multiple inlets, one for each gas, may be used), while a power signal is applied to the target 156 via the DC power supply 200. Optionally, a power signal may also be applied to the coil 151 via the first RF power supply 206. During steady state processing, nitrogen may react with the tantalum target 156 to form a nitride film on the tantalum target 156 so that tantalum nitride is sputtered therefrom. Additionally, non-nitrided tantalum atoms are also sputtered from the target, which atoms can combine with nitrogen to form tantalum nitride in flight or on a wafer (not shown) supported by the pedestal 162.

In operation, a throttle valve operatively coupled to the exhaust outlet 362 is placed in a mid-position in order to maintain the deposition chamber 152 at a desired low vacuum level of about $1 \times 10^{-8}$ torr prior to introduction of the process gas(es) into the chamber. To commence processing within the sputtering chamber 152, a mixture of argon and nitrogen gas is flowed into the sputtering chamber 152 via a gas inlet 360. DC power is applied to the tantalum target 156 via the DC power supply 200 (while the gas mixture continues to flow into the sputtering chamber 152 via the gas inlet 360 and is pumped therefrom via the pump 37). The DC power applied to the target 156 causes the argon/nitrogen gas mixture to form an SIP plasma and to generate argon and nitrogen ions which are attracted to, and strike the target 156 causing target material (e.g., tantalum and tantalum nitride) to be ejected therefrom. The ejected target material travels to and deposits on the wafer 158 supported by the pedestal 162. In accordance with the SIP process, the plasma created by the unbalanced magnetron ionizes a portion of the sputtered tantalum and tantalum nitride. By adjusting the RF power signal applied to the substrate support pedestal 162, a negative bias can be created between the substrate support pedestal 162 and the plasma. The negative bias between the substrate support pedestal 162 and the plasma causes tantalum ions, tantalum nitride ions and argon ions to accelerate toward the pedestal 182 and any wafer supported thereon. Accordingly, both neutral and ionized tantalum nitride may be deposited on the wafer, providing good sidewall and upper sidewall coverage in accordance with SIP sputtering. In addition, particularly if RF power is optionally applied to the ICP coil, the wafer may be sputter-etched by the argon ions at the same time the tantalum nitride material from the target 156 deposits on the wafer (i.e. simultaneous deposition/sputter-etching).

Figure 7:
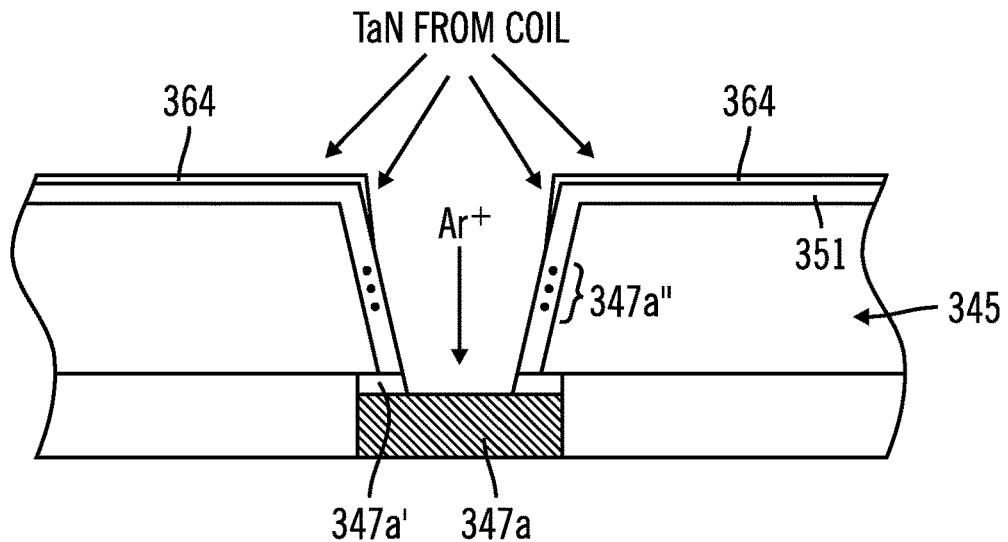
Figure 8:
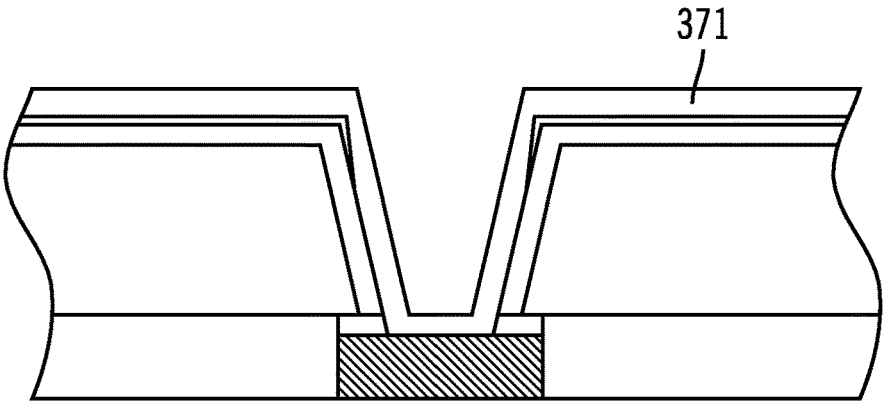

Following deposition of the barrier layer 351, the portion of the barrier layer 351 at the bottom of the via 349, and the copper oxide layer 347a' (and any processing residue) thereunder, may be sputter-etched or resputtered via an argon plasma as shown in FIG. 7, if thinning or elimination of the bottom is desired. The argon plasma is preferably generated in this step primarily by applying RF power to the ICP coil. Note that during sputter-etching within the sputtering chamber 152 (FIG. 4) in this embodiment, the power applied to the target 156 is preferably either removed or is reduced to a low level (e.g., 100 or 200 W) so as to inhibit or prevent significant deposition from the target 156. A low target power level, rather than no target power, can provide a more uniform plasma and is presently preferred.

ICP argon ions are accelerated toward the barrier layer 351 via an electric field (e.g., the RF signal applied to the substrate support pedestal 162 via the second RF power supply 41 of FIG. 4 which causes a negative self bias to form on the pedestal), strike the barrier layer 351, and, due to momentum transfer, sputter the barrier layer material from the base of the via aperture and redistribute it along the portion of the barrier layer 351 that coats the sidewalls of the via 349. The argon ions are attracted to the substrate in a direction substantially perpendicular thereto. As a result, little sputtering of the via sidewall, but substantial sputtering of the via base, occurs. To facilitate resputtering, the bias applied to the pedestal and the wafer may be 400 watts, for example.

The particular values of the resputtering process parameters may vary depending upon the particular application. Copending or issued application Ser. Nos. 08/768,058; 09/126,890; 09/449,202; 09/846,581; 09/490,026; and Ser. No. 09/704,161, describe resputtering processes and are incorporated herein by reference in their entireties.

In accordance with another aspect of the present invention, the ICP coil 151 may be formed of liner material such as tantalum in the same manner as the target 156 and sputtered to deposit tantalum nitride onto the wafer while the via bottoms are resputtered. Because of the relatively low pressure during the resputtering process, the ionization rate of the deposition material sputtered from the coil 151 is relatively low. Hence, the sputtered material deposited onto the wafer is primarily neutral material. In addition, the coil 151 is placed relatively low in the chamber, surrounding and adjacent to the wafer.

Consequently, the trajectory of the material sputtered from the coil 151 tends to have a relatively small angle of incidence. Hence, the sputtered material from the coil 151 tends to deposit in a layer 364 on the upper surface of the wafer and around the openings of the holes or vias in the wafer rather than deep into the wafer holes. This deposited material from the coil 151 may be used to provide a degree of protection from resputtering so that the barrier layer is thinned by resputtering primarily at the bottom of the holes rather than on the sidewalls and around the hole openings where thinning of the barrier layer may not be desired.

Once the barrier layer 351 has been sputter-etched from the via base, the argon ions strike the copper oxide layer 347a', and the oxide layer is sputtered to redistribute the copper oxide layer material from the via base, some or all of the sputtered material being deposited along the portion of the barrier layer 351 that coats the sidewalls of the via 349. Copper atoms 347a", as well, coat the barrier layer 351 and 364 disposed on the sidewalls of the via 349. However, because the originally deposited barrier layer 351 along with that redistributed from the via base to via sidewall is a diffusion barrier to the copper atoms 347a", the copper atoms 347a" are substantially immobile within the barrier layer 351 and are inhibited from reaching the interlayer dielectric 345. The copper atoms 347a" which are deposited onto the sidewall, therefore, generally do not generate via-to-via leakage currents as they would were they redistributed onto an uncoated sidewall.

Thereafter, a second liner layer 371 of a second material such as tantalum may be deposited (FIG. 8) on the previous barrier layer 351 in the same chamber 152 or a similar chamber having both an SIP and ICP capabilities. A tantalum liner layer provides good adhesion between the underlying tantalum nitride barrier layer and a subsequently deposited metal interconnect layer of a conductor such as copper. However, in some applications, it may be preferred to deposit just a barrier layer or just a liner layer prior to a seed layer or filling the hole.

The second liner layer 371 may be deposited in the same manner as the first liner layer 351. That is, the tantalum liner 371 may be deposited in a first SIP step in which the plasma is generated primarily by the target magnetron 330. However, nitrogen is not admitted so that tantalum rather than tantalum nitride is deposited. In accordance with SIP sputtering, good sidewall and upper sidewall coverage may be obtained. RF power to the ICP coil 151 may be reduced or eliminated, if desired.

Following deposition of the tantalum liner layer 371, the portion of the liner layer 371 at the bottom of the via 349 (and any processing residue) thereunder, may be sputter-etched or resputtered via an argon plasma in the same manner as the bottom of the liner layer 351, as shown in FIG. 9a, if thinning or elimination of the bottom is desired. The argon plasma is preferably generated in this step primarily by applying RF power to the ICP coil. Again, note that during sputter-etching within the sputtering chamber 152 (FIG. 4), the power applied to the target 156 is preferably either removed or is reduced to a low level (e.g., 500 W) so as to inhibit or prevent significant deposition from the target 156 during thinning or elimination of the bottom coverage of the second liner layer 371. In addition, the coil 151 is preferably sputtered to deposit liner material 374 while the argon plasma resputters the layer bottom to protect the liner sidewalls and upper portions from being thinned substantially during the bottom portion resputtering.

In the above described embodiment, SIP deposition of target material on the sidewalls of the vias occurs primarily in one step and ICP resputtering of the via bottoms and ICP deposition of coil 151 material occurs primarily in a subsequently step. It is appreciated that deposition of both target material and coil material on the sidewalls of the via 349 can occur simultaneously, if desired. It is further appreciated that ICP sputter-etching of the deposited material at the bottom of the via 349 can occur simultaneously with the deposition of target and coil material on the sidewalls, if desired. Simultaneous deposition/sputter-etching may be performed with the chamber 152 of FIG. 4 by adjusting the power signals applied to the coil 151, the target 156 and the pedestal 162. Because the coil 151 can be used to maintain the plasma, the plasma can sputter a wafer with a low relative bias on the wafer (less than that needed to sustain the plasma). Once the sputtering threshold has been reached, for a particular wafer bias the ratio of the RF power applied to the wire coil 151 ("RF coil power") as compared to the DC power applied to the target 156 ("DC target power") affects the relationship between sputter-etching and deposition. For instance, the higher the RF:DC power ratio the more sputter-etching will occur due to increased ionization and subsequent increased ion bombardment flux to the wafer. Increasing the wafer bias (e.g., increasing the RF power supplied to the support pedestal 162) will increase the energy of the incoming ions which will increase the sputtering yield and the etch rate. For example, increasing the voltage level of the RF signal applied to the pedestal 162 increases the energy of the ions incident on the wafer, while increasing the duty cycle of the RF signal applied to the pedestal 162 increases the number of incident ions.

Therefore, both the voltage level and the duty cycle of the wafer bias can be adjusted to control sputtering rate. In addition, keeping the DC target power low will decrease the amount of barrier material available for deposition. A DC target power of zero will result in sputter-etching only. A low DC target power coupled with a high RF coil power and wafer bias can result in simultaneous via sidewall deposition and via bottom sputtering. Accordingly, the process may be tailored for the material and geometries in question. For a typical 3:1 aspect ratio via on a 200 mm wafer, using tantalum or tantalum nitride as the barrier material, a DC target power of 500 W to 1 kW, at an RF coil power of 2 to 3 kW or greater, with a wafer bias of 250 W to 400 W or greater applied continuously (e.g., 100% duty cycle) can result in barrier deposition on the wafer sidewalls and removal of material from the via bottom. The lower the DC target power, the less material will be deposited on the sidewalls. The higher the DC target power, the more RF coil power and/or wafer bias power is needed to sputter the bottom of the via. A 2 kW RF coil power level on the coil 151 and a 250 W RF wafer power level with 100% duty cycle on the pedestal 162, for example may be used for simultaneous deposition/sputter-etching. It may be desirable to initially (e.g., for several seconds or more depending on the particular geometries/materials in question) apply no wafer bias during simultaneous deposition/sputter-etching to allow sufficient via sidewall coverage to prevent contamination of the sidewalls by material sputter-etched from the via bottom.

For instance, initially applying no wafer bias during simultaneous deposition/sputter-etching of the via 349 can facilitate formation of an initial barrier layer on the sidewalls of the interlayer dielectric 345 that inhibits sputtered copper atoms from contaminating the interlayer dielectric 345 during the remainder of the deposition/sputter-etching operation. Alternatively, deposition/sputter-etching may be performed "sequentially" within the same chamber or by depositing the barrier layer 351 within a first processing chamber and by sputter-etching the barrier layer 351 and copper oxide layer 347a' within a separate, second processing chamber (e.g. a sputter-etching chamber such as Applied Materials' Preclean II chamber).

Following deposition of the second liner layer 371 and thinning of the bottom coverage, a second metal layer 347b is deposited (FIG. 9b) to form the copper interconnect 348. The second copper layer 347b may deposited either as a coating or as a copper plug 347b' as shown in FIG. 9b over the second liner layer 371 and over the portion of the first copper layer 347a exposed at the base of each via. The copper layer 347b may include a copper seed layer. Because the first and second copper layers 347a, 347b are in direct contact, rather than in contact through the barrier layer 351 or the second liner layer 371, the resistance of the copper interconnect 348 can be lower as can via-to-via leakage currents as well. However, it is appreciated that in some applications, it may be desired to leave a coating of the liner layer or the barrier layer or both at the bottom of the via.

If the interconnect is formed of a different conductor metal than the liner layer or layers, the interconnect layer may be deposited in a sputter chamber having a target of the different conductor metal. The sputter chamber may be an SIP type or an ICP type. However, at present deposition of a copper seed layer is preferred in a chamber of the type described below in connection with FIG. 10. The metal interconnect may be deposited by other methods in other types of chambers and apparatus including CVD and electrochemical plating.

Figure 10:
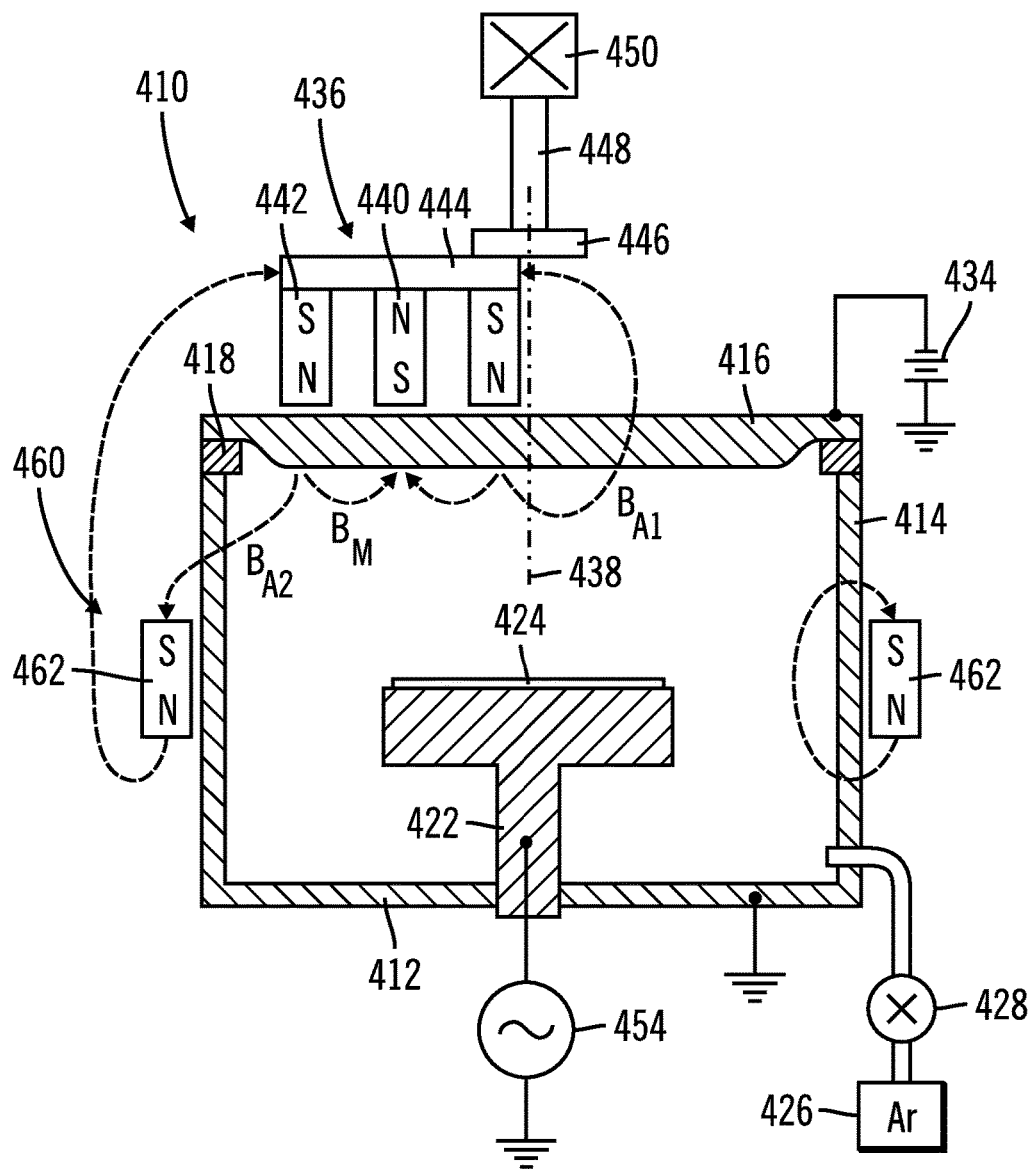
FIG. 10 is a schematic cross-sectional view of a sputter reactor including an auxiliary magnet array of the invention.

A copper seed layer may be deposited by another plasma sputtering reactor 410 as illustrated in the schematic cross-section view of FIG. 10. The reactor 410 and various processes for forming seed and other layers is described in copending application Ser. No. 09/993,543, filed Nov. 14, 2001 which is incorporated herein by reference in its entirety. As described therein, a vacuum chamber 412 includes generally cylindrical sidewalls 414, which are electrically grounded. Typically, unillustrated grounded replaceable shields are located inside the sidewalls 414 to protect them from being sputter coated, but they act as chamber sidewalls except for holding a vacuum. A sputtering target 416 composed of the metal to be sputtered is sealed to the chamber 412 through an electrical isolator 418. A pedestal electrode 422 supports a wafer 424 to be sputter coated in parallel opposition to the target 416. A processing space is defined between the target 416 and the wafer 424 inside of the shields.

A sputtering working gas, preferably argon, is metered into the chamber from a gas supply 426 through a mass flow controller 428. An unillustrated vacuum pumping system maintains the interior of the chamber 412 at a very low base pressure of typically $10^{-8}$ Torr or less. During plasma ignition, the argon pressure is supplied in an amount producing a chamber pressure of approximately 5 milliTorr, but as will be explained later the pressure is thereafter decreased. A DC power supply 434 negatively biases the target 416 to approximately −600 VDC causing the argon working gas to be excited into a plasma containing electrons and positive argon ions. The positive argon ions are attracted to the negatively biased target 416 and sputter metal atoms from the target.

The invention is particularly useful with SIP sputtering in which a small nested magnetron 436 is supported on an unillustrated back plate behind the target 416. The chamber 412 and target 416 are generally circularly symmetric about a central axis 438. The SIP magnetron 436 includes an inner magnet pole 440 of a first vertical magnetic polarity and a surrounding outer magnet pole 442 of the opposed second vertical magnetic polarity. Both poles are supported by and magnetically coupled through a magnetic yoke 444. The yoke 444 is fixed to a rotation arm 446 supported on a rotation shaft 448 extending along the central axis 4438. A motor 450 connected to the shaft 448 causes the magnetron 436 to rotate about the central axis 438.

In an unbalanced magnetron, the outer pole 442 has a total magnetic flux integrated over its area that is larger than that produced by the inner pole 440, preferably having a ratio of the magnetic intensities of at least 150%. The opposed magnetic poles 440, 442 create a magnetic field inside the chamber 412 that is generally semi-toroidal with strong components parallel and close to the face of the target 416 to create a high-density plasma there to thereby increase the sputtering rate and increase the ionization fraction of the sputtered metal atoms. Because the outer pole 442 is magnetically stronger than the inner pole 440, a fraction of the magnetic field from the outer pole 442 projects far towards the pedestal 422 before it loops back to behind the outer pole 442 to complete the magnetic circuit.

An RF power supply 454, for example, having a frequency of 13.56 MHz is connected to the pedestal electrode 422 to create a negative self-bias on the wafer 424. The bias attracts the positively charged metal atoms across the sheath of the adjacent plasma, thereby coating the sides and bottoms of high aspect-ratio holes in the wafer, such as, inter-level vias.

In SIP sputtering, the magnetron is small and has a high magnetic strength and a high amount of DC power is applied to the target so that the plasma density rises to above $10^{10}$ cm$^{-3}$ near the target 416. In the presence of this plasma density, a large number of sputtered atoms are ionized into positively charged metal ions. The metal ion density is high enough that a large number of them are attracted back to the target to sputter yet further metal ions. As a result, the metal ions can at least partially replace the argon ions as the effective working species in the sputtering process. That is, the argon pressure can be reduced. The reduced pressure has the advantage of reducing scattering and deionization of the metal ions. For copper sputtering, under some conditions it is possible in the process called sustained self-sputtering (SSS) to completely eliminate the argon working gas once the plasma has been ignited. For aluminum or tungsten sputtering, SSS is not possible, but the argon pressure can be substantially reduced from the pressures used in conventional sputtering, for example, to less than 1 milliTorr.

In one embodiment of the invention, an auxiliary array 460 of permanent magnets 462 is positioned around the chamber sidewalls 414 and is generally positioned in the half of the processing space towards the wafer 424. In this embodiment, the auxiliary magnets 462 have the same first vertical magnetic polarity as the outer pole 442 of the nested magnetron 436 so as to draw down the unbalanced portion of the magnetic field from the outer pole 442. In the embodiment described in detail below, there are eight permanent magnets, but any number of four or more distributed around the central axis 438 would provide similarly good results. It is possible to place the auxiliary magnets 462 inside the chamber sidewalls 414 but preferably outside the thin sidewall shield to increase their effective strength in the processing region. However, placement outside the sidewalls 414 is preferred for overall processing results.

Figure 11:
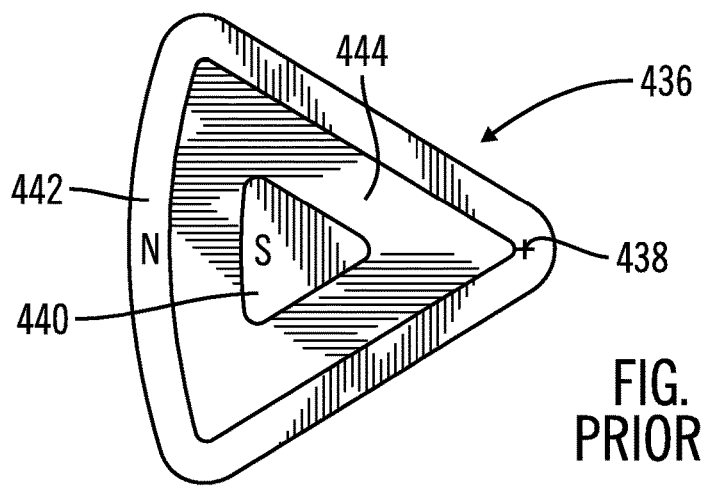
FIG. 11 is bottom plan view of the top magnetron in the sputter reactor of FIG. 10.

The auxiliary magnet array is generally symmetrically disposed about the central axis 438 to produce a circularly symmetric magnetic field. On the other hand, the nested magnetron 436 has a magnetic field distribution is asymmetrically disposed about the central axis 438 although, when it is averaged over the rotation time, it becomes symmetric. There are many forms of the nested magnetron 436. The simplest though less preferred form has a button center pole 440 surround by an circularly annular outer pole 442 such that its field is symmetric about an axis displaced from the chamber axis 438 and the nested magnetron axis is rotated about the chamber axis 438. The preferred nested magnetron has a triangular shape, illustrated in the bottom plan view of FIG. 11, with an apex near the central axis 438 and a base near the periphery of the target 416. This shape is particularly advantageous because the time average of the magnetic field is more uniform than for a circular nested magnetron.

The effective magnetic field at a particular instant of time during the rotation cycle is shown by the dotted lines of FIG. 10. A semi-toroidal field $B_M$ provides a strong horizontal component close to and parallel to the face of the target 416, thereby increasing the density of the plasma, the rate of sputtering, and the ionization fraction of sputtered particles. An auxiliary field $B_{A1}$, $B_{A2}$ is the sum of the field from the auxiliary magnet array 460 and from the unbalanced portion of the field of the nested magnetron 436. On the side of the chamber away from the nested magnetron 436, the component $B_{A1}$ from the unbalanced portion of the field of the nested magnetron 436 predominates, and it does not extend far towards the wafer 424. However, near the chamber sidewall 414 on the side of the nested magnetron 436, the auxiliary magnet 462 is strongly coupled to the outer magnet pole 442, resulting in a magnetic field component $B_{A2}$ that projects far towards the wafer 424. Out of the plane of the illustration, the magnetic field component is an combination of the two components $B_{A1}$, $B_{A2}$.

This structure effects the result that a strong vertical magnetic field is produced near to and along a substantial length of the chamber sidewall 414 in a region beneath the nested magnetron 436 sweeping about it because of the alignment of the magnetic polarities of the auxiliary magnets 442 and the strong outer magnetic poles 442. As a result, there is a strong vertical magnetic field on the exterior side of the chamber 412 adjacent the area of the target 416 being most strongly sputtered. This projecting field is effective for both extending the region of the plasma and for guiding the ionized particles to the wafer 424.

Figure 12:
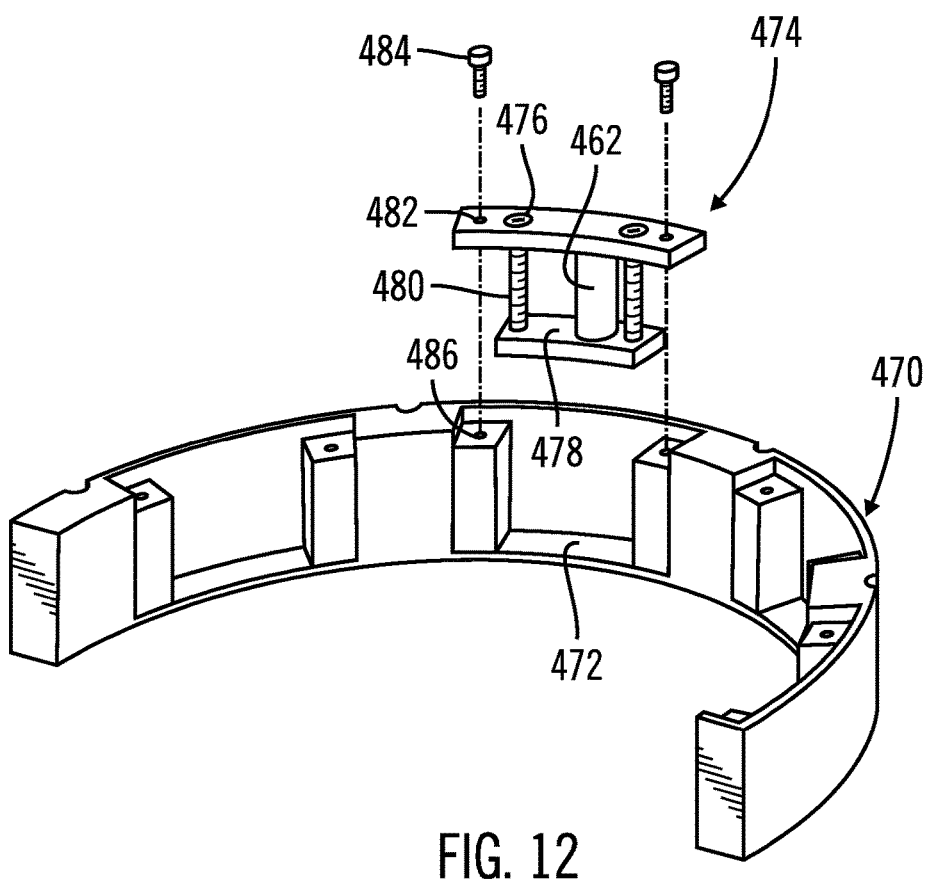
FIG. 12 is an orthographic view of an embodiment of an assembly supporting an auxiliary magnet array.

The auxiliary magnet array 460 may be implemented by the use of two semi-circular magnet carriers 470, one of which is Illustrated orthographically in FIG. 12. Each carrier 470 includes four recesses 472 facing its interior and sized to receive a respective magnet assembly 474 including one magnet 462. The magnet assembly 474 includes an arc-shaped upper clamp member 476 and a lower clamp member 478, which capture the cylindrically shaped magnet 462 into recesses when two screws 480 tighten the two clamp members 476, 478 together. The carriers 470 and clamp members 476, 478 may be formed of non-magnetic material such as aluminum. The lower clamp member 478 has a length to fit into the recess 472 but the upper clamp member 476 has end portions extending beyond the recess 472 and through which are drilled two through holes 482. Two screws 484 pass through respective through holes to allow the screws 484 to be fixed in tapped holes 486 in the magnet carrier 470, thereby fixing the magnet 462 in position on the magnet carrier 470. Two so assembled semi-circular magnet carrier 470 are placed in a ring around the chamber wall 414 and fixed to it by conventional fastening means. This structure places the magnets 462 directly adjacent the exterior of the chamber wall 414.

Figure 13:
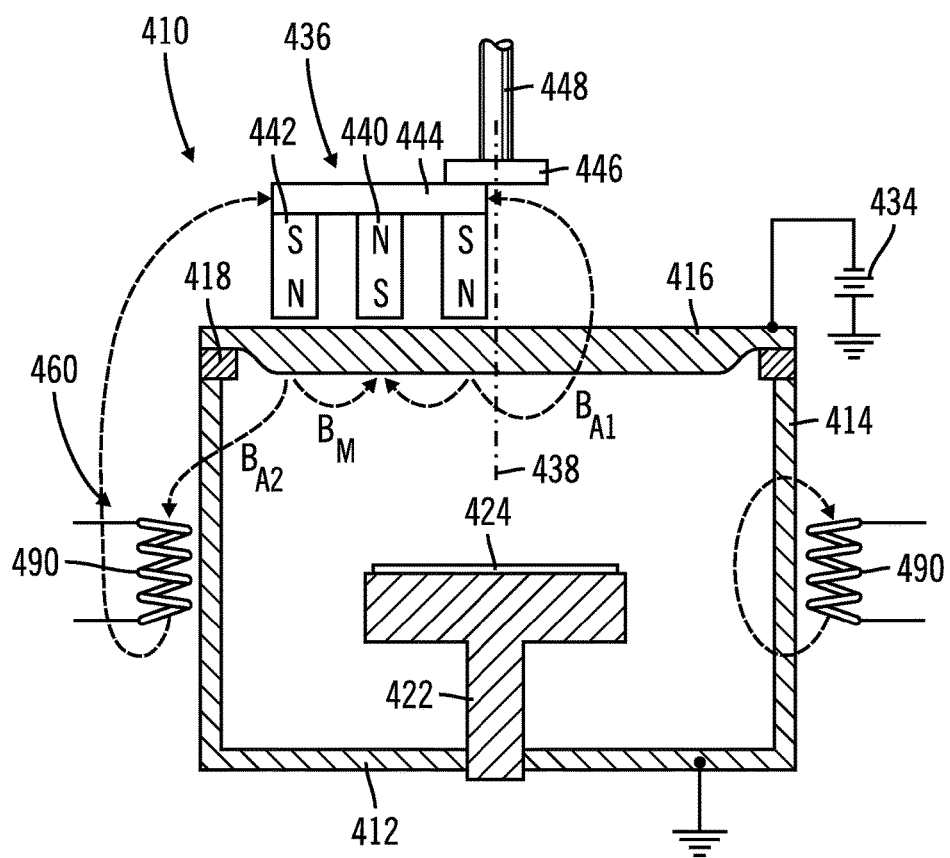
FIG. 13 is a schematic cross-sectional view of a sputter reactor in which the auxiliary magnet array includes an array of electromagnets.

The solenoidal magnetic field created inside the electromagnetic coil of Wei Wang is substantially more uniform across the diameter of the reactor chamber than is the peripheral dipole magnetic field created by an annular array of permanent magnets. However, it is possible to create a similarly shaped dipole field by replacing the permanent magnets 462 with, as illustrated in the cross-sectional view of FIG. 13, an annular array of electromagnetic coils 490 arranged around the periphery of the chamber wall. The coils 490 are typically wrapped as helices about respective axes parallel to the central axis 438 and are electrically powered to produce nearly identical magnetic dipole fields inside the chamber. Such a design has the advantage of allowing the quick adjustment of the auxiliary magnetic field strength and even the polarity of the field.

This invention has been applied to SIP sputtering of copper. While a conventional SIP reactor sputters a copper film having a non-uniformity of 9% determined by sheet resistance measurements, it is believed that the auxiliary magnetron can be optimized to produce a non-uniformity of only 1% in some embodiments. The improvement in uniformity may be accompanied by a reduced deposition rate in some applications, for the deposition of thin copper seed layers in deep holes, which may be desirable for improved process control in some applications.

Although the invention has been described for use in an SIP sputter reactor, the auxiliary permanent magnet array can be advantageously applied to other target and power configurations such as the annularly vaulted target of the SIP reactor of U.S. Pat. No. 6,251,242, the hollow cathode target of U.S. Pat. No. 8,179,973 or "Ionized Physical-vapor deposition Using a Hollow-cathode Magnetron Source for Advanced Metallization" by Klawuhn et al, *J. Vac. Sci Technology*, July/August 2000, the inductively coupled IMP reactor of U.S. Pat. No. 6,045,547 or a self ion sputtering (SIS) system which controls ion flux to a substrate using an ion reflector as described, for example, in "Cu Dual Damascene Process for 0.13 micrometer Technology Generation using Self Ion Sputtering (SIS) with Ion Reflector" by Wada et al., IEEE, 2000. Other magnetron configurations may be used, such as balanced magnetrons and stationary ones. Further, the polarity of the auxiliary magnets may be parallel or anti-parallel to the magnetic polarity of the outer pole of the top magnetron. Other materials may be sputtered including Al, Ta, Ti, Co, W etc. and the nitrides of several of these which are refractory metals.

The auxiliary magnet array thus provides additional control of the magnetic field useful in magnetron sputtering. However, to achieve deeper hole coating with a partially neutral flux, it is desirable to increase the distance between the target 416 and the wafer 424, that is, to operate in the long-throw mode. As discussed above in connection with the chamber of FIG. 4, in long-throw, the target-to-substrate spacing is typically greater than half the substrate diameter. When used in SIP copper seed deposition, it is preferably greater than 140% wafer diameter (e.g. 290 mm spacing) for a 200 mm wafer and greater than 130% (e.g. 400 mm spacing) for a 300 mm wafer, but spacings greater than 80% including greater than 90% and greater than 100% of the substrate diameter are believed appropriate also. For many applications, it is believed that a target to wafer spacing of 50 to 1000 mm will be appropriate. Long throw in conventional sputtering reduces the sputtering deposition rate, but ionized sputter particles do not suffer such a large decrease.

Figure 14A:
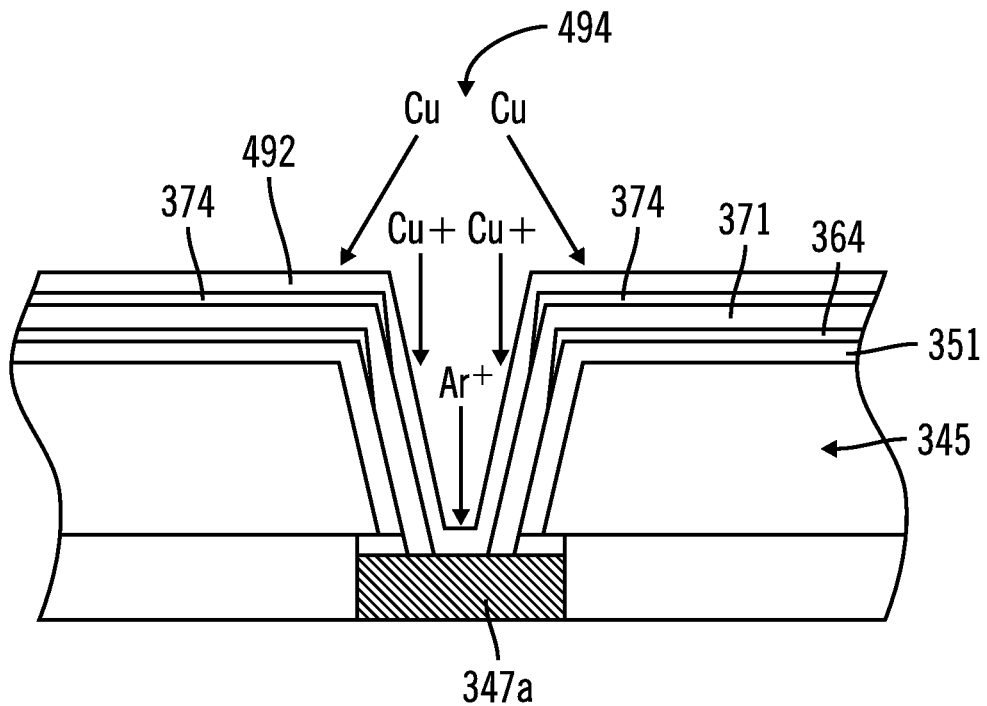
FIGS. 14A and 14B are cross-sectional views of a via seed layer and via seed layer formation process according to one embodiment of the invention.

One embodiment of a structure which can be produced by the chamber of FIG. 4 and the chamber of FIG. 10 is a via illustrated in cross-section in FIG. 14a. A seed copper layer 492 is deposited by the chamber of FIG. 10 in the via hole 494 over the liner layers formed in the chamber of FIG. 4, which may include one or more barrier and liner layers such as the aforementioned TaN barrier 351, 364 and Ta liner layers 371, 374 under conditions promoting SIP and ICP. The SIP copper layer 492 may be deposited, for example, to a blanket thickness of 50 to 300 nm or more preferably of 80 to 200 nm. The SIP copper seed layer 492 preferably has a thickness in the range of 2 to 20 nm on the via sidewalls, more preferably 7 to 15 nm. In view of the narrow holes, the a sidewall thickness in excess of 50 nm may not be optimal for some applications. The quality of the film can in some applications be improved by decreasing the pedestal temperature to less than 0 degrees C. and preferably to less than −40 degrees C. In such applications quick SIP deposition is advantageous.

If, for example, the sputtering chamber 410 is configured for deposition of copper layers, a copper target 416 is employed. In operation, a throttle valve operatively coupled to the chamber exhaust outlet is placed in a mid-position in order to maintain the deposition chamber 410 at a desired low vacuum level of about $1 \times 10^{-8}$ torr prior to introduction of the process gas(es) into the chamber. To commence processing within the sputtering chamber 410, argon gas is flowed into the sputtering chamber 410 via a gas inlet 428. For deposition of copper seed in a long throw SIP chamber, a very low pressure is preferred, such as 0-2 mTorr. In the illustrated embodiment, a pressure of 0.2 mTorr is suitable. DC power is applied to the copper target 416 via the DC power supply 434 (while the gas mixture continues to flow into the sputtering chamber 410 via the gas inlet 360 and is pumped therefrom via a suitable pump). The power applied to the target 416 may range for a copper target in a range of 20-60 kWatts for a 200 mm wafer. In one example, the power supply 434 can apply 38 kWatts to the copper target 416 at a voltage of −600 VDC. For larger wafers such as 300 mm wafers, it is anticipated that larger values such as 56 kWatts may be appropriate. Other values may also be used, depending upon the particular application.

The DC power applied to the target 416 causes the argon to form an SIP plasma and to generate argon ions which are attracted to and strike the target 416 causing target material (e.g., copper) to be ejected therefrom. The ejected target material travels to and deposits on the wafer 424 supported by the pedestal 422. In accordance with the SIP process, the plasma created by the unbalanced magnetron ionizes a portion of the sputtered copper. By adjusting the RF power signal applied to the substrate support pedestal 422, a negative bias can be created between the substrate support pedestal 422 and the plasma.

The power applied to the pedestal 422 may range for copper seed deposition in a range of 0-1200 watts. In one example, the RF power supply 454 can apply 300 watts to the pedestal 422 for a 200 mm wafer. For larger wafers such as 300 mm wafers, it is anticipated that larger values may be appropriate. Other values may also be used, depending upon the particular application.

The negative bias between the substrate support pedestal 422 and the plasma causes copper ions and argon ions to accelerate toward the pedestal 422 and any wafer supported thereon. Accordingly, both neutral and ionized copper may be deposited on the wafer, providing good bottom, sidewall and upper sidewall coverage in accordance with SIP sputtering. In addition, the wafer may be sputter-etched by the argon ions at the same time the copper material from the target 416 deposits on the wafer (i.e., simultaneous deposition/sputter-etching).

Figure 14B:
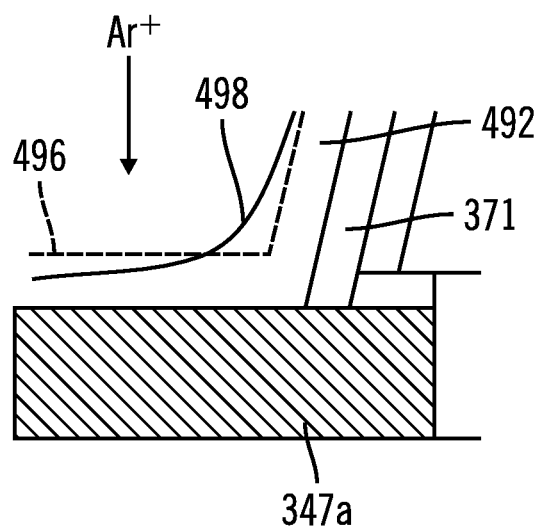

Following or during deposition of the seed layer 492, the portion of the seed layer 492 at the bottom 496 of the via 494 may be sputter-etched or resputtered via an argon plasma as shown in FIG. 14B, if redistribution of the bottom is desired. The bottom 496 may be redistributed to increase coverage thickness of the bottom corner areas 498 of the copper seed layer as shown in FIG. 14B. In many applications, it is preferred that the copper seed layer bottom 496 not be completely removed to provide adequate seed layer coverage throughout the via.

The argon plasma is preferably generated in this resputtering step as SIP plasma by applying power to the target and to the pedestal. SIP argon ions are accelerated toward the seed layer 492 via an electric field (e.g., the RF signal applied to the substrate support pedestal 422 via the second RF power supply 454 of FIG. 10 which causes a negative self bias to form on the pedestal), strike the seed layer 492, and, due to momentum transfer, sputter the seed layer material from the base of the via aperture and redistribute it along the portion 498 of the seed layer 492 that coats the bottom corners of the via 349.

The argon ions are attracted to the substrate in a direction substantially perpendicular thereto. As a result, little sputtering of the via sidewall, but substantial sputtering of the via base, occurs. Note that during resputtering of the copper seed layer within the sputtering chamber 410 (FIG. 10) in this embodiment, the power applied to the pedestal 422 may be increased to a higher value, such as 600-1200 watts, or 900 watts, for example, to facilitate redistribution of the copper seed layer bottom. Thus, in this example, the pedestal power is raised from a level below 600 watts (e.g. 300 watts) to a level greater than 600 watts (e.g. 900 watts) to enhance the redistribution effect of the resputtering.

In another example, the power applied to the target 416 may be reduced to a lower value, such as below 30 kWatts or 28 kWatts, for example, so as to inhibit deposition from the target 416 to facilitate redistribution of the copper seed layer bottom. A low target power level, rather than no target power, can provide a more uniform plasma and is presently preferred in those embodiments in which target power is reduced for seed layer bottom redistribution. Thus, in this example, the target power is lowered from a level above 30000 (e.g. 38 kwatts) to a level lower than 30000 watts, (e.g. 28 kWatts) to enhance resputtering.

In yet another example, the resputtering of the copper seed layer bottom may be performed simultaneously throughout the copper seed layer deposition such that the target and pedestal power levels may be maintained relatively constant (such as 38 kWatts and 300 watts, respectively) during the seed layer deposition. In other embodiments, target power reductions may be alternated or combined with pedestal power increases to facilitate seed layer bottom redistribution.

The particular values of the resputtering process parameters may vary depending upon the particular application. Copending or issued application Ser. Nos. 08/768,058; 09/126,890; 09/449,202; 09/846,581; 09/490,026; and Ser. No. 09/704,161, describe resputtering processes and are incorporated herein by reference in their entireties.

The SIP copper seed layer 492 has good bottom and sidewall coverage and enhanced bottom corner coverage. After the copper seed layer 492 is deposited, the hole is filled with a copper layer 18, as in FIG. 1, preferably by electrochemical plating using the seed layer 492 as one of the electroplating electrodes. Alternatively, the smooth structure of the SIP copper seed layer 492 also promotes reflow or higher-temperature deposition of copper by standard sputtering or physical vapor deposition (PVD).

The chambers of FIGS. 4 and 10 utilize both ionized and neutral atomic flux. As described in U.S. Pat. No. 6,398,929 which is incorporated herein by reference in its entirety, the distribution between ionized and neutral atomic flux in a DC magnetron sputtering reactor can be tailored to produce an advantageous layer in a hole in a dielectric layer. Such a layer can be used either by itself or in combination with a copper seed layer deposited by chemical vapor deposition (CVD) over a sputtered copper nucleation layer. A copper liner layer is particularly useful as a thin seed layer for electroplated copper.

The DC magnetron sputtering reactors of the prior art have been directed to either conventional, working gas sputtering or to sustained self-sputtering. The two approaches emphasize different types of sputtering. It is, on the other hand, preferred that the reactor for the copper liner combine various aspects of the prior art to control the distribution between ionized copper atoms and neutrals. An example of such a reactor 550 is illustrated in the schematic cross-sectional view of FIG. 15. The reactors of FIGS. 4, 10 and 13 may utilize these aspects of the reactor of FIG. 15 which is also based on a modification of the Endura PVD Reactor available from Applied Materials, Inc. of Santa Clara, Calif. The reactor 550 includes a vacuum chamber 552, usually of metal and electrically grounded, sealed through a target isolator 554 to a PVD target 556 having at least a surface portion composed of the material, in this case copper or a copper alloy, to be sputter deposited on a wafer 558. The alloying element is typically present to less than 5 wt %, and essentially pure copper may be used if adequate barriers are otherwise formed. A wafer clamp 560 holds the wafer 558 on a pedestal electrode 562. Unillustrated resistive heaters, refrigerant channels, and thermal transfer gas cavity in the pedestal 562 allow the temperature of the pedestal to be controlled to temperatures of less than −40 degrees C. to thereby allow the wafer temperature to be similarly controlled.

A floating shield 564 and a grounded shield 566 separated by a second dielectric shield isolator 568 are held within the chamber 552 to protect the chamber wall 552 from the sputtered material. The grounded shield 566 also acts as the anode grounding plane in opposition to the cathode target 556, thereby capacitively supporting a plasma. Some electrons deposit on the floating shield 564 so that a negative charge builds up there. The negative potential not only repels further electrons from being deposited, but also confines the electrons in the main plasma area, thus reducing the electron loss, sustaining low-pressure sputtering, and increasing the plasma density.

Figure 16:
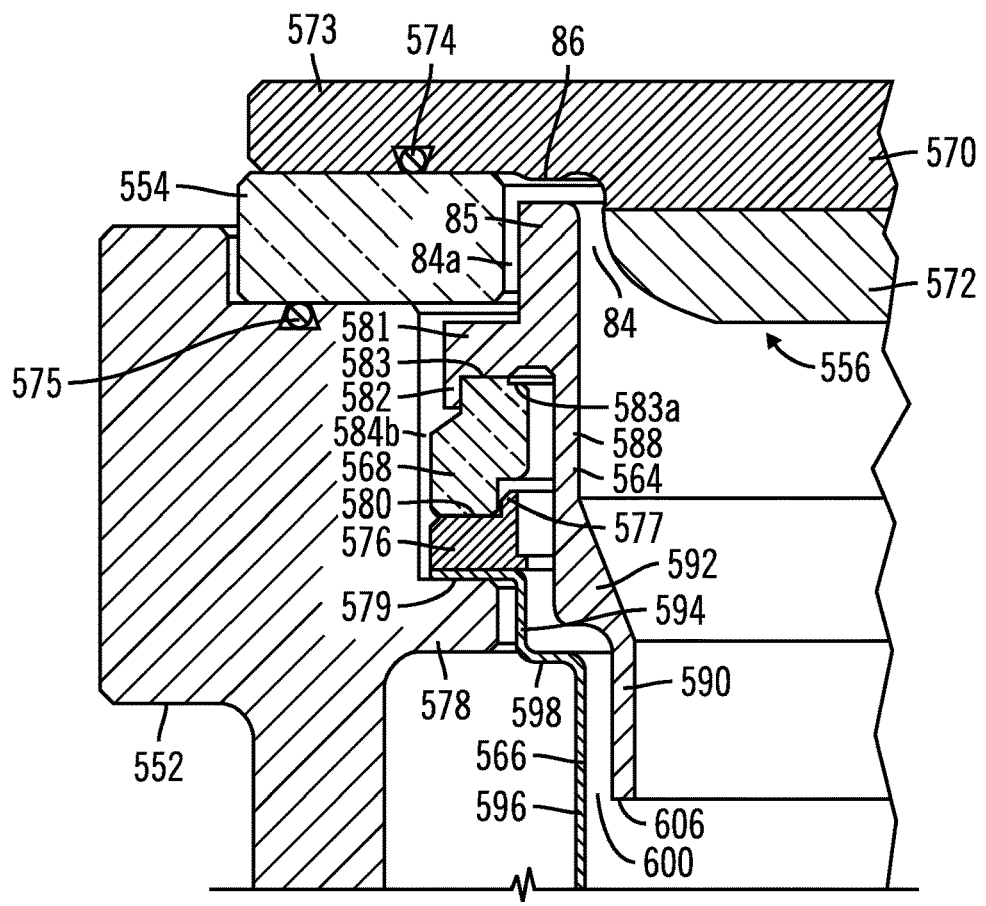
FIG. 16 is an exploded view of a portion of FIG. 15 detailing the target, shields, isolators and target O-ring.

Details of the target and shields are illustrated in the exploded cross-sectional view of FIG. 16. The target 556 includes an aluminum or titanium backing plate 570 to which is soldered or diffusion bonded a copper target portion 572. A flange 573 of the backing plate 570 rests on and is vacuum sealed through a polymeric target O-ring 574 to the target isolator 554, which is preferably composed of a ceramic such as alumina. The target Isolator 554 rests on and is vacuum sealed through an adaptor O-ring 575 to the chamber 552, which in fact may be an aluminum adaptor sealed to the main chamber body. A metal clamp ring 576 has on its inner radial side an upwardly extending annular rim 577. Unillustrated bolts fix the metal clamp ring 576 to an inwardly extending ledge 578 of the chamber 552 and capture a flange 579 of the grounded shield 566. Thereby, the grounded shield 566 is mechanically and electrically connected to the grounded chamber 552.

The shield isolator 568 freely rests on the clamp ring 576 and may be machined from a ceramic material such as alumina. It is compact but has a relatively large height of approximately 165 mm compared to a smaller width to provide strength during the temperature cycling of the reactor. The lower portion of the shield isolator 568 has an inner annular recess fitting outside of the rim 577 of the clamp ring 576. The rim 577 not only acts to center Inner diameter of the shield isolator 568 with respect to the clamp ring 576 but also acts as a barrier against any particles generated at the sliding surface 580 between the ceramic shield isolator 568 and the metal ring clamp 576 from reaching the main processing area.

A flange 581 of the floating shield 564 freely rests on the shield isolator 568 and has a tab or rim 582 on its outside extending downwardly into an annular recess formed at the upper outer corner of the shield isolator 568. Thereby, the tab 582 centers the floating shield 564 with respect to the target 556 at the outer diameter of the shield isolator 568. The shield tab 582 is separated from the shield isolator 568 by a narrow gap which is sufficiently small to align the plasma dark spaces but sufficiently large to prevent jamming of the shield isolator 568, and the floating shield 581 rests on the shield isolator 568 in a sliding contact area 583 inside and above the tab 582.

A narrow channel 584 is formed between a head 585 of the floating shield 564 and the target 556. It has a width of about 2 mm to act as a plasma dark space. The narrow channel 584 continues in a path extending even more radially inward than illustrated past a downwardly projecting ridge 586 of the backing plate flange 574 to an upper back gap 584a between the shield head 585 and the target isolator 554. The structure of these elements and their properties are similar to those disclosed by Tang at al, in U.S. patent application Ser. No. 09/191,253, filed Oct. 30, 1998. The upper back gap 584a has a width of about 1.5 mm at room temperature. When the shield elements are temperature cycled, they tend to deform. The upper back gap 584a, having a smaller width than the narrow channel 584 next to the target 556, is sufficient to maintain a plasma dark space in the narrow channel 584. The back gap 584a continues downwardly into a lower back gap 584b between the shield isolator 568 and the ring clamp 576 on the inside and the chamber body 552 on the outside. The lower back gap 584b serves as a cavity to collect ceramic particles generated at the sliding surfaces 580, 583 between the ceramic shield isolator 568 and the clamp ring 576 and the floating shield 564. The shield isolator 568 additionally includes a shallow recess 583a on its upper inner corner to collect ceramic particles from the sliding surface 583 on its radially inward side.

The floating shield 564 includes a downwardly extending, wide upper cylindrical portion 588 extending downwardly from the flange 581 and connected on its lower end to a narrower lower cylindrical portion 590 through a transition portion 592. Similarly, the grounded shield 566 has an wider upper cylindrical portion 594 outside of and thus wider than the upper cylindrical portion 588 of the floating shield 564. The grounded upper cylindrical portion 594 is connected on its upper end to the grounded shield flange 580 and on its lower end to a narrowed lower cylindrical portion 596 through a transition portion 598 that approximately extends radially of the chamber. The grounded lower cylindrical portion 596 fits outside of and is thus wider than the floating lower cylindrical portion 590; but it is smaller than the floating upper cylindrical portion 564 by a radial separation of about 3 mm. The two transition portions 592, 598 are both vertically and horizontally offset. A labyrinthine narrow channel 600 is thereby formed between the floating and grounded shields 564, 566 with the offset between the grounded lower cylindrical portion 596 and floating upper cylindrical portion 564 assuring no direct line of sight between the two vertical channel portions. A purpose of the channel 600 is to electrically isolate the two shields 564, 566 while protecting the clamp ring 576 and the shield isolator 568 from copper deposition.

The lower portion of the channel 600 between the lower cylindrical portions 590, 596 of the shields 564, 566 has an aspect ratio of 4:1 or greater, preferably 8:1 or greater. The lower portion of the channel 600 has an exemplary width of 0.25 cm and length of 2.5 cm, with preferred ranges being 0.25 to 0.3 cm and 2 to 3 cm. Thereby, any copper ions and scattered copper atoms penetrating the channel 600 are likely to have to bounce several times from the shields and at least stopped by the upper grounded cylindrical portion 594 before they can find their way further toward the clamp ring 576 and the shield isolator 568. Any one bounce is likely to result in the ion being absorbed by the shield. The two adjacent 90 degrees turns or bends in the channel 600 between the two transition portions 592, 598 further isolate the shield isolator 568 from the copper plasma. A similar but reduced effect could be achieved with 60 degrees bends or even 45 degrees bends but the more effective 90 degrees bends are easier to form in the shield material. The 90 degrees turns are much more effective because they increase the probability that copper particles coming from any direction will have at least one high angle hit and thereby lose most their energy to be stopped by the upper grounded cylindrical portion 594. The 90 degrees turns also shadow the clamp ring 576 and shield isolator 568 from being directly irradiated by copper particles. It has been found that copper preferentially deposits on the horizontal surface at the bottom of the floating transition portion 592 and on the vertical upper grounded cylindrical portion 594, both at the end of one of the 90 degrees turns. Also, the convolute channel 600 collects ceramic particles generated from the shield isolator 568 during processing on the horizontal transition portion 598 of the grounded shield 566. It is likely that such collected particles are pasted by copper also collected there.

Figure 15:
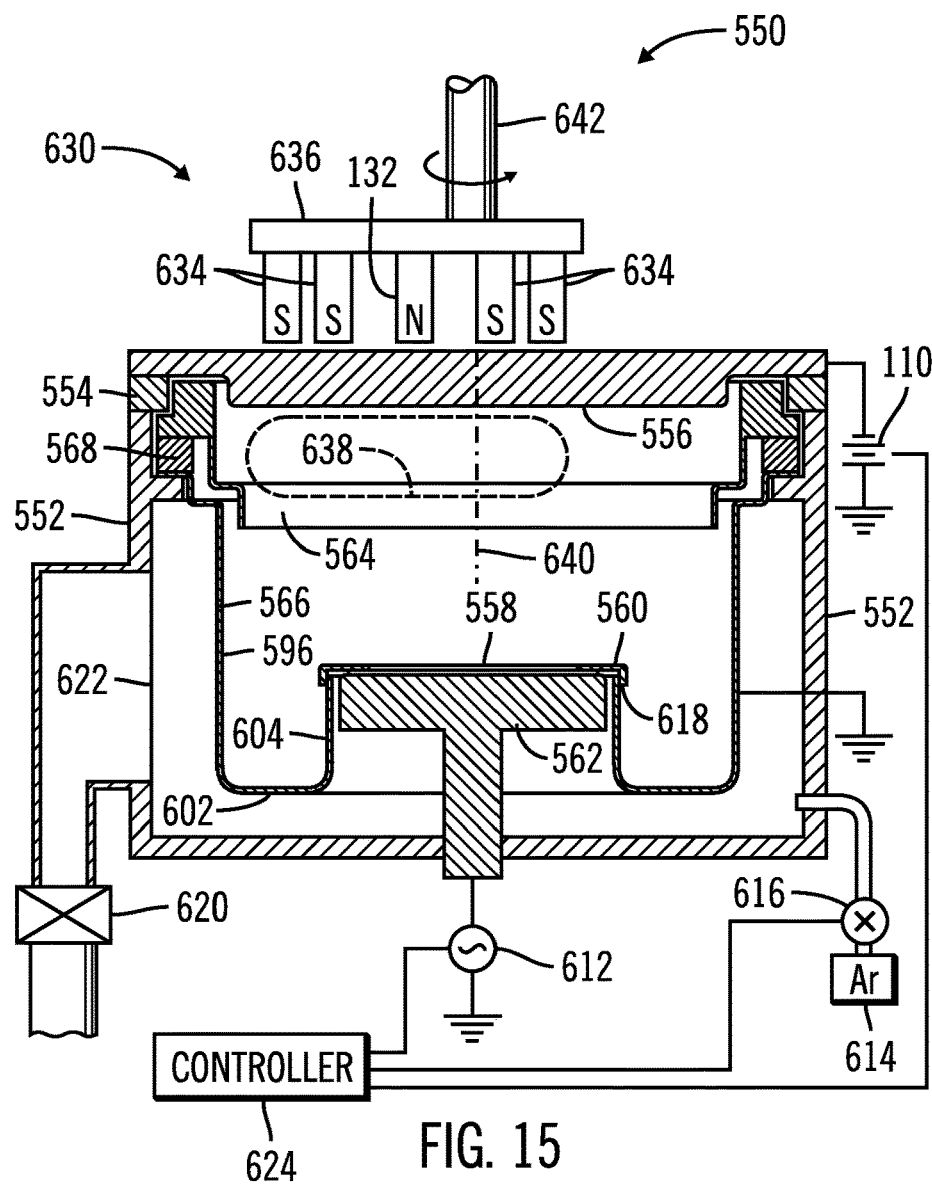
FIG. 15 is a schematic representation of another sputtering chamber usable with the invention.

Returning to the large view of FIG. 15, the lower cylindrical portion 596 of the grounded shield 566 continues downwardly to well in back of the top of the pedestal 562 supporting the wafer 558. The grounded shield 566 then continues radially inwardly in a bowl portion 602 and vertically upwardly in an innermost cylindrical portion 604 to approximately the elevation of the wafer 558 but spaced radially outside of the pedestal 562.

The shields 564, 568 are typically composed of stainless steel, and their inner sides may be bead blasted or otherwise roughened to promote adhesion of the copper sputter deposited on them. At some point during prolonged sputtering, however, the copper builds up to a thickness that it is likely to flake off, producing deleterious particles. Before this point is reached, the shields should be cleaned or more likely replaced with fresh shields. However, the more expensive isolators 554. 568 do not need to be replaced in most maintenance cycles. Furthermore, the maintenance cycle is determined by flaking of the shields, not by electrical shorting of the isolators.

Figure 17:
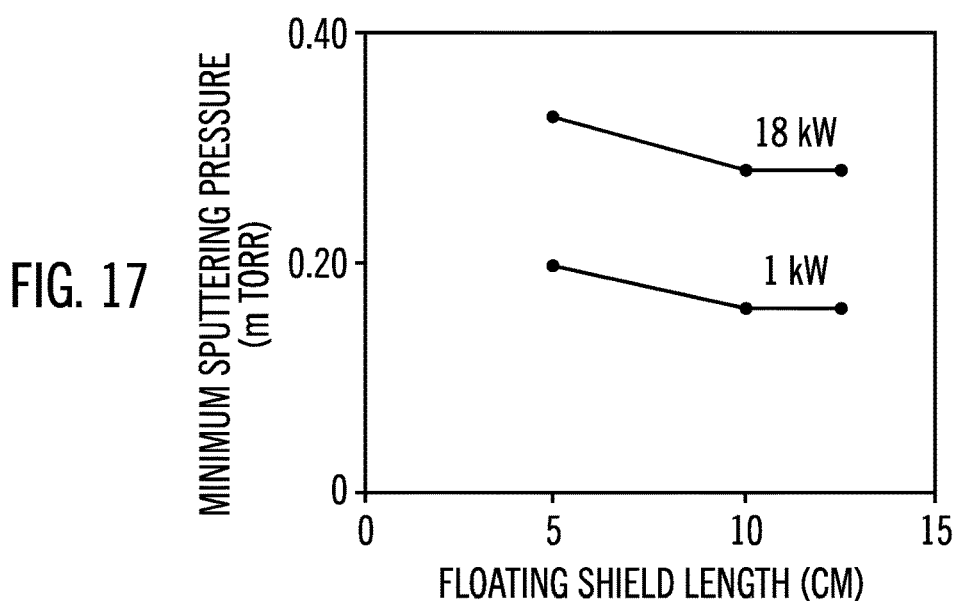
FIG. 17 is a graph illustrating the relationship between the length of the floating shield and the minimum pressure for supporting a plasma.

As mentioned, the floating shield 564 accumulates some electron charge and builds up a negative potential. Thereby, it repels further electron loss to the floating shield 564 and thus confines the plasma nearer the target 556. Ding et al. have disclosed a similar effect with a somewhat similar structure in U.S. Pat. No. 5,736,021. However, the floating shield 564 of FIG. 16 has its lower cylindrical portion 590 extending much further away from the target 556 than does the corresponding part of Ding et al. thereby confining the plasma over a larger volume. However, the floating shield 564 electrically shields the grounded shield 566 from the target 556 so that is should not extend too far away from the target 556. If it is too long, it becomes difficult to strike the plasma; but, if it is too short, electron loss is increased so that the plasma cannot be sustained at lower pressure and the plasma density falls. An optimum length has been found at which the bottom tip 606 of the floating shield 566, as shown in FIG. 16, is separated 6 cm from the face of the target 556 with a total axial length of the floating shield 566 being 7.6 cm. Three different floating shields have been tested for the minimum pressure at which copper sputtering is maintained. The results are shown in FIG. 17 for 1 kW and 18 kW of target power. The abscissa is expressed in terms of total shield length, the separation between shield tip 606 and target 556 being 1.6 cm less. A preferred range for the separation is 5 to 7 cm, and that for the length is 6.6 to 8.6 cm. Extending the shield length to 10 cm reduces the minimum pressure somewhat but increases the difficulty of striking the plasma.

Referring again to FIG. 15, a selectable DC power supply 610 negatively biases the target 556 to about −400 to −600 VDC with respect to the grounded shield 566 to ignite and maintain the plasma. A target power of between 1 and 5 kW is typically used to ignite the plasma while a power of greater than 10 kW is preferred for the SIP sputtering described here. Conventionally, the pedestal 562 and hence the wafer 558 are left electrically floating, but a negative DC self-bias nonetheless develops on it. On the other hand, some designs use a controllable power supply 612 to apply a DC or RF bias to the pedestal 562 to further control the negative DC bias that develops on it. In the tested configuration, the bias power supply 612 is an RF power supply operating at 13.56 MHz. It may be supplied with up to 600 W of RF power, a preferred range being 350 to 550 W for a 200 mm wafer.

A gas source 614 supplies a sputtering working gas, typically the chemically inactive noble gas argon, to the chamber 552 through a mass flow controller 616. The working gas can be admitted to the top of the chamber or, as illustrated, at its bottom, either with one or more inlet pipes penetrating apertures through the bottom of the shield grounded shield 566 or through a gap 618 between the grounded shield 566, the wafer clamp 560, and the pedestal 562. A vacuum pump system 620 connected to the chamber 552 through a wide pumping port 622 maintains the chamber at a low pressure. Although the base pressure can be held to about $10^{-7}$ Torr or even lower, the pressure of the working gas is typically maintained at between about 1 and 1000 milliTorr in conventional sputtering and to below about 5 milliTorr in SIP sputtering. A computer-based controller 624 controls the reactor including the DC target power supply 610, the bias power supply 612, and the mass flow controller 616.

To provide efficient sputtering, a magnetron 630 is positioned in back of the target 556. It has opposed magnets 632, 634 connected and supported by a magnetic yoke 636. The magnets create a magnetic field adjacent the magnetron 630 within the chamber 552. The magnetic field traps electrons and, for charge neutrality, the ion density also increases to form a high-density plasma region 638. The magnetron 630 is usually rotated about the center 640 of the target 556 by a motor-driven shaft 642 to achieve full coverage in sputtering of the target 556. To achieve a high-density plasma 638 of sufficient ionization density to allow sustained self-sputtering of copper, the power density delivered to the area adjacent the magnetron 630 must be made high. This can be achieved, as described by Fu in the above cited patents, by increasing the power level delivered from the DC power supply 610 and by reducing the area of magnetron 630, for example, in the shape of a triangle or a racetrack. A 601 triangular magnetron, which is rotated with its tip approximately coincident with the target center 640, covers only about ⅙ of the target at any time. Coverage of ¼ is the preferred maximum in a commercial reactor capable of SIP sputtering.

To decrease the electron loss, the inner magnetic pole represented by the inner magnet 632 and unillustrated magnetic pole face should have no significant apertures and be surrounded by a continuous outer magnetic pole represented by the outer magnets 634 and unillustrated pole face. Furthermore, to guide the ionized sputter particles to the wafer 558, the outer pole should produce a much higher magnetic flux than the inner pole. The extending magnetic field lines trap electrons and thus extend the plasma closer to the wafer 558. The ratio of magnetic fluxes should be at least 150% and preferably greater than 200%. Two embodiments of Fu's triangular magnetron have 25 outer magnets and 6 or 10 inner magnets of the same strength but opposite polarity.

When the argon is admitted into the chamber, the DC voltage difference between the target 556 and the grounded shield 566 ignites the argon into a plasma, and the positively charged argon ions are attracted to the negatively charged target 556. The ions strike the target 556 at a substantial energy and cause target atoms or atomic clusters to be sputtered from the target 556. Some of the target particles strike the wafer 558 and are thereby deposited on it, thereby forming a film of the target material. In reactive sputtering of a metallic nitride, nitrogen is additionally admitted into the chamber, and it reacts with the sputtered metallic atoms to form a metallic nitride on the wafer 558.

The illustrated chamber is capable of self-ionized sputtering of copper including sustained self-sputtering. In this case, after the plasma has been ignited, the supply of argon may be cut off in the case of SSS, and the copper ions have sufficiently high density to resputter the copper target with a yield of greater than unity. Alternatively, some argon may continue to be supplied, but at a reduced flow rate and chamber pressure and perhaps with insufficient target power density to support pure sustained self-sputtering but nonetheless with a significant but reduced fraction of self-sputtering. If the argon pressure is increased to significantly above 5 milliTorr, the argon will remove energy from the copper ions, thus decreasing the self-sputtering. The wafer bias attracts the ionized fraction of the copper particle deep into the hole.

However, to achieve deeper hole coating with a partially neutral flux, it is desirable to increase the distance between the target 556 and the wafer 558, that is, to operate in the long-throw mode. In long-throw, the target-to-substrate spacing is typically greater than half the substrate diameter. When used, it is preferably greater than 90% wafer diameter, but spacings greater than 80% including 100% and 140% of the substrate diameter are believed appropriate also. The throws mentioned in the examples of the embodiment are referenced to 200 mm waters. Long throw in conventional sputtering reduces the sputtering deposition rate, but ionized sputter particles do not suffer such a large decrease.

The controlled division between conventional (argon-based) sputtering and sustained self-sputtering (SSS) allows the control of the distribution between neutral and ionized sputter particles. Such control is particularly advantageous for the sputter deposition of a copper seed layer in a high aspect-ratio via hole. The control of the ionization fraction of sputtered atoms is referred to as self-ionized plasma (SIP) sputtering.

Figure 18:
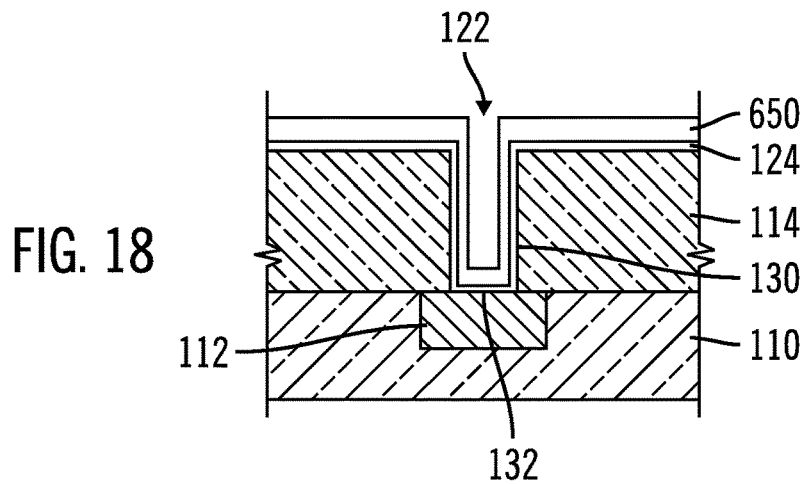
FIG. 18 is a cross-sectional view of via metallization according to another embodiment of the invention.

One embodiment of a structure produced by the invention is a via illustrated in cross-section in FIG. 18. A seed copper layer 650 is deposited in the via hole 22 over the barrier layer 24 using, for example, the long-throw sputter reactor of FIG. 15 and under conditions promoting SIP. The SIP copper layer 650 may be deposited, for example, to a blanket thickness of 50 to 300 nm or more preferably of 80 to 200 nm. The SIP copper seed layer 650 preferably has a thickness in the range of 2 to 20 nm on the via sidewalls, more preferably 7 to 15 nm. In view of the narrow holes, the sidewall thickness should not exceed 50 nm. The quality of the film is improved by decreasing the pedestal temperature to less than 0 degrees C. and preferably to less than −40 degrees C. so that the coolness afforded by the quick SIP deposition becomes important.

The SIP copper seed layer 650 has good bottom coverage and enhanced sidewall coverage. It has been experimentally observed to be much smoother than either IMP or CVD copper deposited directly over the barrier layer 24. After the copper seed layer 650 is deposited, the hole is filled with a copper layer 118, as in FIG. 1, preferably by electrochemical plating using the seed layer 650 as one of the electroplating electrodes. However, the smooth structure of the SIP copper seed layer 650 also promotes reflow or higher-temperature deposition of copper by standard sputtering or physical vapor deposition (PVD).

Several experiments were performed in SIP depositing such a seed layer into a 0.20 μm-wide via hole in 1.2 μm of oxide. With a target-to-substrate spacing of 290 mm, a chamber pressure of less than 0.1 milliTorr (indicating SSS mode) and 14 kW of DC power applied to the target with a 601 triangular magnetron, a deposition producing 0.2 μm of blanket thickness of the copper on top of the oxide produces 18 nm on the via bottom and about 12 nm on the via sidewalls. Deposition times of 30 s and less are typical. When the target power is increased to 18 kW, the bottom coverage increases to 37 nm without a significant change in sidewall thickness. The higher bottom coverage at higher power indicates a higher ionization fraction. For both cases, the deposited copper film is observed to be much smoother than seen for IMP or CVD copper.

The SIP deposition is relatively fast, between 0.5 to 1.0 μm/min in comparison to an IMP deposition rate of no more than 0.2 μm/min. The fast deposition rate results in a short deposition period and, in combination with the absence of argon ion heating, significantly reduces the thermal budget. It is believed that the low-temperature SIP deposition results in a very smooth copper seed layer.

Figure 19:
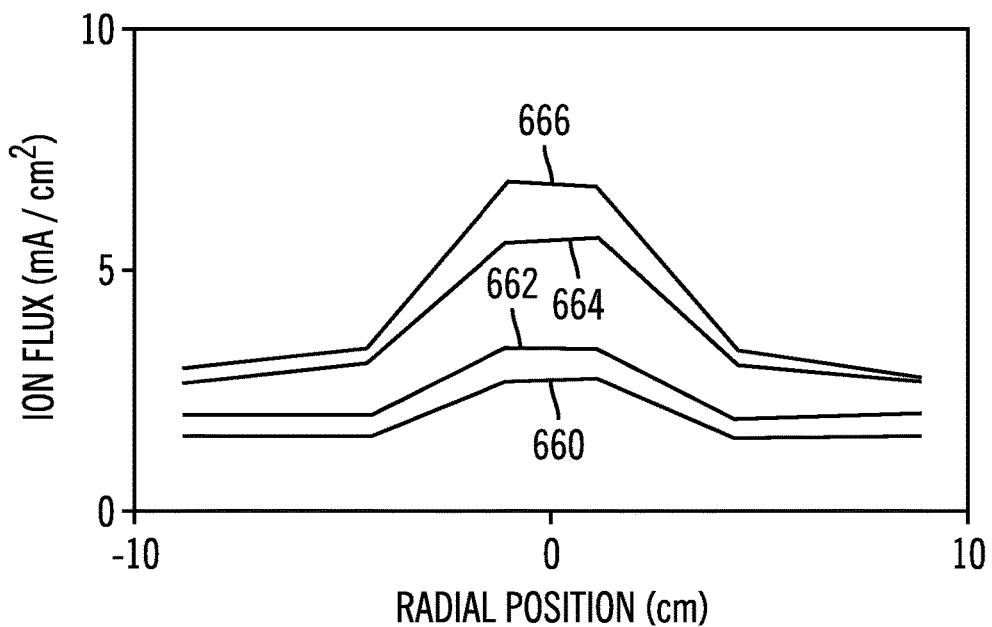
FIGS. 19 and 20 are graphs plotting ion current flux across the wafer for two different magnetrons and different operating conditions.

A 290 mm throw was used with the standard triangular magnetron of Fu utilizing ten inner magnets and twenty-five outer ones. The ion current flux was measured as a function of radius from the target center under various conditions. The results are plotted in the graph of FIG. 19. Curve 660 is measured for 16 kW of target power and 0 milliTorr of chamber pressure. Curves 662, 664, 664 are measured for 18 kW of target power and chamber pressures of 0, 0.2, and 1 milliTorr respectively. These currents correspond to an ion density of between $10^{11}$ and $10^{12}$ cm$^{-3}$, as compared to less than $10^9$ cm$^{-3}$ with a conventional magnetron and sputter reactor. The zero-pressure conditions were also used to measure the copper ionization fraction. The spatial dependences are approximately the same with the ionization fraction varying between about 10% and 20% with a direct dependence on the DC target power. The relatively low ionization fraction demonstrate that SIP without long throw would has a large fraction of neutral copper flux which would have the unfavorable deep filling characteristics of conventional PVD. Results indicate that operation at higher power is preferred for better step coverage due to the increased ionization.

Figure 20:
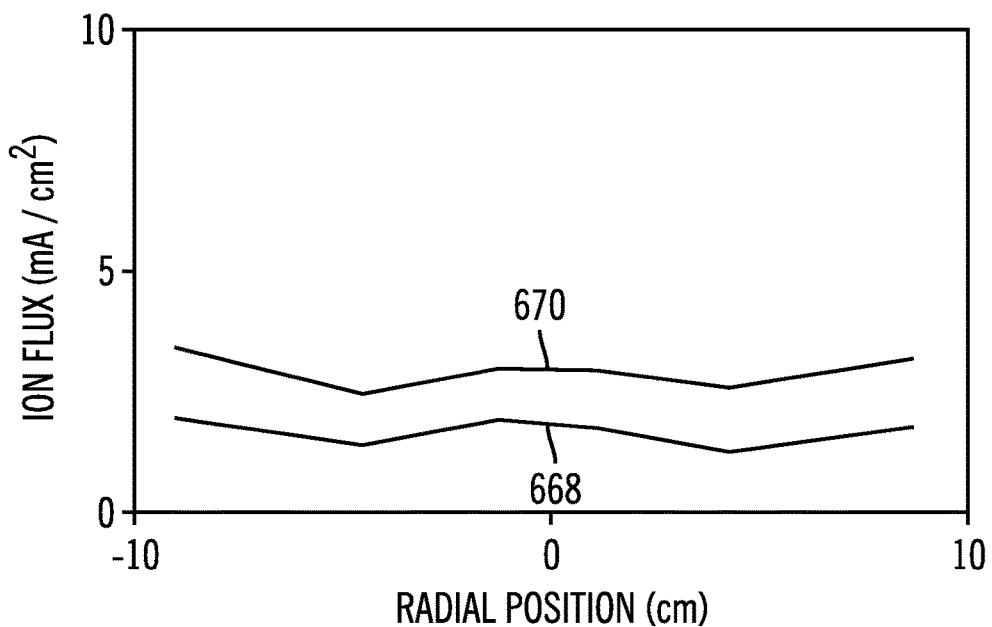

The tests were then repeated with the number of inner magnets in the Fu magnetron being reduced to six. That is, the second magnetron had improved uniformity in the magnetic flux, which promotes a uniform sputtered ion flux toward the wafer. The results are plotted in FIG. 20. Curve 668 displays the ion current flux for 12 kW of target power and 0 milliTorr pressure; curve 670, for 18 kW. Curves for 14 kW and 16 kW are intermediate. Thus, the modified magnetron produces a more uniform ion current across the wafer, which is again dependent on the target power with higher power being preferred.

The relatively low ionization fractions of 10% to 20% indicate a substantial flux of neutral copper compared to the 90% to 100% fraction of IMP. While wafer bias can guide the copper ions deep into the holes, long throw accomplishes much the same for the copper neutrals.

A series of tests were used to determine the combined effects of throw and chamber pressure upon the distribution of sputter particles. At zero chamber pressure, a throw of 140 mm produces a distribution of about 45 degrees; a throw of 190 mm, about 35 degrees; and, a throw of 290 mm, about 25 degrees. The pressure was varied for a throw of 190 mm. The central distribution remains about the same for 0, 0.5 and 1 milliTorr. However, the low-level tails are pushed out almost 101 for the highest pressure, indicative of the scattering of some particles. These results indicate that acceptable results are obtained below 5 milliTorr, but a preferred range is less than 2 milliTorr, a more preferred range is less than 1 milliTorr, and a most preferred range is 0.2 milliTorr and less. Also, as expected, the distribution is best for the long throws.

A SIP film deposited into a high-aspect ratio hole has favorable upper sidewall coverage and tends not to develop overhangs. On the other hand, an IMP film deposited into such a hole has better bottom and bottom corner coverage, but the sidewall film tends to have poor coverage and be rough. The advantages of both types of sputtering can be combined by using a two-step copper seed sputter deposition. In a first step, copper is deposited in an IMP reactor producing a high-density plasma, for example, by the use of RF inductive source power. Exemplary deposition conditions are 20 to 60 milliTorr of pressure, 1 to 3 kW of RF coil power, 1 to 2 kW of DC target power, and 150 W of bias power. The first step provides good though rough bottom and bottom sidewall coverage. In a second and preferably subsequent step, copper is deposited in an SIP reactor of the sort described above producing a lesser degree of copper ionization. Exemplary deposition conditions are 1 Torr pressure, 18 to 24 kW or DC target power and 500 W of bias power. The second step provides good smooth upper sidewall coverage and further smoothes out the already deposited IMP layer. The blanket deposition thicknesses for the two steps preferably range from 50 to 100 nm for the IMP deposition and 100 to 200 nm for the SIP layer. Blanket thicknesses may be a ratio of 30:70 to 70:30. Alternatively, the SIP layer can be deposited before the IMP layer. After the copper seed layer is sputter deposited by the two-step process, the remainder of the hole is filled, for example, by electroplating.

Figure 21:
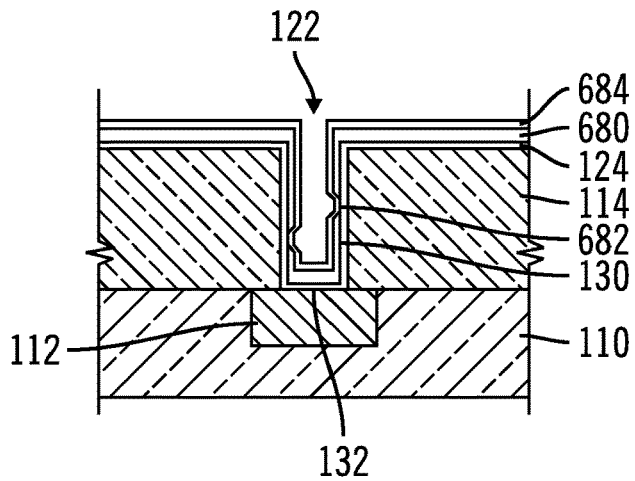
FIG. 21 is a cross-sectional view of a via metallization according to another embodiment of the invention.

The SIP sidewall coverage may become a problem for very narrow, high-aspect ratio vies. Technology for 0.13 μm vias and smaller is being developed. Below about 100 nm of blanket thickness, the sidewall coverage may become discontinuous. As shown in the cross-sectional view of FIG. 21, the unfavorable geometry may cause a SIP copper film 680 to be formed as a discontinuous films including voids or other imperfections 682 on the via sidewall 30. The imperfection 682 may be an absence of copper or such a thin layer of copper that it cannot act locally as an electroplating cathode. Nonetheless, the SIP copper film 680 is smooth apart from the imperfections 682 and well nucleated. In these challenging geometries, it is then advantageous to deposit a copper CVD seed layer 684 over the SIP copper nucleation film 680. Since it is deposited by chemical vapor deposition, it is generally conformal and is well nucleated by the SIP copper film 680. The CVD seed layer 684 patches the imperfections 682 and presents a continuous, non-rough seed layer for the later copper electroplating to complete the filling of the hole 22. The CVD layer may be deposited in a CVD chamber designed for copper deposition, such as the CuxZ chamber available from Applied Materials using the previously described thermal process.

Experiments were performed in which 20 nm of CVD copper was deposited on alternatively a SIP copper nucleation layer and an IMP nucleation layer. The combination with SIP produced a relatively smooth CVD seed layer while the combination with IMP produced a much rougher surface in the CVD layer to the point of discontinuity.

The CVD layer 684 may be deposited to a thickness, for example, in the range of 5 to 20 nm. The remainder of the hole may then be filled with copper by other methods. The very smooth seed layer produced by CVD copper on top of the nucleation layer of SIP copper provides for efficient hole filling of copper by electroplating or conventional PVD techniques in the narrow vias being developed. In particular for electroplating, the smooth copper nucleation and seed layer provides a continuous and nearly uniform electrode for powering the electroplating process.

Figure 22:
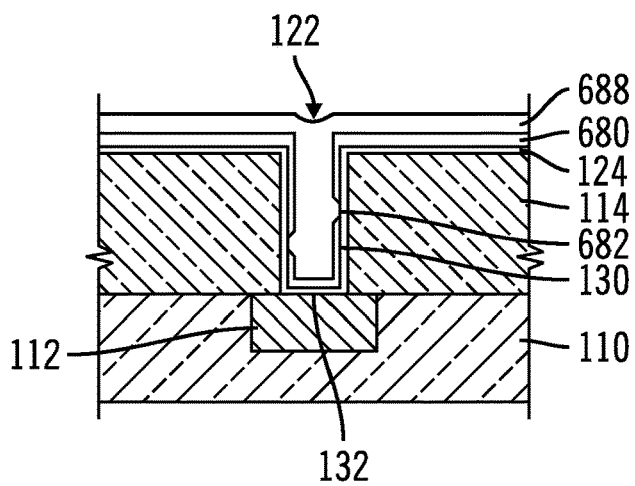
FIG. 22 is a cross-sectional view of a via metallization according to another embodiment of the invention.

In the filling of a via or other hole having a very high-aspect ratio, it may be advantageous to dispense with the electroplating and instead, as illustrated in the cross-sectional view of FIG. 22, deposit a sufficiently thick CVD copper layer 688 over the SIP copper nucleation layer 680 to completely fill the via. An advantage of CVD filling is that it eliminates the need for a separate electroplating step. Also, electroplating requires fluid flows which may be difficult to control at hole widths below 0.13 μm.

An advantage of the copper bilayer of this embodiment of the invention is that it allows the copper deposition to be performed with a relatively low thermal budget. Tantalum tends to dewet from oxide at higher thermal budgets. IMP has many of the same coverage advantages for deep hole filling, but IMP tends to operate at a much higher temperature because it produces a high flux of energetic argon ions which dissipate their energy in the layer being deposited. Further, IMP invariably implants some argon into the deposited film. On the contrary, the relatively thin SIP layer is deposited at a relatively high rate and the SIP process is not inherently hot because of the absence of argon. Also, the SIP deposition rates are much faster than with IMP so that any hot deposition is that much shorter, by up to a factor of a half.

Figure 23:
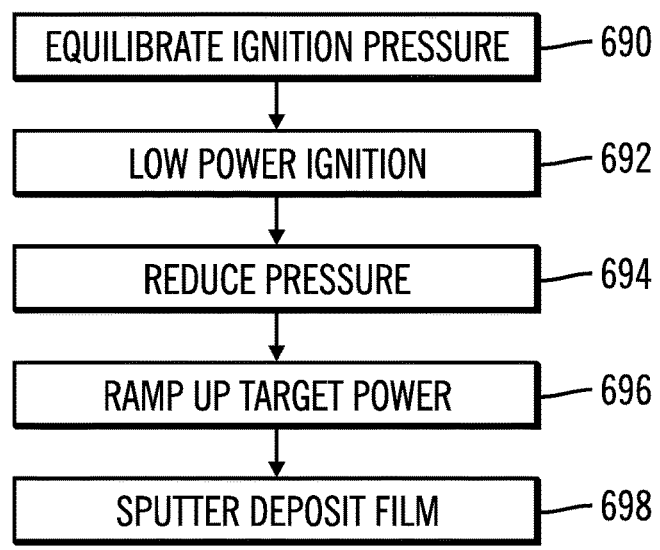
FIG. 23 is a flow diagram of a plasma ignition sequence which reduces heating of the wafer.

The thermal budget is also reduced by a cool ignition of the SIP plasma. A cool plasma ignition and processing sequence is illustrated in the flow diagram of FIG. 23. After the wafer has been inserted through the load lock valve into the sputter reactor, the load lock valve is closed, and in step 690 gas pressures are equilibrated. The argon chamber pressure is raised to that used for ignition, typically between 2 and about 5 to 10 milliTorr, and the argon backside cooling gas is supplied to the back of the wafer at a backside pressure of about 5 to 10 Torr. In step 692, the argon is ignited with a law level of target power, typically in the range of 1 to 5 kW. After the plasma has been detected to ignite, in step 694, the chamber pressure is quickly ramped down, for example over 3 s, with the target power held at the low level. If sustained self-sputtering is planned, the chamber argon supply is turned off, but the plasma continues in the SSS mode. For self-ionized plasma sputtering, the argon supply is reduced. The backside cooling gas continues to be supplied. Once the argon pressure has been reduced, in step 696, the target power is quickly ramped up to the intended sputtering level, for example, 10 to 24 kW or greater for a 200 mm wafer, chosen for the SIP or SSS sputtering. It is possible to combine the steps 694, 696 by concurrently reducing pressure and ramping up the power. In step 698, the target continues to be powered at the chosen level for a length of time necessary to sputter deposit the chosen thickness of material. This ignition sequence is cooler than using the intended sputtering power level for ignition. The higher argon pressure facilitates ignition but would deleteriously affect the sputtered neutrals if continued at the higher power levels desired for sputter deposition. At the lower ignition power, very little copper is deposited due to the low deposition rate at the reduced power. Also, the pedestal cooling keep the wafer chilled through the ignition process.

Many of the features of the apparatus and process of the invention can be applied to sputtering not involving long throw.

Although the invention is particularly useful at the present time for copper inter-level metallization and barrier and liner deposition, the different aspects of the invention may be applied to sputtering other materials and for other purposes.

As described in copending application Ser. No. 10/202,778, filed Jul. 25, 2002, which is incorporated herein by reference in its entirety, the interconnect layer or layers may also be deposited in a sputter chamber similar to the chamber 152 (FIG. 4) which generates both SIP and ICP plasmas. If deposited in a chamber such as the chamber 152, the target 156 would be formed of the deposition material, such as copper, for example. In addition, the ICP coil 151 may be formed of the same deposition material as well, particularly if coil sputtering is desired for some or all of the interconnect metal deposition.

As previously mentioned, the illustrated chamber 152 is capable of self-ionized sputtering of copper including sustained self-sputtering. In this case, after the plasma has been ignited, the supply of argon may be cut off in the case of SSS, and the copper ions have sufficiently high density to resputter the copper target with a yield of greater than unity. Alternatively, some argon may continue to be supplied, but at a reduced flow rate and chamber pressure and perhaps with insufficient target power density to support pure sustained self-sputtering but nonetheless with a significant but reduced fraction of self-sputtering. If the argon pressure is increased to significantly above 5 milliTorr, the argon will remove energy from the copper ions, thus decreasing the self-sputtering. The wafer bias attracts the ionized fraction of the copper particle deep into the hole.

However, to achieve deeper hole coating with a partially neutral flux, it is desirable to increase the distance between the target 156 and the wafer 158, that is, to operate in the long-throw mode as discussed above. The controlled division among self-ionized plasma (SIP) sputtering, inductively coupled plasma (ICP) sputtering and sustained self-sputtering (SSS) allows the control of the distribution between neutral and ionized sputter particles. Such control is particularly advantageous for the sputter deposition of a copper seed layer in a high aspect-ratio via hole. The control of the ionization fraction of sputtered is achieved by mixing self-ionized plasma (SIP) sputtering and inductively coupled plasma (ICP) sputtering.

Figure 24:
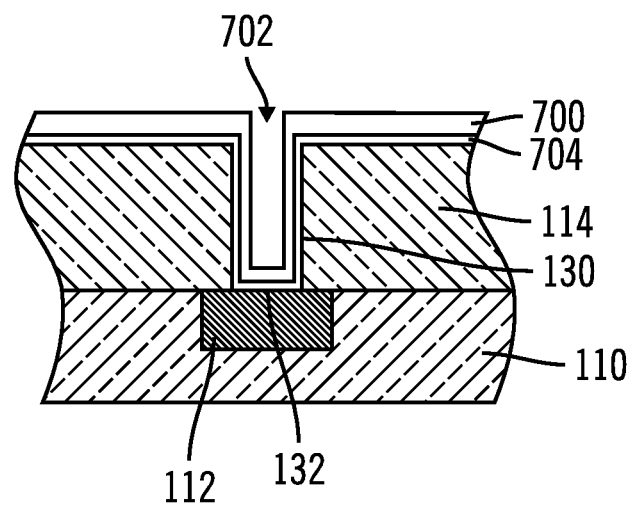
FIG. 24 is a cross-sectional view of via metallization formed in accordance with a process according to another embodiment of the invention.

One embodiment of a structure in accordance with the present invention is a via illustrated in cross-section in FIG. 24. A copper seed layer 700 is deposited in a via hole 702 over the liner layer 704 (which may include one or more barrier and liner layers such as the aforementioned TaN barrier and Ta liner layers) using, for example, a long-throw sputter reactor of the type shown in FIG. 4 and under conditions promoting combined SIP and ICP and/or alternating SIP and ICP. Here, the reactor would have a target which includes the copper or other seed layer deposition material. The SIP-ICP copper layer 700 may be deposited, for example, to a blanket thickness of 50 to 300 nm or more preferably of 80 to 200 nm. The SIP-ICP copper seed layer 700 preferably has a thickness in the range of 2 to 20 nm on the via sidewalls, more preferably 7 to 15 nm. In view of the narrow holes, the sidewall thickness should not exceed 50 nm. The quality of the film is improved by decreasing the pedestal temperature to less than 0 degrees C. and preferably to less than −40 degrees C. so that the coolness afforded by the quick SIP deposition becomes important.

It is believed that the SIP-ICP copper seed layer 700 will have good bottom coverage and enhanced sidewall coverage. As explained in greater detail below, the copper seed layer 700 may be resputtered either in a separate step or during the initial deposition to redistribute the copper deposition material to increase coverage at the inside bottom corners of the via while usually leaving a thinner coverage in the central portion of the via bottom. After the copper seed layer 700 is deposited (and redistributed, if desired), the hole may be filled with a copper layer similar to the copper layer 347b' of FIG. 14b, preferably by electro-chemical plating using the seed layer 700 as one of the electroplating electrodes. However, the smooth structure of the SIP-ICP copper seed layer 700 also promotes reflow or higher-temperature deposition of copper by standard sputtering or physical vapor deposition (PVD).

Figure 25:
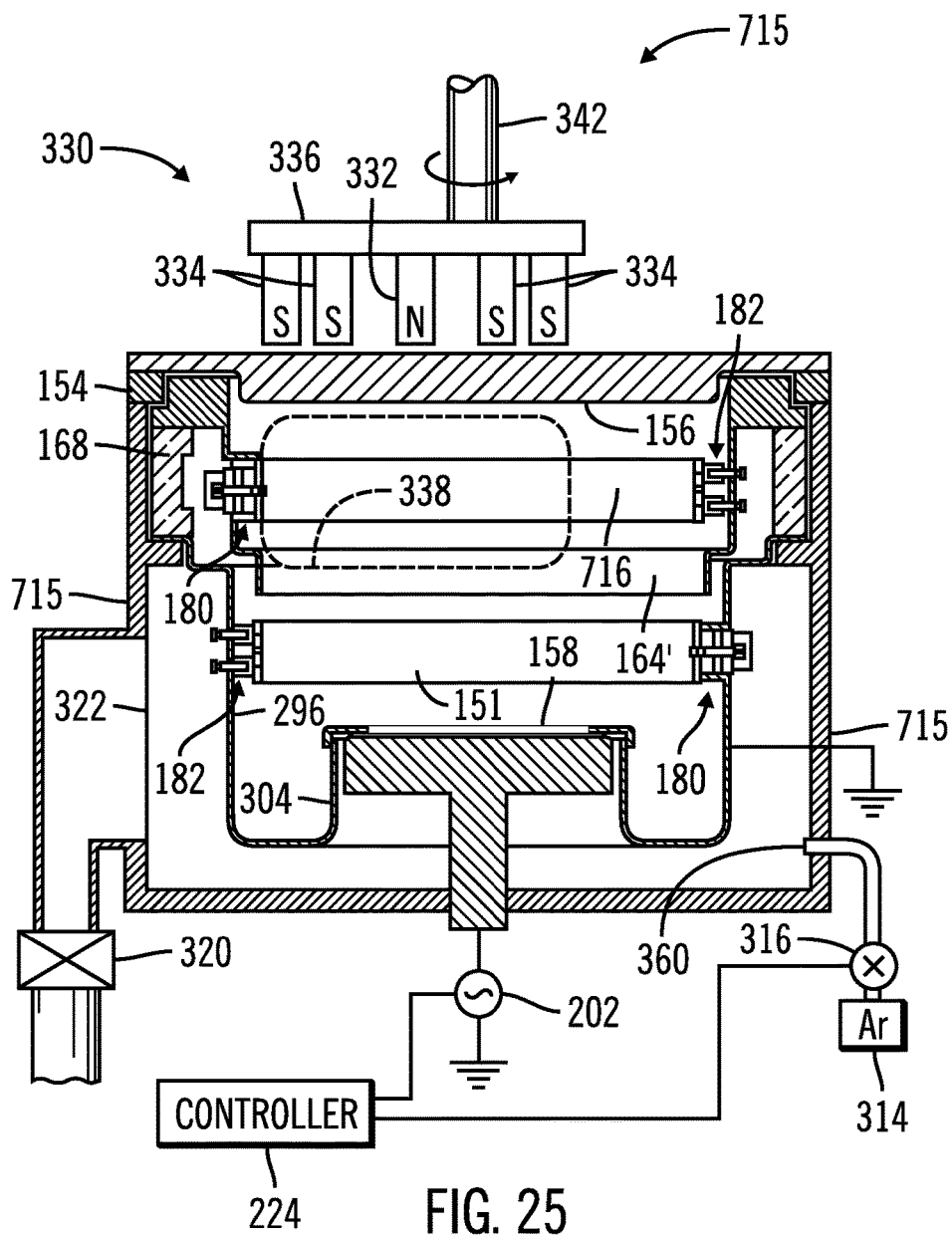
FIG. 25 is a schematic representation of a sputtering chamber in accordance with another embodiment of the invention.
Figure 26:
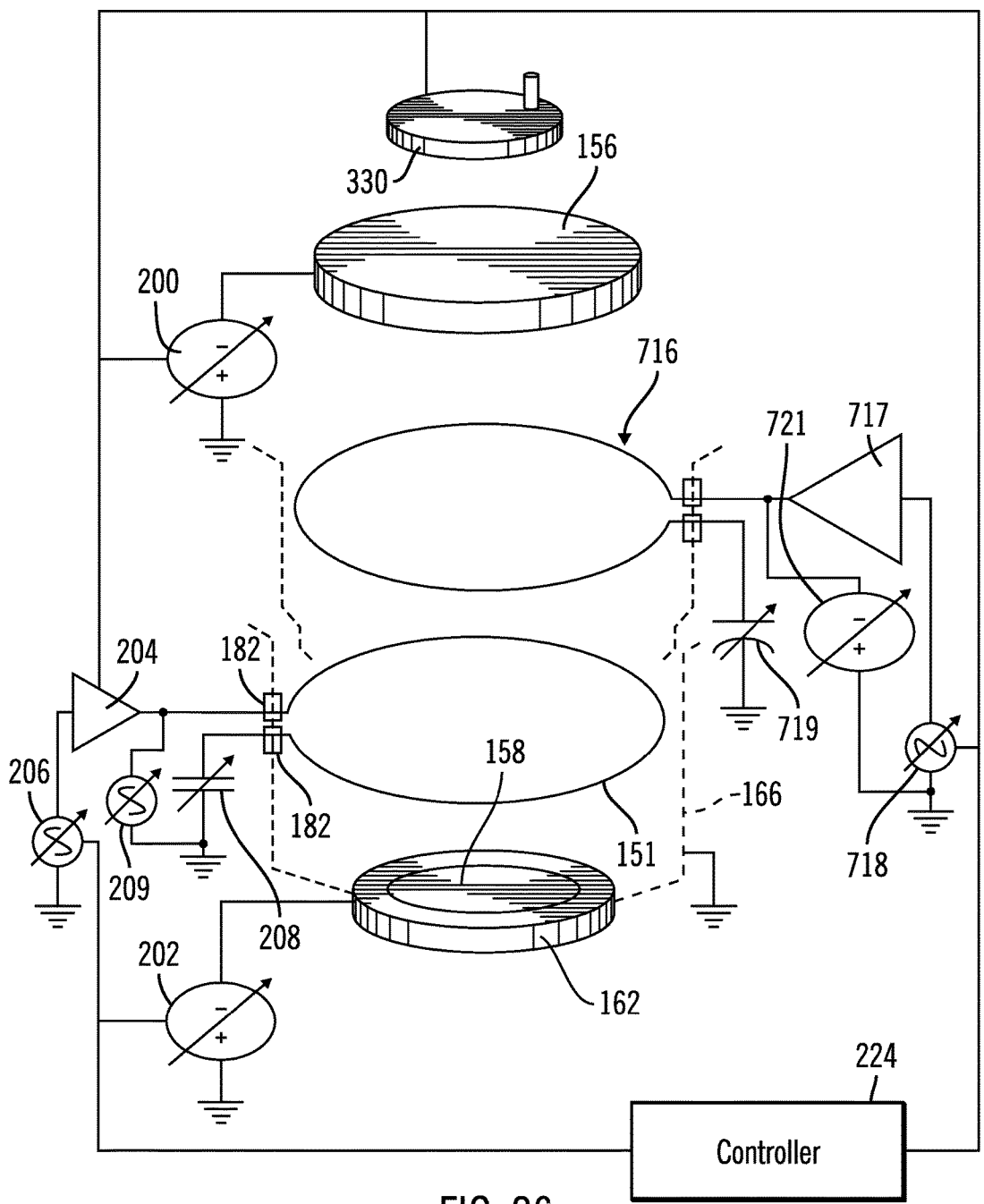
FIG. 26 is a schematic representation of electrical interconnections of various components of the sputtering chamber of FIG. 25.

In one embodiment, an SIP-ICP layer may be formed in a process which combines selected aspects of both SIP and ICP deposition techniques in one step, referred to herein generally as an SIP-ICP step. In addition, a reactor 715 in accordance with an alternative embodiment has a second coil 716 in addition to the coil 151 as shown in FIG. 25. In the same manner as the coil 151, one end of the coil 716 is insulatively coupled through a darkspace shield 164' by a feedthrough standoff 182 to the output of an amplifier and matching network 717 (FIG. 26). The input of the matching network 717 is coupled to an RF generator 718. The other end of the coil 716 is insulatively coupled through the shield 164' by a feedthrough standoff 182 to ground, via a blocking capacitor 719, to provide a DC bias on the coil 716. The DC bias may be controlled by a separate DC source 721.

In an ICP or combined SIP-ICP step, RF energy is applied to one or both of the RF coils 151 and 716 at 1-3 kW and a frequency of 2 Mhz, for example. The coils 151 and 716 when powered, inductively couple RF energy into the interior of the reactor. The RF energy provided by the coils ionizes a precursor gas such as argon to maintain a plasma to ionize sputtered deposition material. However, rather than maintain the plasma at a relatively high pressure, such as 20-60 mTorr typical for high density IMP processes, the pressure is preferably maintained at a substantially lower pressure, such as 2 mTorr, for example. As a consequence, it is believed that the ionization rate within the reactor 150 will be substantially lower than that of the typical high density IMP process.

Furthermore as discussed above, the illustrated reactor 150 is also capable of self-ionized sputtering in a long-throw mode. As a consequence, deposition material may be ionized not only as a result of the low pressure plasma maintained by the RF coil or coils, but also by the plasma self-generated by the DC magnetron sputtering of the target. It is believed that the combined SIP and ICP ionization processes can provide sufficient ionized material for good bottom and bottom corner coverage. However, it is also believed that the lower ionization rate of the low pressure plasma provided by the RF coils 151 and 716 allows sufficient neutral sputtered material to remain un-ionized so as to be deposited on the upper sidewalls by the long-throw capability of the reactor. Thus, it is believed that the combined SIP and ICP sources of ionized deposition material can provide both good upper sidewall coverage as well as good bottom and bottom corner coverage. In another embodiment, the power to the coils 151 and 716 may be alternated such that in one step, the power to the upper coil 726 is eliminated or reduced relative to the power applied to the lower coil 151. In this step, the center of the inductively coupled plasma is shifted away from the target and closer to the substrate. Such an arrangement may reduce interaction between the self ionized plasma generated adjacent the target, and the inductively coupled plasma maintained by one or more of the coils. As a consequence, a higher proportion of neutral sputtered material might be maintained.

In a second step, the power may be reversed such that the power to the lower coil 151 is eliminated or reduced relative to the power applied to the upper coil 716. In this step, the center of the inductively coupled plasma may be shifted toward the target and away from the substrate. Such an arrangement may increase the proportion of ionized sputtered material.

In another embodiment, the layer may be formed in two or more steps in which in one step, referred to herein generally as an SIP step, little or no RF power is applied to either coil. In addition, the pressure would be maintained at a relatively low level, preferably below 5 mTorr, and more preferably below 2 mTorr such as at 1 mTorr, for example. Furthermore, the power applied to the target would be relatively high such as in the range of 18.24 kW DC, for example. A bias may also be applied to the substrate support at a power level of 500 watts for example. Under these conditions, it is believed that ionization of the deposition material would occur primarily as a result of (SIP) self-ionization plasma. Combined with the long-throw mode arrangement of the reactor. It is believed that good upper sidewall coverage may be achieved with low overhang. The portion of the layer deposited in this initial step may be in the range of 1000-2000 angstroms, for example.

In a second step, referred to generally herein as an ICP step, and preferably in the same chamber, RF power may be applied to one or both of the coils 151 and 716. In addition, in one embodiment, the pressure may be raised substantially such that a high density plasma may be maintained. For example, the pressure may be raised to 20-60 mTorr, the RF power to the coil raised to a range of 1-3 kW, the DC power to the target reduced to 1-2 kW and the bias to the substrate support reduced to 150 watts. Under these conditions, it is believed the ionization of the deposition material would occur primarily as a result of high-density ICP. As a result, good bottom and bottom corner coverage may be achieved in the second step. Power may be applied to both coils simultaneously or alternating, as described above.

After the copper seed layer is sputter deposited by a process combining SIP and ICP, the remainder of the hole may be filled by the same or another process. For example, the remainder of the hole may be filled by electroplating or CVD.

It should be appreciated that the order of the SIP and ICP steps may be reversed and that some RF power may be applied to one or more coils in the SIP step and that some self-ionization may be induced in the ICP step. In addition, sustained self sputtering (SSS) may be induced in one or more steps. Hence, process parameters including pressure, power and target-wafer distance may be varied, depending upon the particular application, to achieve the desired results.

As previously mentioned in the coils 151 and 516 may be operated independently or together. In one embodiment, the coils may be operated together in which the RF signal applied to one coil is phase shifted with respect to the other RF signal applied to the other coil so as to generate a helicon wave. For example, the RF signals may be phase shifted by a fraction of a wavelength as described in U.S. Pat. No. 6,264,812.

Figure 27:
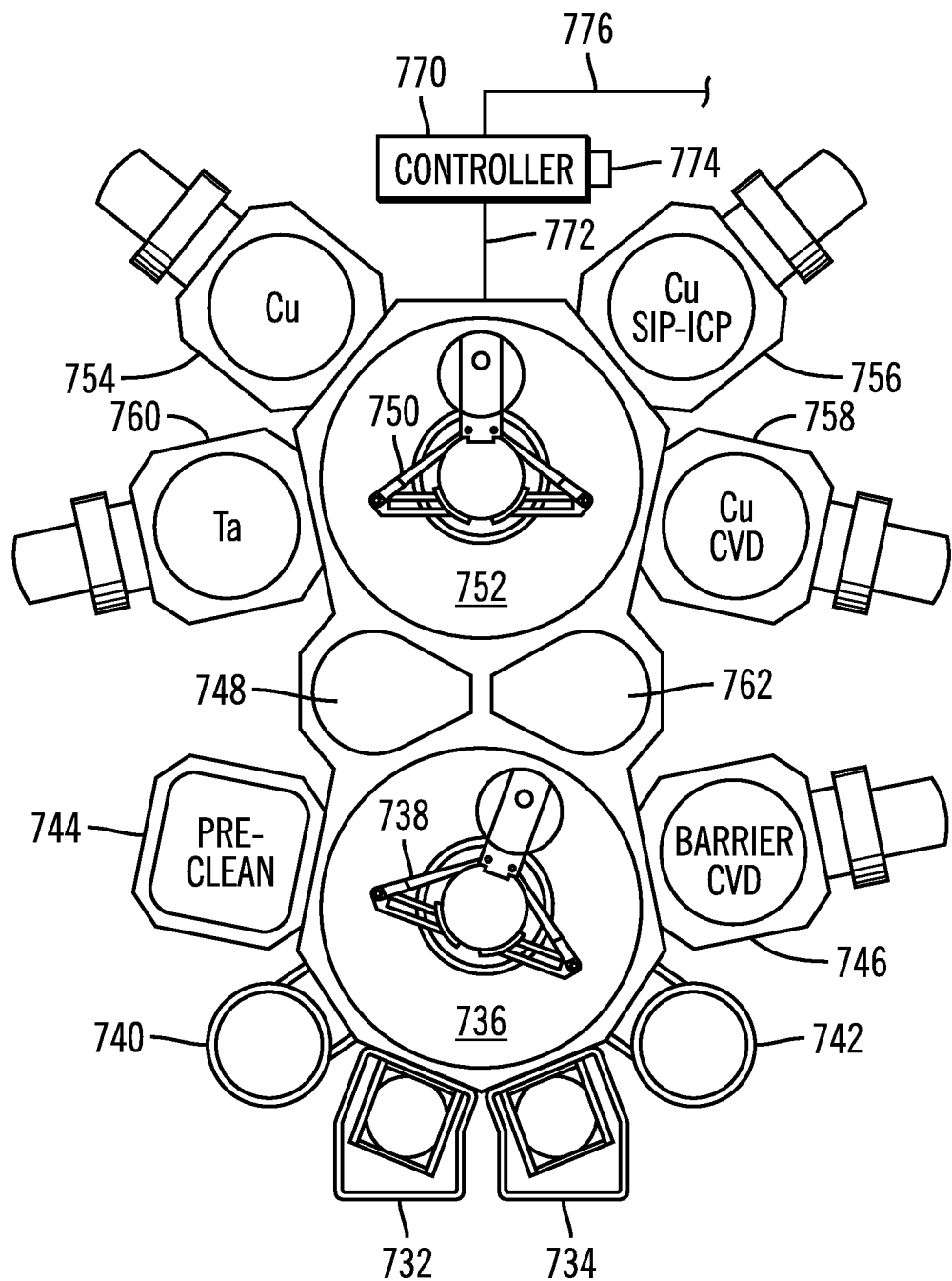
FIG. 27 is a schematic view of a integrated processing tool on which the invention may be practiced.

One embodiment of present invention includes an integrated process preferably practiced on an integrated multi-chamber tool, such as the Endura 5500 platform schematically illustrated in plan view in FIG. 27. The platform is functionally described by Tepman et al. in U.S. Pat. No. 5,186,718.

Wafers which have been already etched with via holes or other structure in a dielectric layer are loaded into and out of the system through two independently operated load lock chambers 732, 734 configured to transfer wafers into and out of the system from wafer cassettes loaded into the respective load lock chambers. After a wafer cassette has been loaded into a load lock chamber 732, 734, the chamber is pumped to a moderately low pressure, for example, in the range of $10^{-3}$ to $10^{-4}$ Torr, and a slit valve between that load lock chamber and a first wafer transfer chamber 736 is opened. The pressure of the first wafer transfer chamber 736 is thereafter maintained at that low pressure.

A first robot 738 located in the first transfer chamber 736 transfer the wafer from the cassette to one of two degassing/orienting chambers 740, 742, and then to a first plasma pre-clean chamber 744, in which a hydrogen or argon plasma cleans the surface of the wafer. If a CVD barrier layer is being deposited, the first robot 738 then passes the wafer to a CVD barrier chamber 746. After the CVD barrier layer is deposited, the robot 738 passes the wafer into a pass through chamber 748, from whence a second robot 750 transfers it to a second transfer chamber 752. Slit valves separate the chambers 744, 746, 748 from the first transfer chamber 736 so as to isolate processing and pressure levels.

The second robot 750 selectively transfers wafers to and from reaction chambers arranged around the periphery. A first IMP sputter chamber 754 may be dedicated to the deposition of copper. An SIP sputter chamber 756 similar to the chamber 410 described above is dedicated to the deposition of an SIP copper seed or nucleation layer. This chamber combines SIP for bottom and sidewall coverage and resputtering for improved bottom corner coverage in either a one step or a multi-step process as discussed above. Also, at least part of the barrier layer, of, for example, Ta/TaN is being deposited by SIP sputtering and coil sputtering and ICP resputtering, and therefore an SIP-ICP sputter chamber 760 is dedicated to a sputtering a refractory metal, possibly in a reactive nitrogen plasma. The same SIP-ICP chamber 760 may be used for depositing the refractory metal and its nitride. A CVD chamber 758 is dedicated to the deposition of a copper nucleation, seed or liner layer or to complete the filling of the hole or both. Each of the chambers 754, 756, 758, 760 is selectively opened to the second transfer chambers 752 by slit valves. It is possible to use a different configuration. For example, an IMP chamber 754 may be replaced by a second CVD copper chamber, particularly if CVD is used to complete the hole filling.

After the low-pressure processing, the second robot 750 transfers the wafer to an intermediately placed thermal chamber 762, which may be a cool down chamber if the preceding processing was hot or may be a rapid thermal processing (RTP) chamber is annealing of the metallization is required. After thermal treatment, the first robot 738 withdraws the wafer and transfers it back to a cassette in one of the load lock chambers 732, 734. Of course, other configurations are possible with which the invention can be practiced depending on the steps of the integrated process.

The entire system is controlled by a computer-based controller 770 operating over a control bus 772 to be in communication with sub-controllers associated with each of the chambers. Process recipes are read into the controller 770 by recordable media 774, such as magnetic floppy disks or CD-ROMs, insertable into the controller 770, or over a communication link 776.

Many of the features of the apparatus and process of the invention can be applied to sputtering not involving long throw. Although the invention is particularly useful at the present time for tantalum and tantalum nitride liner layer deposition and copper inter-level metallization, the different aspects of the invention may be applied to sputtering other materials and for other purposes. Provisional application No. 60/316,137 filed Aug. 30, 2001 is directed to sputtering and resputtering techniques and is incorporated herein by reference.

It will, of course, be understood that modifications of the present invention, in its various aspects, will be apparent to those skilled in the art, some being apparent only after study, others being matters of routine mechanical and process design. Other embodiments are also possible, their specific designs depending upon the particular application. As such, the scope of the invention should not be limited by the particular embodiments herein described but should be defined only by the appended claims and equivalents thereof.

What is claimed is:

1. A method of depositing metal into a hole having an aspect ratio of at least 4:1 and formed in a dielectric layer of a substrate, comprising: sputter depositing a deposition material comprising a metal in said hole in an inductively coupled plasma in a chamber; and sputter depositing a deposition material comprising a metal in said hole in a self-ionized plasma in a chamber wherein said sputter depositing in a self-ionized plasma and said sputter depositing in an inductively coupled plasma are conducted in the same chamber.

2. The method of claim 1 further comprising filling said hole with a metal.

3. The method of claim 2 wherein said filling comprises electroplating.

4. The method of claim 1 wherein said sputter depositing in a self-ionized plasma precedes said sputter depositing in an inductively coupled plasma.

5. The method of claim 4 wherein said sputter depositing in an inductively coupled plasma further includes resputtering in said inductively coupled plasma deposition material deposited in said self-ionized plasma.

6. The method of claim 5 wherein said resputtering includes removing deposition material deposited on a bottom of said hole.

7. The method of claim 1 wherein said sputter depositing in a self-ionized plasma deposits a deposition material comprising at least one of tantalum and tantalum nitride.

8. The method of claim 1 wherein said sputter depositing in a self-ionized plasma deposits a deposition material comprising copper.

9. The method of claim 1 wherein said sputter depositing in an inductively coupled plasma deposits a deposition material comprising at least one of tantalum and tantalum nitride.

10. The method of claim 1 wherein said sputter depositing in an inductively coupled plasma deposits a deposition material comprising copper.

11. The method of claim 1, wherein said sputter depositing in an inductively coupled plasma at least partially uses RF inductive coupling with a coil internal to the chamber containing said inductively coupled plasma to form said inductively coupled plasma.

12. A method of forming an interconnect in a hole having an aspect ratio of at least 4:1 and formed in a dielectric layer of a substrate, comprising: sputter depositing a barrier layer in said hole in a self-ionized plasma in a chamber; resputtering a bottom portion of said barrier layer in an inductively coupled plasma in a chamber to remove at least a portion of said barrier layer bottom portion; sputter depositing a liner layer on said barrier layer in said hole in a self-ionized plasma in a chamber; resputtering a bottom portion of said liner layer in an inductively coupled plasma in a chamber to remove at least a portion of said liner layer bottom portion; sputter depositing a seed layer in said hole in a self-ionized plasma in a chamber; and resputtering a bottom portion of said seed layer in a self-ionized plasma in a chamber to redistribute at least a portion of said seed layer bottom portion.

13. The method of claim 12 further comprising filling conductor metal into said hole after resputtering said seed layer.

14. The method of claim 13 wherein said filling comprises electroplating.

15. The method of claim 12 wherein said sputter depositing barrier and liner layers in a self-ionized plasma and said resputtering bottom portions of barrier and liner layers in an inductively coupled plasma are conducted in the same chamber.

16. The method of claim 12 wherein said sputter depositing a seed layer in a self-ionized plasma and said resputtering a bottom portion of a seed layer in a self-ionized plasma are conducted in the same chamber.

17. The method of claim 12 wherein said sputter depositing a barrier layer in a self-ionized plasma deposits a deposition material comprising tantalum nitride.

18. The method of claim 12 wherein said sputter depositing a seed layer in a self-ionized plasma deposits a deposition material comprising copper.

19. The method of claim 12, wherein said resputtering in an inductively coupled plasma at least partially uses RF inductive coupling with a coil internal to the chamber containing said inductively coupled plasma to form said inductively coupled plasma.

20. The method of claim 12 wherein said resputtering in a self-ionized plasma at least partially uses auxiliary magnets disposed at least partially around a processing space between a target and a substrate supporting pedestal in a chamber having a central axis wherein the magnets have a first magnetic polarity along said central axis.

21. The method of claim 16 wherein said sputter depositing a seed layer in a self-ionized plasma includes biasing said substrate at a first level and said resputtering a bottom portion of a seed layer in a self-ionized plasma includes biasing said substrate at a second level higher than said first level.

22. The method of claim 16 wherein said sputter depositing a seed layer in a self-ionized plasma includes applying power to a target a first level and said resputtering a bottom portion of a seed layer in a self-ionized plasma includes applying power to a target at a second level lower than said first level.

* * * * *